US012568758B2

(12) United States Patent
Kim et al.

(10) Patent No.: US 12,568,758 B2
(45) Date of Patent: Mar. 3, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Eungdo Kim, Yongin-si (KR); Yujin Kang, Yongin-si (KR); Minje Kim, Yongin-si (KR); Seongkeun Kim, Yongin-si (KR); Hyunyoung Kim, Yongin-si (KR); Hyojeong Kim, Yongin-si (KR); Youngki Lee, Yongin-si (KR); Jungsub Lee, Yongin-si (KR); Hyunwoo Lee, Yongin-si (KR); Mieun Jun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 18/364,157

(22) Filed: Aug. 2, 2023

(65) Prior Publication Data

US 2024/0292747 A1 Aug. 29, 2024

(30) Foreign Application Priority Data

Feb. 9, 2023 (KR) ........................ 10-2023-0017574

(51) Int. Cl.
*H10K 85/60* (2023.01)
*H10K 85/40* (2023.01)
(Continued)

(52) U.S. Cl.
CPC ......... *H10K 85/6572* (2023.02); *H10K 85/40* (2023.02); *H10K 85/624* (2023.02);
(Continued)

(58) Field of Classification Search
None
See application file for complete search history.

(56) References Cited

U.S. PATENT DOCUMENTS 8,299,456 B2 10/2012 Seo et al.
10,957,870 B2 3/2021 So et al.
(Continued)

FOREIGN PATENT DOCUMENTS

JP 5621020 11/2014
KR 10-2021-0059153 5/2021
(Continued)

*Primary Examiner* — Anthony Ho
(74) *Attorney, Agent, or Firm* — Womble Bond Dickinson (US) LLP

(57) ABSTRACT

Embodiments provide a light-emitting device including a first electrode, a second electrode facing the first electrode, m emitting units between the first electrode and the second electrode, and m-1 charge generation layers between adjacent ones of the m emitting units, wherein m is an integer of 3 or more, and the emitting units include a first emitting unit, a second emitting unit, and a third emitting unit. The first emitting unit includes a first-first host and a first-second host, the second emitting unit includes a second-first host and a second-second host, the third emitting unit includes a third-first host and a third-second host, and $T_1$ values of hosts of at least one of a first emitting unit, a second emitting unit, and a third emitting unit are each smaller than $T_1$ values of hosts of the other emitting units.

20 Claims, 4 Drawing Sheets

(51) Int. Cl.

| | |
|---|---|
| *H10K 50/12* | (2023.01) |
| *H10K 101/00* | (2023.01) |

(52) U.S. Cl.
CPC ......... *H10K 85/626* (2023.02); *H10K 85/636* (2023.02); *H10K 85/654* (2023.02); *H10K 85/6574* (2023.02); *H10K 85/6576* (2023.02); *H10K 50/12* (2023.02); *H10K 2101/90* (2023.02)

(56) References Cited

U.S. PATENT DOCUMENTS

| | | | |
|---|---|---|---|
| 2021/0066637 | A1 | 3/2021 | So et al. |
| 2021/0151691 | A1 | 5/2021 | Yoon et al. |
| 2022/0209200 | A1 | 6/2022 | Kim et al. |
| 2022/0348522 | A1 | 11/2022 | Tasaki et al. |

FOREIGN PATENT DOCUMENTS

| | | |
|---|---|---|
| KR | 10-2022-0061138 | 5/2022 |
| KR | 10-2022-0097067 | 7/2022 |

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2023-0017574 under 35 U.S.C. § 119, filed on Feb. 9, 2023, in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emissive devices that, as compared with devices of the related art, have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially formed on the first electrode. Holes injected from the first electrode move toward the emission layer through the hole transport region, and electrons injected from the second electrode move toward the emission layer through the electron transport region. Carriers, such as the holes and the electrons, recombine in an emission layer region to produce light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a device with improved efficiency and lifespan, and the like, as compared to devices in the art.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, m emitting units between the first electrode and the second electrode, and m-1 charge generation layers between adjacent ones of the m emitting units, wherein m may be an integer of 3 or more, and the emitting units may include a first emitting unit, a second emitting unit, and a third emitting unit, the first emitting unit may include a first-first host and a first-second host, the second emitting unit may include a second-first host and a second-second host, and the third emitting unit may include a third-first host and a third-second host, $T_1$ values of the hosts of at least one of the first emitting unit, the second emitting unit, and the third emitting unit may each be smaller than $T_1$ values of the hosts of the other emitting units, $T_1$ values of the hosts of at least one of the emitting units may each independently be greater than or equal to about 2.89 eV, and each of the first emitting unit, the second emitting unit, and the third emitting unit may include a phosphorescent dopant and a fluorescent dopant.

In an embodiment, the $T_1$ value of the second-first host and the $T_1$ value of the second-second host may each be smaller than the $T_1$ value of the first-first host and the $T_1$ value of the first-second host, and the $T_1$ value of the third-first host and the $T_1$ value of the third-second host may each be smaller than the $T_1$ value of the first-first host and the $T_1$ value of the first-second host;

the $T_1$ value of the first-first host and the $T_1$ value of the first-second host may each be smaller than the $T_1$ value of the third-first host and the $T_1$ value of the third-second host, and the $T_1$ value of the second-first host and the $T_1$ value of the second-second host may each be smaller than the $T_1$ value of the third-first host and the $T_1$ value of the third-second host; or the $T_1$ value of the first-first host and the $T_1$ value of the first-second host may each be smaller than the $T_1$ value of the second-first host and the $T_1$ value of the second-second host, and the $T_1$ value of the third-first host and the $T_1$ value of the third-second host may each be smaller than the $T_1$ value of the second-first host and the $T_1$ value of the second-second host.

In an embodiment, the $T_1$ value of the third-first host and the $T_1$ value of the third-second host may each be smaller than the $T_1$ value of the first-first host and the $T_1$ value of the first-second host, and the $T_1$ value of the third-first host and the $T_1$ value of the third-second host may each be smaller than the $T_1$ value of the second-first host and the $T_1$ value of the second-second host;

the $T_1$ value of the first-first host and the $T_1$ value of the first-second host may each be smaller than the $T_1$ value of the second-first host and the $T_1$ value of the second-second host, and the $T_1$ value of the first-first host and the $T_1$ value of the first-second host may each be smaller than the $T_1$ value of the third-first host and the $T_1$ value of the third-second host; or the $T_1$ value of the second-first host and the $T_1$ value of the second-second host may each be smaller than the $T_1$ value of the first-first host and the $T_1$ value of the first-second host, and the $T_1$ value of the second-first host and the $T_1$ value of the second-second host may each be smaller than the $T_1$ value of the third-first host and the $T_1$ value of the third-second host.

In an embodiment, the first electrode may be an anode and the second electrode may be a cathode, or the second electrode may be an anode and the first electrode may be a cathode.

In an embodiment, the $T_1$ values of the hosts of at least one of the emitting units may each independently be in a range of about 2.89 eV to about 3.00 eV.

In an embodiment, the $T_1$ values of the hosts of emitting units other than at least one of the first emitting unit, the second emitting unit, and the third emitting unit may each independently be greater than or equal to about 3.00 eV.

In an embodiment, the first emitting unit, the second emitting unit, and the third emitting unit may each emit blue light.

In an embodiment, the second emitting unit may be between the first emitting unit and the third emitting unit; and either:

the $T_1$ values of the first-first host and the first-second host may each independently in a range of about 3.00 eV to about 3.10 eV, and the $T_1$ values of the third-first host and the third-second host may each independently be in a range of about 2.89 eV to about 3.00 eV; or the $T_1$ values of the third-first host and the third-second host may each independently be in a range of about 3.00 eV to about 3.10 eV, and the $T_1$ values of the first-first host and the first-second host may each independently be in a range of about 2.89 eV to about 3.00 eV.

In an embodiment, the first emitting unit may be closest to the second electrode, and the third emitting unit may be closest to the first electrode.

In an embodiment, the first emitting unit may be closest to the first electrode, and the third emitting unit may be closest to the second electrode.

In an embodiment, the $T_1$ values of the second-first host and the second-second host may each independently be in a range of about 2.89 eV to about 3.00 eV.

In an embodiment, the $T_1$ values of the second-first host and the second-second host may each independently be in a range of about 3.00 eV to about 3.10 eV.

In an embodiment, one of the first-first host and the first-second host may be a hole-transporting host, and the other thereof may be an electron-transporting host;

one of the second-first host and the second-second host may be a hole-transporting host, and the other thereof may be an electron-transporting host; or one of the third-first host and the third-second host may be a hole-transporting host, and the other thereof may be an electron-transporting host.

In an embodiment, the first-first host and the first-second host may respectively be identical to the second-first host and the second-second host; or the second-first host and the second-second host may respectively be identical to the third-first host and the third-second host.

In an embodiment, the phosphorescent dopant may include an organometallic compound represented by Formula 401, which is explained below.

In an embodiment, the fluorescent dopant may be a delayed fluorescence dopant.

In an embodiment, the fluorescent dopant may include one of Compounds DF1 to DF15, which are explained below.

In an embodiment, each charge generation layer may include an n-type charge generation layer and a p-type charge generation layer.

In an embodiment, an electronic apparatus may include the light-emitting device.

In an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects, and features, of the disclosure will be more apparent by describing in detail embodiments thereof with reference to the accompanying drawings, in which.

DETAILED DESCRIPTION OF THE EMBODIMENTS

Figure 1:
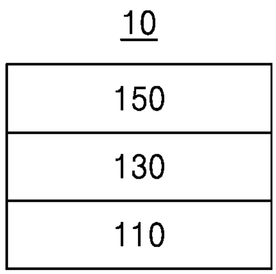
FIGS. 1 and 2 are each a schematic cross-sectional view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and/or like reference characters refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may refer to a physical, electrical and/or fluid connection or coupling, with or without intervening elements.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of,"

modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A light-emitting device in the art in which an emission layer including phosphorescence and delayed fluorescence may be applied in a single emitting unit structure.

In the case of a tandem light-emitting device, since the efficiency and lifespan of respective emitting units are affected by different factors, when emitting units are changed according to the purpose instead of applying the same emission layer, which may also be referred to as an emitting unit, the characteristics of the light-emitting device may be further enhanced.

A light-emitting device according to an embodiment may include:

a first electrode;

a second electrode facing the first electrode;

m emitting units between the first electrode and the second electrode; and m-1 charge generation layers between adjacent ones of the m emitting units, wherein m is an integer of 3 or more, and the emitting units may include a first emitting unit, a second emitting unit, and a third emitting unit, the first emitting unit may include a first-first host and a first-second host, the second emitting unit may include a second-first host and a second-second host, the third emitting unit may include a third-first host and a third-second host, $T_1$ values of the hosts of at least one of the first emitting unit, the second emitting unit, and the third emitting unit may each be smaller than $T_1$ values of the hosts of the other emitting units, $T_1$ values of the hosts of at least one of the emitting units may each independently be greater than or equal to about 2.89 eV, and each of the first emitting unit, the second emitting unit, and the third emitting unit may include a phosphorescent dopant and a fluorescent dopant.

The light-emitting device according to an embodiment may constitute a tandem device which may include phosphorescence and delayed fluorescence and may further exhibit enhanced characteristics by adjusting the triplet state ($T_1$) of the hosts of each emitting unit.

When $T_1$ values of the hosts of at least one of the emitting units are less than 2.89 eV, the efficiency of the device may be reduced.

In an embodiment, the $T_1$ value of the second-first host and the $T_1$ value of the second-second host may each be smaller than the $T_1$ value of the first-first host and the $T_1$ value of the first-second host, and the $T_1$ value of the third-first host and the $T_1$ value of the third-second host may each be smaller than the $T_1$ value of the first-first host and the $T_1$ value of the first-second host;

the $T_1$ value of the first-first host and the $T_1$ value of the first-second host may each be smaller than the $T_1$ value of the third-first host and the $T_1$ value of the third-second host, and the $T_1$ value of the second-first host and the $T_1$ value of the second-second host may each be smaller than the $T_1$ value of the third-first host and the $T_1$ value of the third-second host; or the $T_1$ value of the first-first host and the $T_1$ value of the first-second host may each be smaller than the $T_1$ value of the second-first host and the $T_1$ value of the second-second host, and the $T_1$ value of the third-first host and the $T_1$ value of the third-second host may each be smaller than the $T_1$ value of the second-first host and the $T_1$ value of the second-second host.

In an embodiment, the $T_1$ value of the third-first host and the $T_1$ value of the third-second host may each be smaller than the $T_1$ value of the first-first host and the $T_1$ value of the first-second host, and the $T_1$ value of the third-first host and the $T_1$ value of the third-second host may each be smaller than the $T_1$ value of the second-first host and the $T_1$ value of the second-second host;

the $T_1$ value of the first-first host and the $T_1$ value of the first-second host may each be smaller than the $T_1$ value of the second-first host and the $T_1$ value of the second-second host, and the $T_1$ value of the first-first host and the $T_1$ value of the first-second host may each be smaller than the $T_1$ value of the third-first host and the $T_1$ value of the third-second host; or the $T_1$ value of the second-first host and the $T_1$ value of the second-second host may each be smaller than the $T_1$ value of the first-first host and the $T_1$ value of the first-second host, and the $T_1$ value of the second-first host and the $T_1$ value of the second-second host may each be smaller than the $T_1$ value of the third-first host and the $T_1$ value of the third-second host.

In an embodiment, the first electrode may be an anode and the second electrode may be a cathode, or the second electrode may be an anode and the first electrode may be a cathode.

In an embodiment, the $T_1$ values of the hosts of at least one of the emitting units may each independently be in a range of greater than or equal to about 2.89 eV to about 3.00 eV. For example, the $T_1$ values of the first-first host and the first-second host may each independently be in a range of about 2.89 eV to about 3.00 eV. For example, the $T_1$ values of the second-first host and the second-second host may each independently be in a range of about 2.89 eV to about 3.00 eV. For example, the $T_1$ values of the third-first host and the third-second host may each independently be in a range of about 2.89 eV to about 3.00 eV.

In an embodiment, the $T_1$ values of the hosts of emitting units other than at least one of the first emitting unit, the second emitting unit, and the third emitting unit may each independently be greater than or equal to about 3.00 eV.

For example, the $T_1$ values of the hosts of emitting units other than at least one of the first emitting unit, the second emitting unit, and the third emitting unit may each independently be in a range of about 3.00 eV to about 3.10 eV.

For example, the $T_1$ values of the first-first host and the first-second host may each independently be in a range of greater than or less than about 2.89 eV to about 3.00 eV, the $T_1$ values of the third-first host and the third-second host may each independently be in a range of greater than or less than about 2.89 eV to about 3.00 eV, and the $T_1$ values of the second-first host and the second-second host may each independently be in a range of about 3.00 eV to about 3.10 eV.

For example, the $T_1$ values of the first-first host and the first-second host may each independently be in a range of about 3.00 eV to about 3.10 eV, the $T_1$ values of the third-first host and the third-second host may each independently be in a range of about 3.00 eV to about 3.10 eV, and the $T_1$ values of the second-first host and the second-second host may each independently be in a range of greater than or equal to about 2.89 eV and less than about 3.00 eV.

According to an embodiment, the first emitting unit, the second emitting unit, and the third emitting unit may each emit blue light.

According to an embodiment, the second emitting unit may be between the first emitting unit and the third emitting unit, and either:

the $T_1$ values of the first-first host and the first-second host may each independently be in a range of about 3.00 eV to about 3.10 eV, and the $T_1$ values of the third-first host and the third-second host may each independently be in a range of greater than or equal to about 2.89 eV and less than about 3.00 eV; or the $T_1$ values of the third-first host and the third-second host may each independently be in a range of about 3.00 eV to about 3.10 eV, and the $T_1$ values of the first-first host and the first-second host may each independently be in a range of greater than or equal to about 2.89 eV and less than about 3.00 eV, and For example, the light-emitting device according to an embodiment may include a first emitting unit/second emitting unit/third emitting unit structure.

In an embodiment, the first emitting unit may be closest to the second electrode, and the third emitting unit may be closest to the first electrode.

In an embodiment, the first emitting unit may be closest to the first electrode, and the third emitting unit may be closest to the second electrode.

In an embodiment, the $T_1$ values of the second-first host and the second-second host of the second emitting unit may each independently be in a range of about 2.89 eV to about 3.00 eV.

In an embodiment, the $T_1$ values of the second-first host and the second-second host of the second emitting unit may each independently be in a range of about 3.00 eV to about 3.10 eV.

In an embodiment, one of the first-first host and the first-second host may be a hole-transporting host, and the other thereof may be an electron-transporting host;

one of the second-first host and the second-second host may be a hole-transporting host, and the other thereof may be an electron-transporting host; or one of the third-first host and the third-second host may be a hole-transporting host, and the other thereof may be an electron-transporting host.

Further detailed descriptions of the hosts will be provided below.

In an embodiment, the first-first host and the first-second host may be respectively identical to the second-first host and the second-second host; or the second-first host and the second-second host may be respectively identical to the third-first host and the third-second host.

In an embodiment, a weight ratio of the phosphorescent dopant to the fluorescent dopant may be in a range of about 9:1 to about 1:9. For example, the weight ratio of the phosphorescent dopant to the fluorescent dopant may be in a range of about 5:4 to about 4:5. For example, the weight ratio of the phosphorescent dopant to the fluorescent dopant may be in a range of about 7:3 to about 8:2.

Further detailed descriptions of the dopants will be provided below.

In an embodiment, each charge generation layer may include an n-type charge generation layer and a p-type charge generation layer.

The light-emitting device may include m-1 charge generation layers between adjacent ones of the m emitting units.

Figure 2:
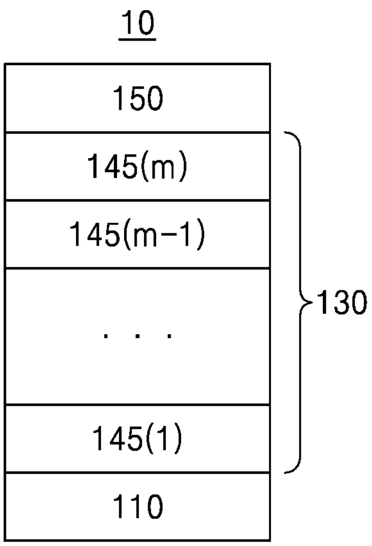

Referring to FIG. 2, an interlayer 130 may include m emitting units 145(1), 145(m-1), and 145(*m*) and m-1 charge generation layers(not shown) interposed between the emitting units, and the m emitting units may include a first emitting unit, a second emitting unit, and a third emitting unit, the first emitting unit may include a first-first host and a first-second host, the second emitting unit may include a second-first host and a second-second host, the third emitting unit may include a third-first host and a third-second host, of the first emitting unit, the second emitting unit, and the third emitting unit, the $T_1$ values of the hosts of at least one thereof may be less than the $T_1$ values of the hosts of the others thereof, the $T_1$ values of the hosts of at least one of the emitting units may be greater than or equal to about 2.89 eV, and each of the first emitting unit, the second emitting unit, and the third emitting unit may include a phosphorescent dopant and a fluorescent dopant.

For example, when m is 3, a first electrode, a third emitting unit, a second charge generation layer, a second emitting unit, a first charge generation layer, and a first emitting unit may be disposed in that order.

The first emitting unit may include a first-first host and a first-second host, the second emitting unit may include a second-first host and a second-second host, and the third emitting unit may include a third-first host and a third-second host, and the $T_1$ values of the first-first host and the first-second host may each independently be in a range of about 3.00 eV to about 3.10 eV, the $T_1$ values of the second-first host and the second-second host may each independently be in a range of about 2.89 eV to about 3.00 eV, and the $T_1$ values of the third-first host and the third-second host may each independently be in a range of about 2.89 eV to about 3.00 eV.

For example, the rate of charges may be controlled by selecting a compound used in a hole transport region and/or an electron transport region, and a relatively large quantity of excitons may be produced in the second emitting unit and the third emitting unit. The $T_1$ values of the second-first host and second-second host of the second emitting unit and the third-first host and the third-second host of the third emitting unit have relatively low values, e.g., in a range of about 2.89 eV to about 3.00 eV, and thus the efficiency of the second emitting unit and the efficiency of the third emitting unit are deteriorated, but the overall lifespan of the device including the first emitting unit, the second emitting unit, and the third emitting unit may be enhanced. This is because the second-first host and the second-second host partially quench excitons generated in the second emitting unit, and the third-first host and the third-second host partially quench excitons generated in the third emitting unit.

Referring to FIG. 2, among the m emitting units, an emitting unit that is $m^{th}$ closest to the first electrode may be referred to as an $m^{th}$ emitting unit ELU(m).

Among the m emitting units, an emitting unit that is closest to the first electrode is referred to as a first emitting unit ELU(1), and an emitting unit that is farthest from the first electrode is referred to as an $m^{th}$ emitting unit ELU(m), and the first emitting unit ELU(1) to the $m^{th}$ emitting unit are sequentially arranged. For example, an m-$1^{th}$ emitting unit ELU(m-1) may be interposed between the first electrode and the $m^{th}$ emitting unit ELU(m).

In the light-emitting device according to an embodiment, a hole transport region or an electron transport region may be disposed between an emitting unit and a charge generation layer.

The hole transport region may include a hole injection layer, a hole transport layer, an electron blocking layer, or any combination thereof.

The electron transport region may include an electron injection layer, an electron transport layer, a hole blocking layer, or any combination thereof.

In an embodiment, among the m-1 charge generation layers, a charge generation layer that is m-$1^{th}$ closest to the first electrode may be referred to as an m-$1^{th}$ charge generation layer.

According to embodiments, an electronic apparatus may include the light-emitting device as described above. The electronic apparatus may further include a thin-film transistor. For example, the electronic apparatus may further include a thin-film transistor including a source electrode and a drain electrode, and the first electrode of the light-emitting device may be electrically connected to at least one of the source electrode and the drain electrode.

In embodiments, the electronic apparatus may further include a color filter, a color conversion layer, a touch screen layer, a polarizing layer, or any combination thereof. More details of the electronic apparatus may be referred to the descriptions provided herein.

The term "interlayer" as used herein refers to a single layer and/or all layers between the first electrode and the second electrode of the light-emitting device.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. The substrate may be a glass substrate or a plastic substrate. In embodiments, the substrate may be a flexible substrate, and may include, for example, plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 130]

The interlayer 130 may be arranged on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include, in addition to various organic materials, a metal-containing compound such as an organometallic compound, an inorganic material such as quantum dots, or the like.

In embodiments, the interlayer 130 may include two or more emission layers stacked between the first electrode 110 and the second electrode 150 and at least one charge generation layer located between the two or more emission layers. When the interlayer 130 includes the two or more emission layers and the at least one charge generation layer as described above, the light-emitting device 10 may be a tandem light-emitting device.

In an embodiment, the charge generation layer may include an n-type charge generation layer and a p-type charge generation layer.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, in which the layers of each structure may be stacked from the first electrode 110 in its respective stated order, but the structure of the hole transport region is not limited thereto.

For example, the hole transport region may have a multi-layered structure of a hole transport layer/emission auxiliary layer, or a hole transport layer/electron blocking layer, which may be stacked in the stated order from the first electrode 110.

The hole transport region may include a compound represented by Formula 201, a compound represented by Formula 202, or any combination thereof:

[Formula 201]

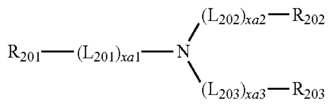

[Formula 202]

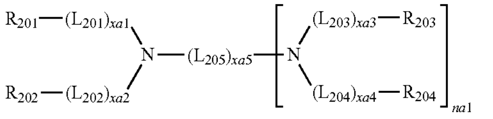

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, the compound represented by Formula 201 and the compound represented by Formula 202 may include at least one of groups represented by Formulae CY201 to CY217:

CY201

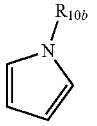

CY202

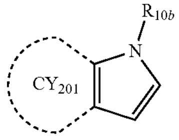

CY203

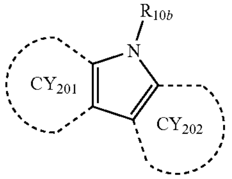

CY204

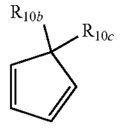

CY205

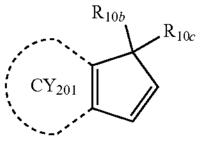

CY206

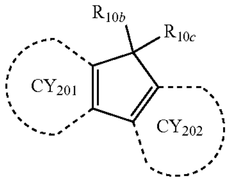

CY207

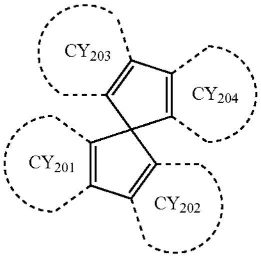

-continued

CY208

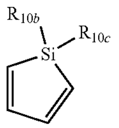

CY209

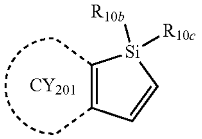

CY210

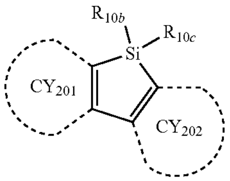

CY211

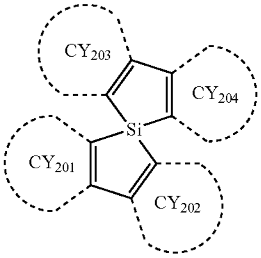

CY212

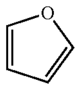

CY213

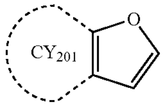

CY214

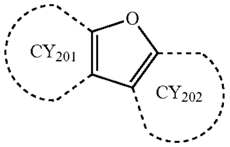

CY215

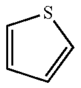

CY216

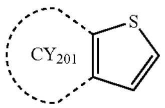

-continued

CY217

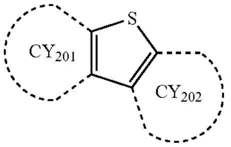

In Formulae CY201 to CY217, $R_{10b}$ and $R_{10c}$ may each be the same as described herein with regard to $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring $CY_{201}$ to ring $CY_{204}$ in Formulae CY201 to CY217 may each independently be a benzene group, a naphthalene group, a phenanthrene group, or an anthracene group.

In embodiments, the compound represented by Formula 201 and the compound represented by Formula 202 may include at least one of the groups represented by Formulae CY201 to CY203.

In embodiments, Formula 201 may include at least one of the groups represented by Formulae CY201 to CY203 and at least one of groups represented by Formulae CY204 to CY217.

In embodiments, the compound represented by Formula 201, xa1 may be 1, $R_{201}$ may be one of groups represented by Formulae CY201 to CY203, xa2 may be 0, and $R_{202}$ may be one of groups represented by Formulae CY204 to CY207.

In embodiments, the compound represented by Formula 201 and the compound represented by Formula 202 may each not include groups represented by Formulae CY201 to CY203.

In embodiments, the compound represented by Formula 201 and the compound represented by Formula 202 may each not include groups represented by Formulae CY201 to CY203, and may each independently include at least one of groups represented by Formulae CY204 to CY217.

In embodiments, the compound represented by Formula 201 and the compound represented by Formula 202 may each not include groups represented by Formulae CY201 to CY217.

For example, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
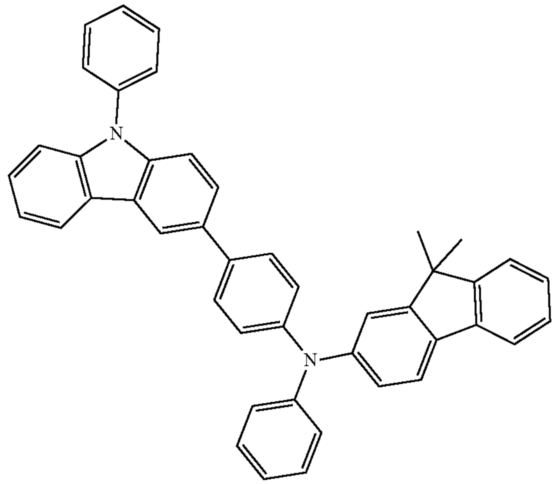
HT2
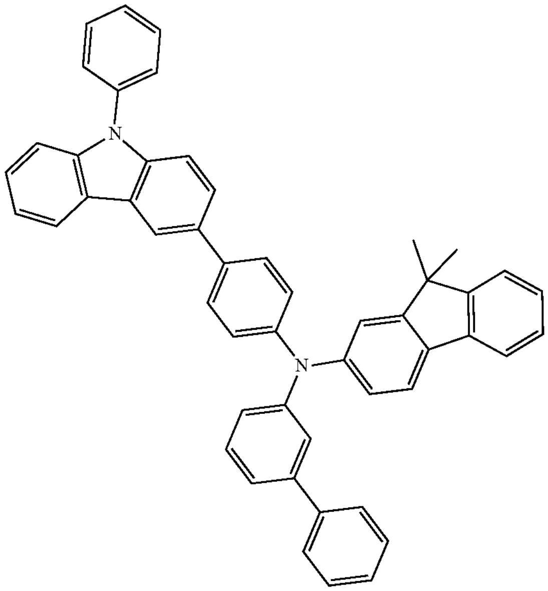
HT3
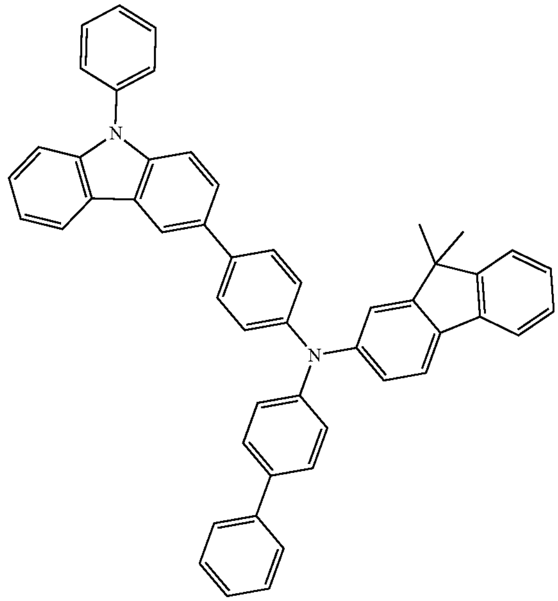
HT4
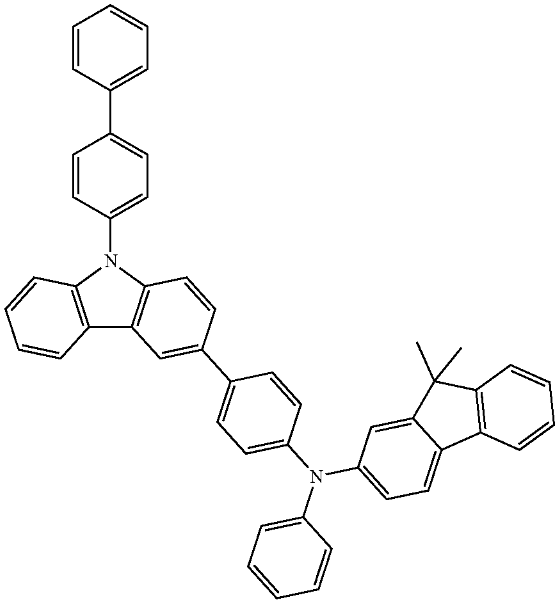

-continued
HT5
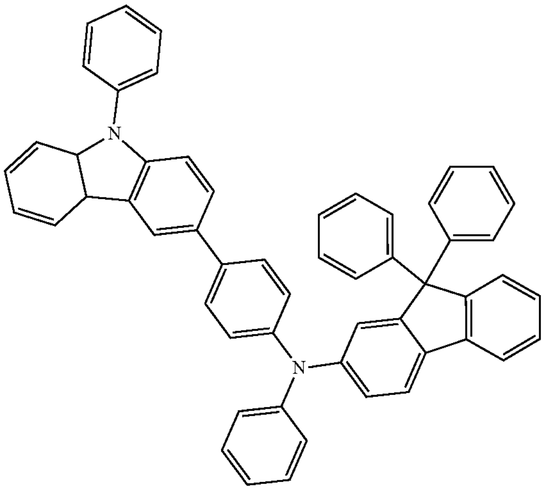
HT6
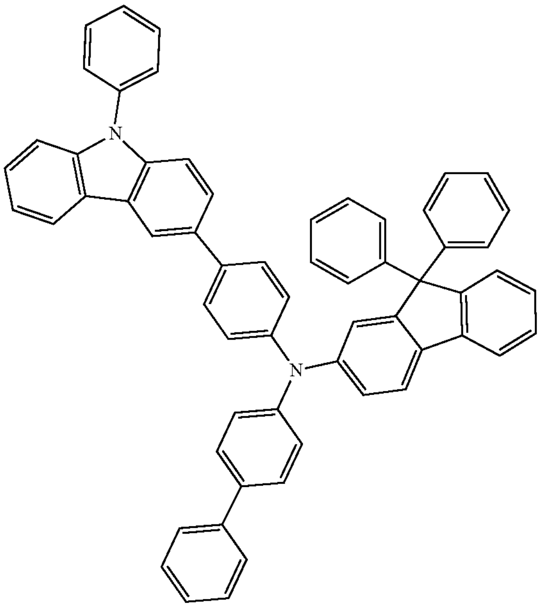
HT7
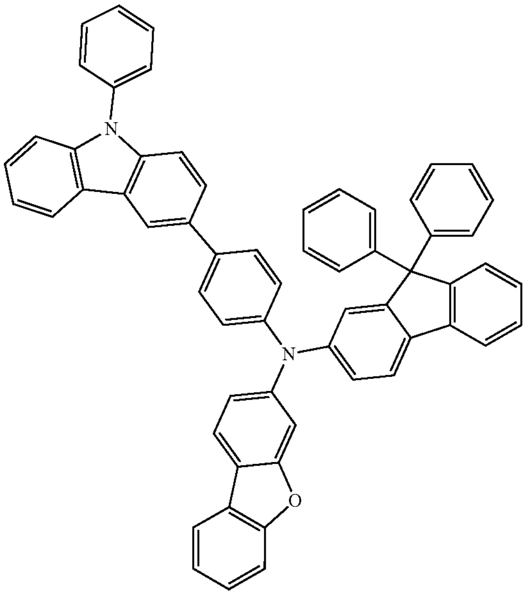
HT8
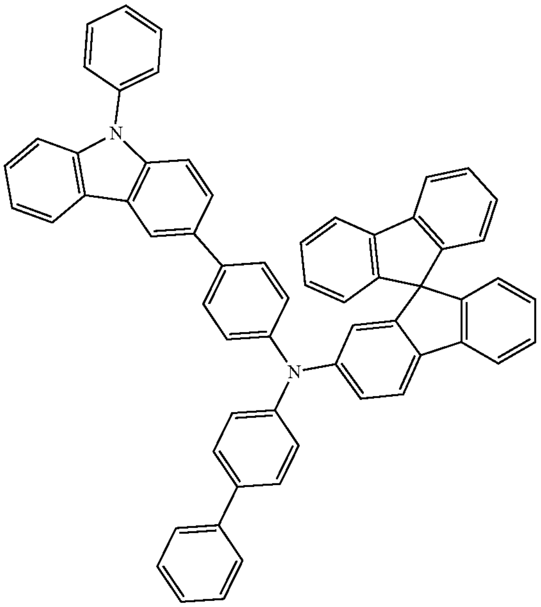

-continued
HT9
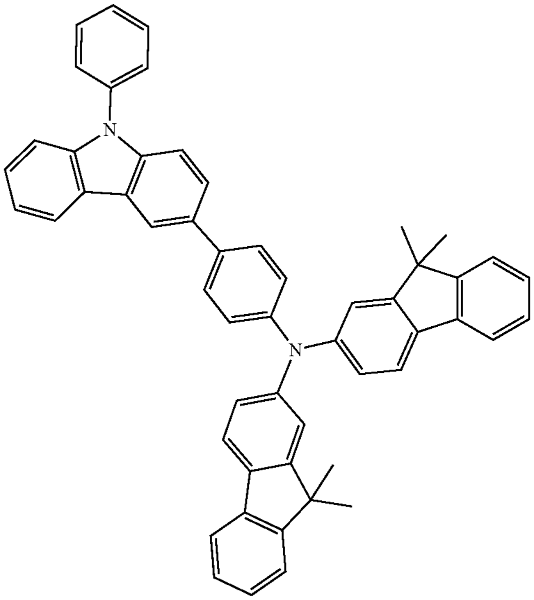
HT10
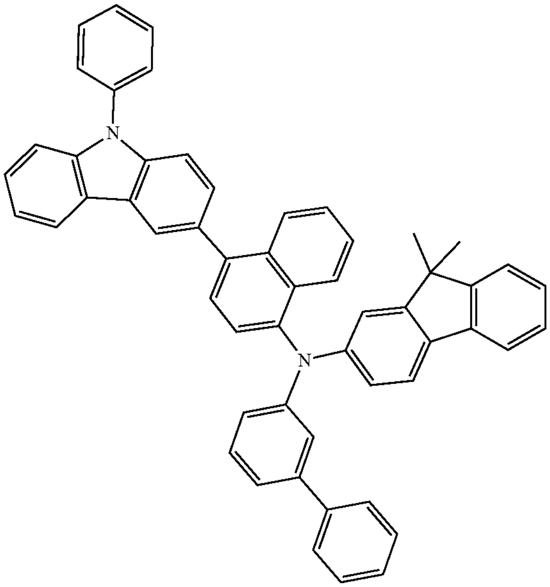
HT11
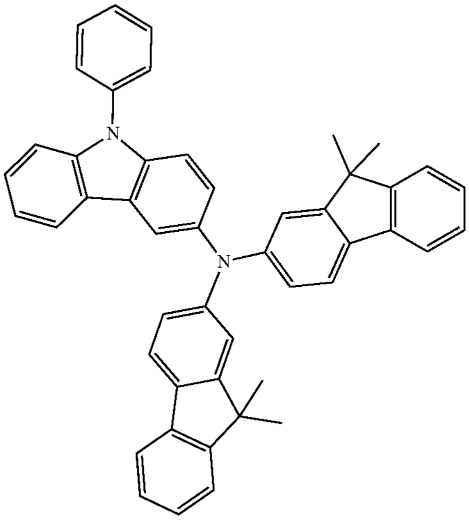
HT12
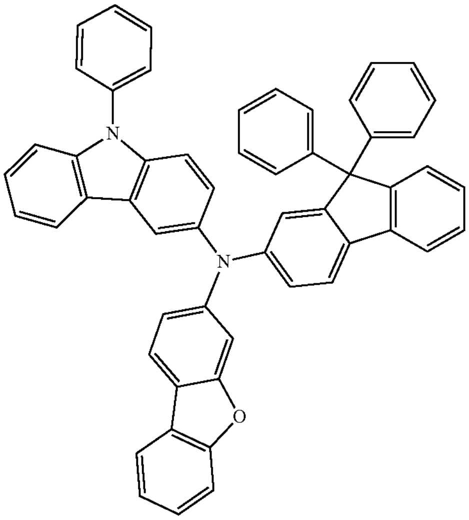

-continued
HT13
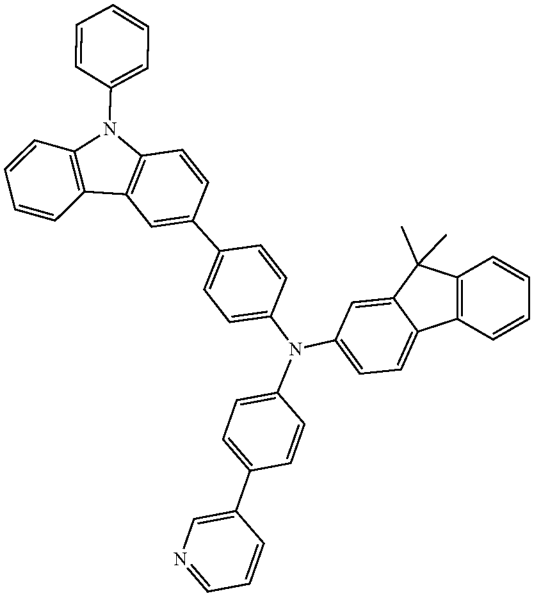
HT14
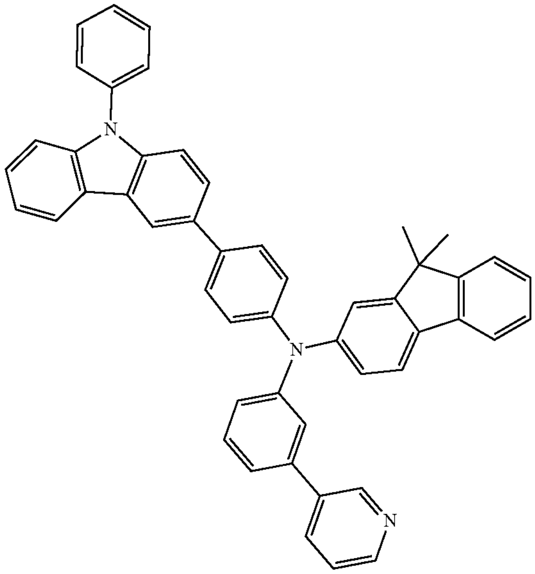
HT15
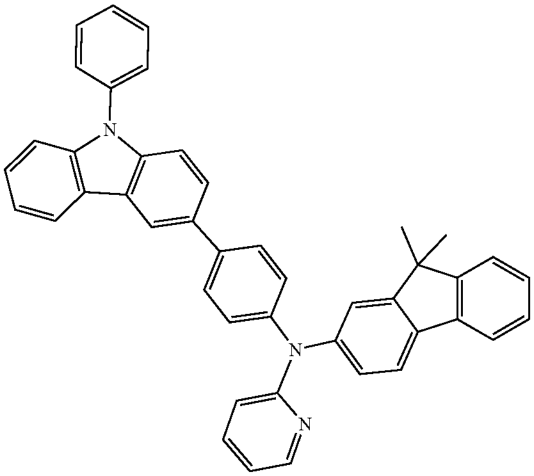
HT16
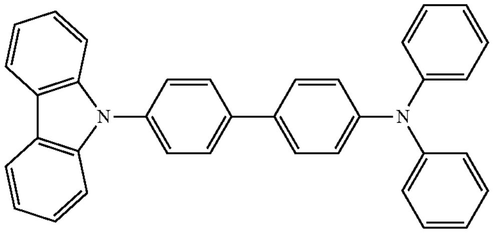
HT17
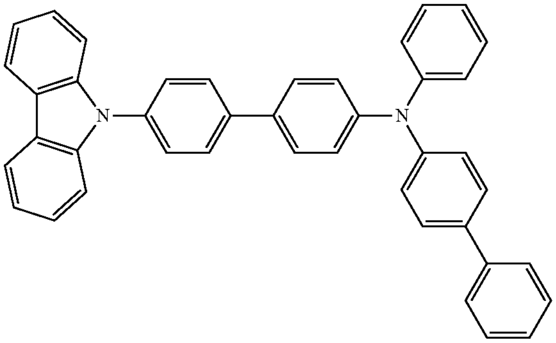
HT18
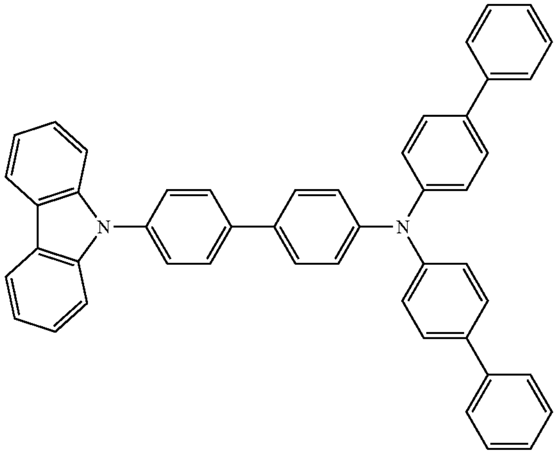

-continued
HT19
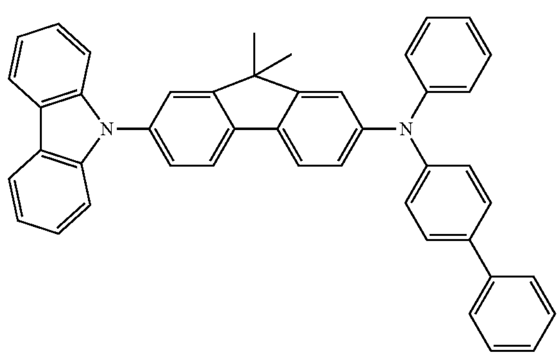
HT20
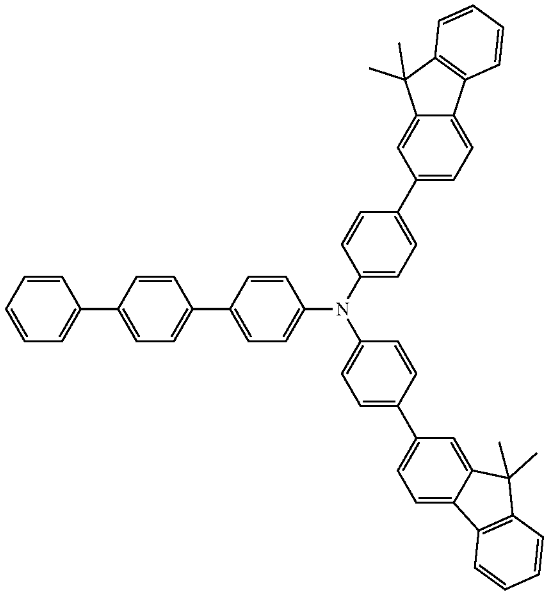
HT21
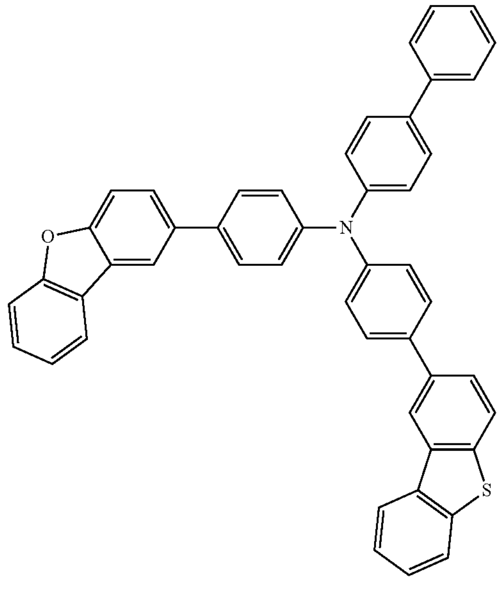
HT22
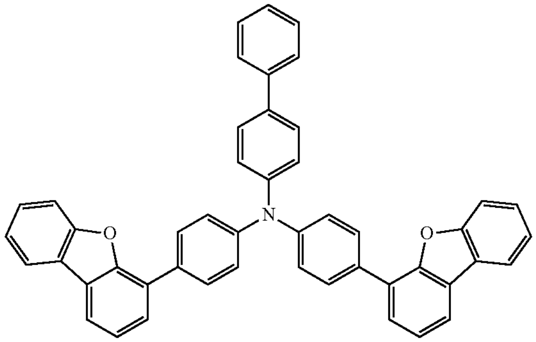

-continued
HT23
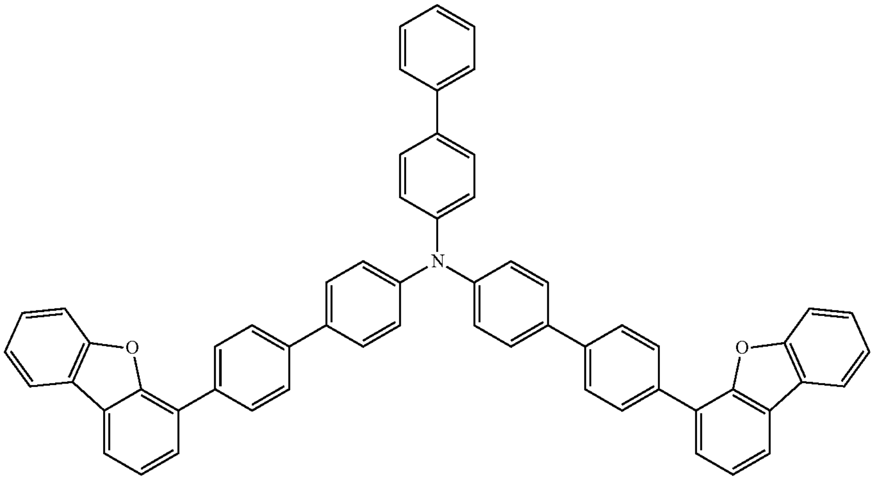
HT24
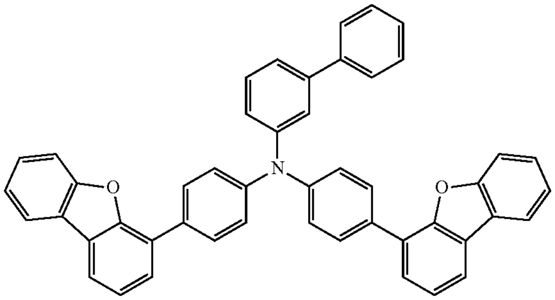
HT25
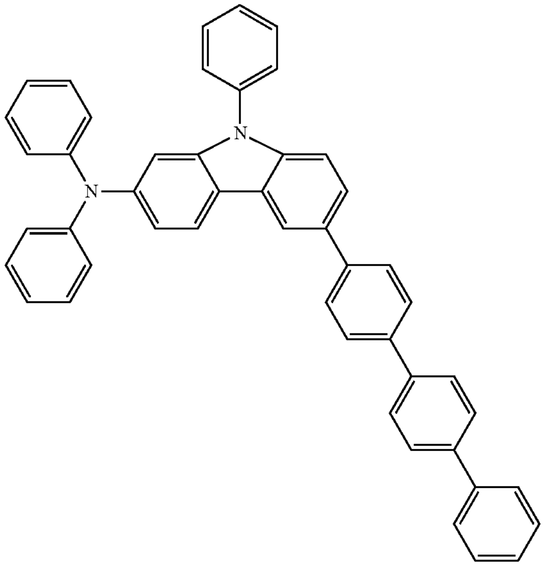
HT26
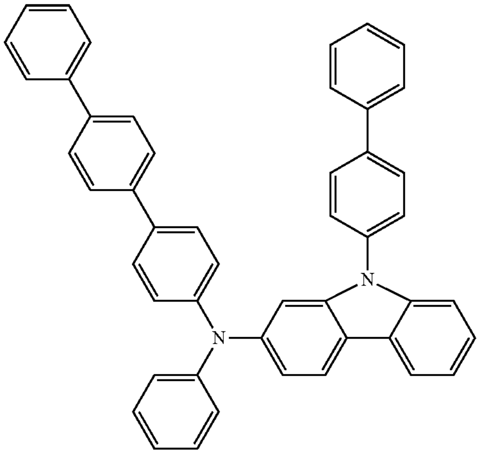
HT27
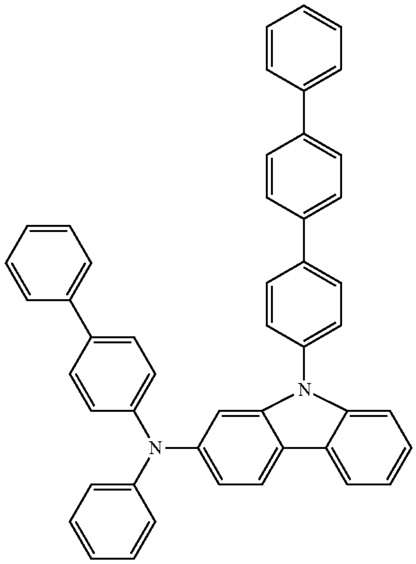

-continued
HT28
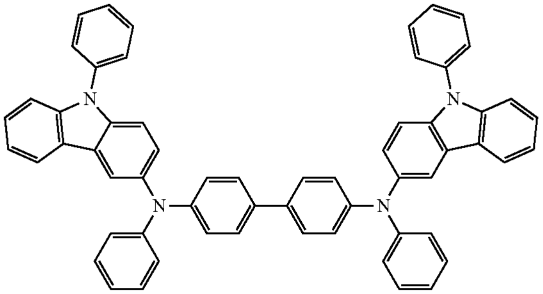
HT29
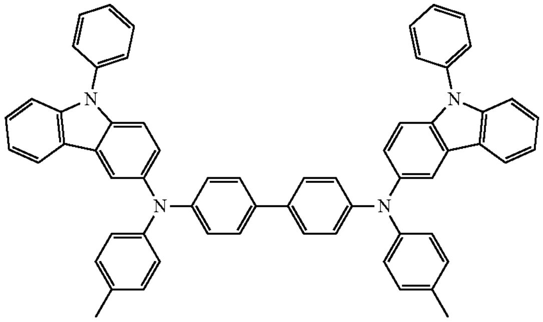
HT30
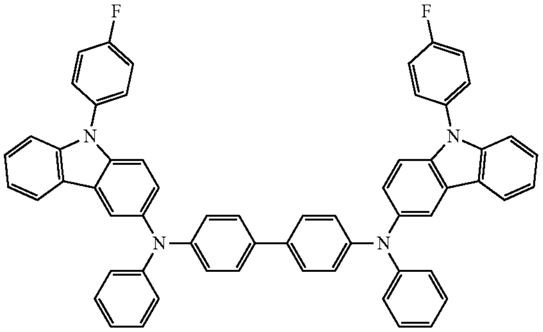
HT31
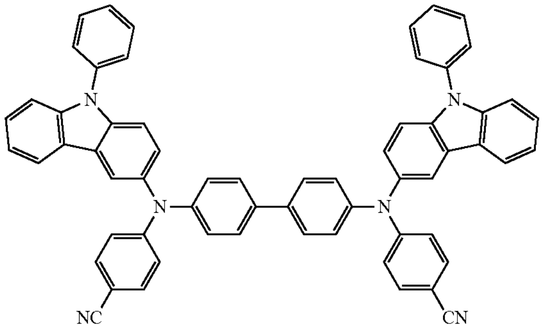
HT32
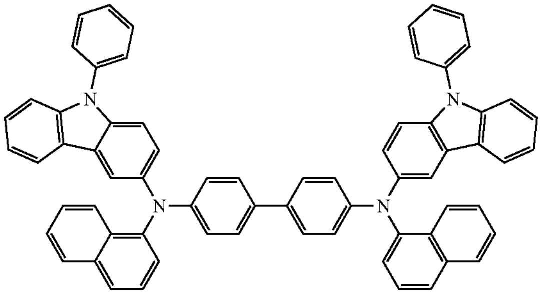
HT33
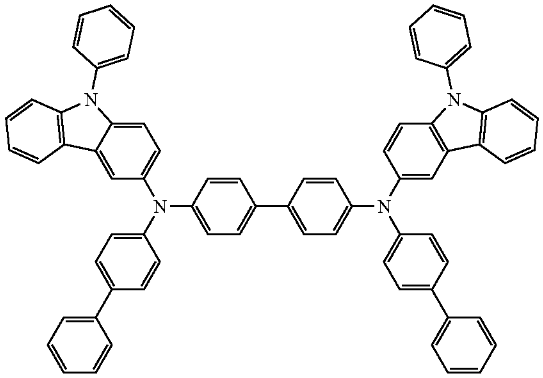
HT34
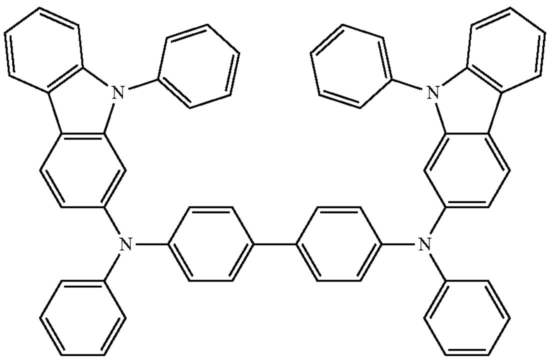
HT35
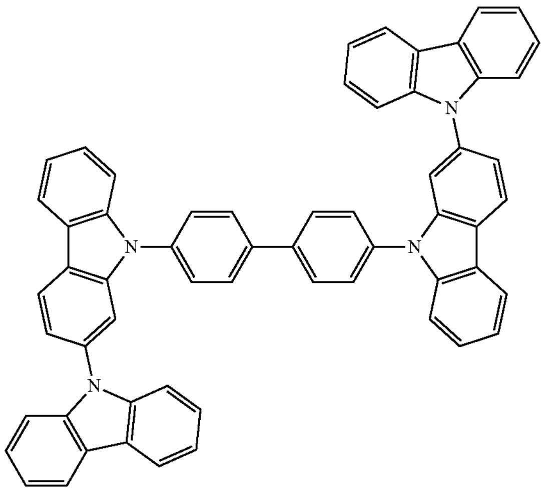

-continued
HT36
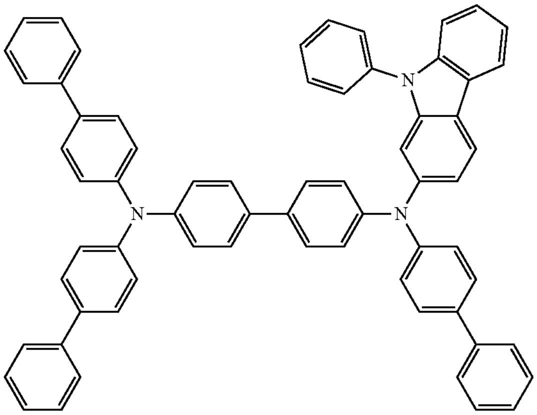
HT37
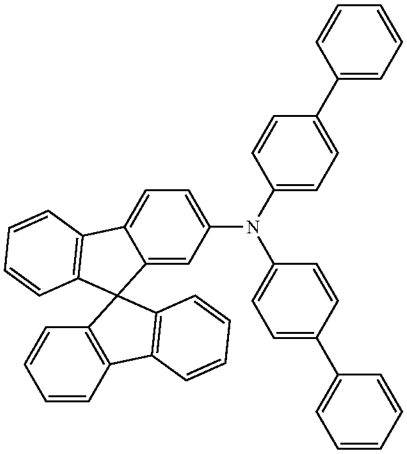
HT38
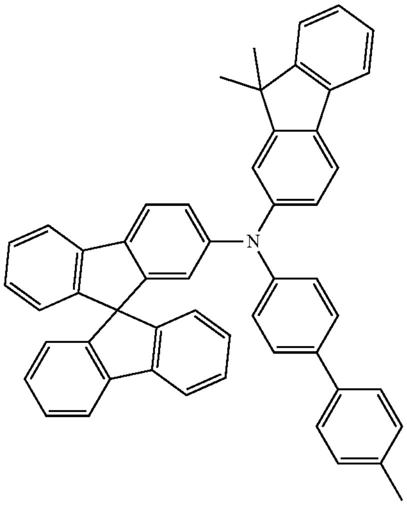
HT39
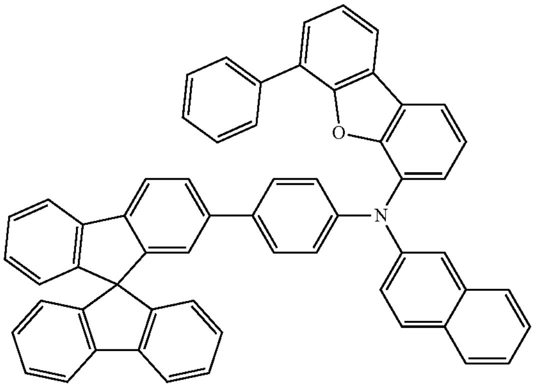
HT40
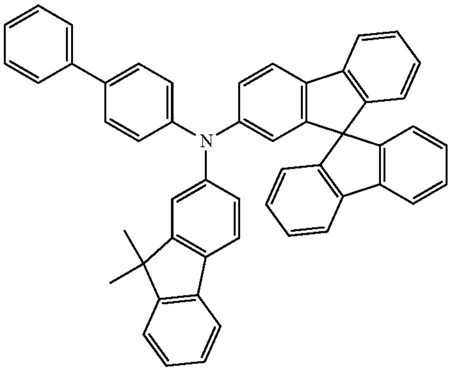
HT41
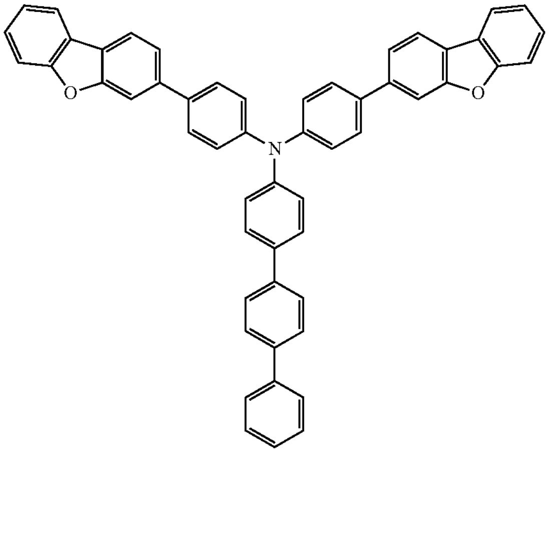

-continued
HT42
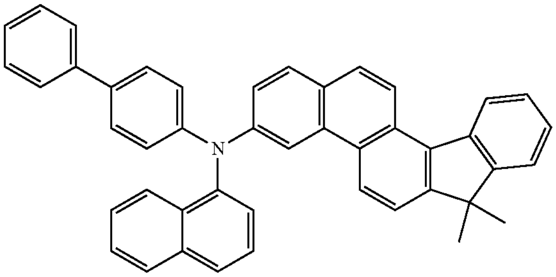
HT43
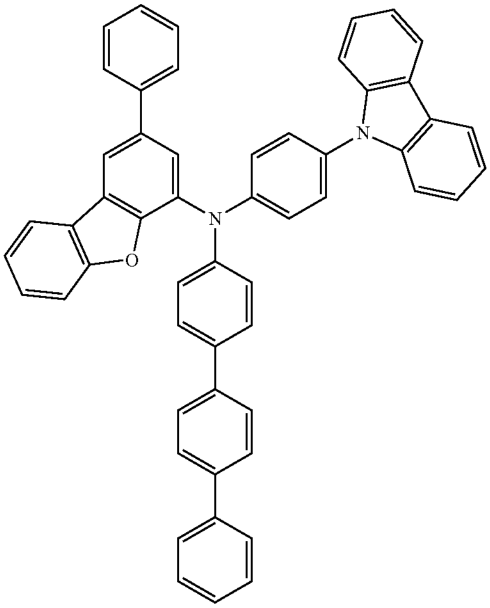
HT44
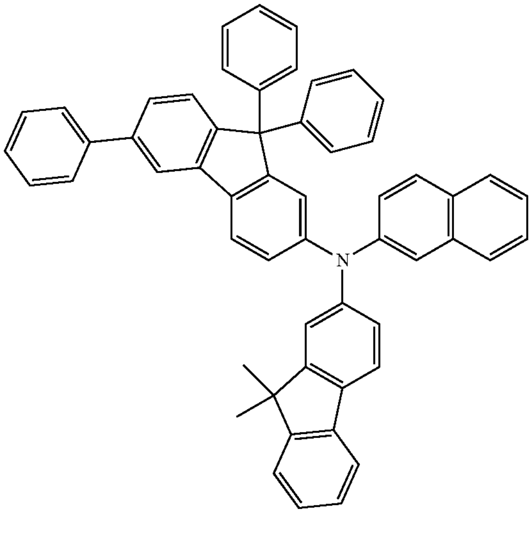
HT45
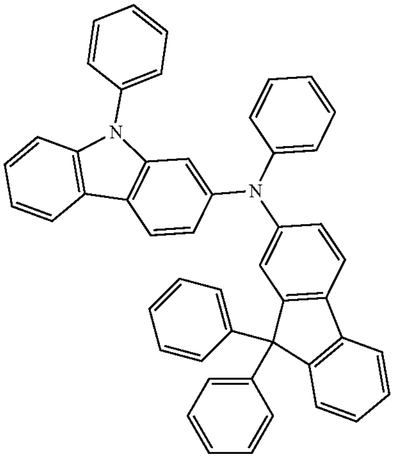

-continued
HT46
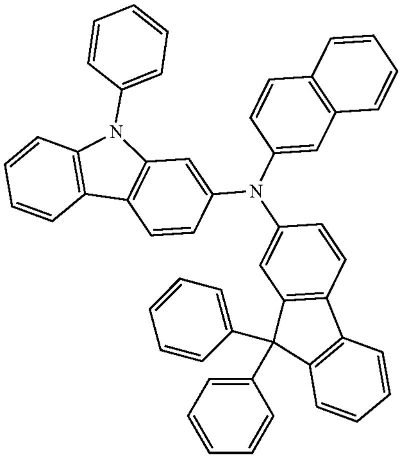
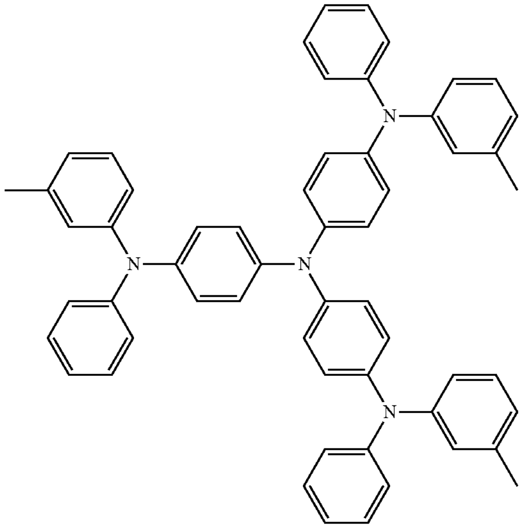
m-MTDATA
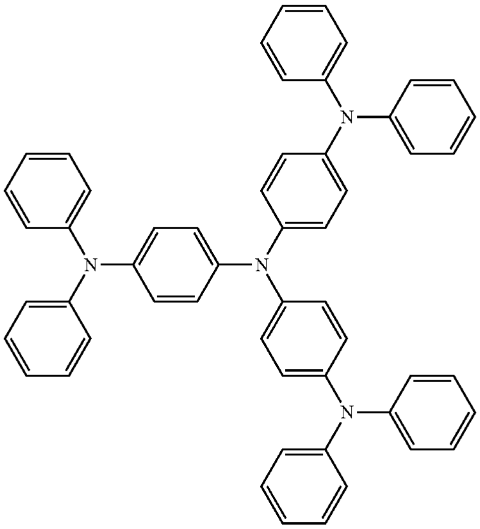
TDATA
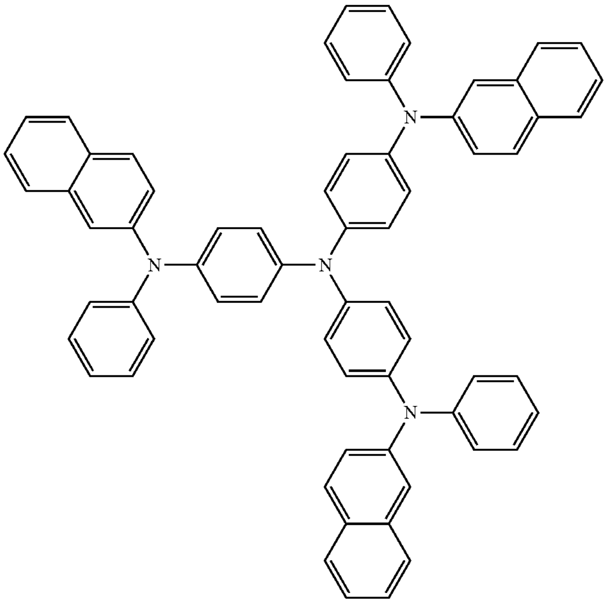
TDATA
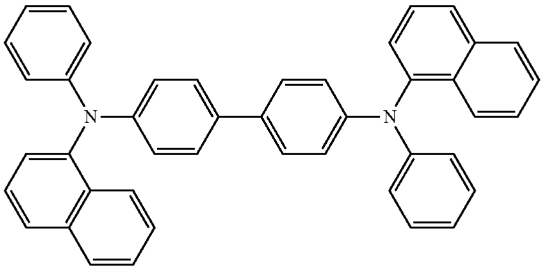
NPB
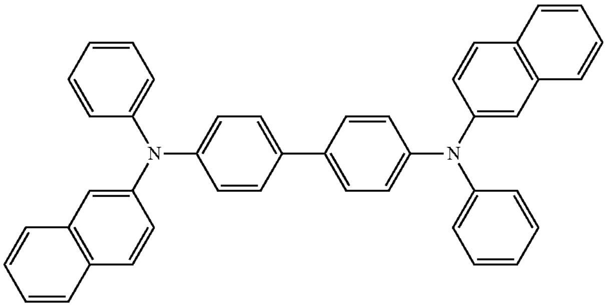
β-NPB -continued

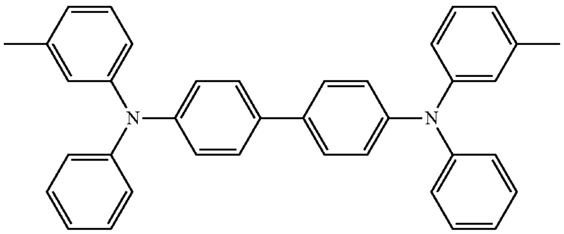

TPD

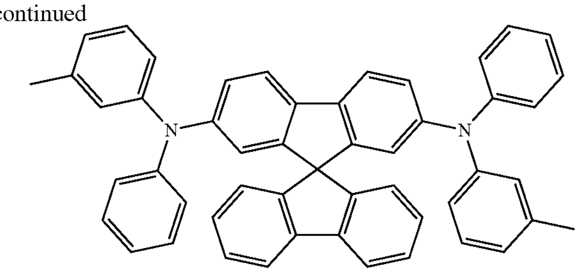

Spiro-TPD

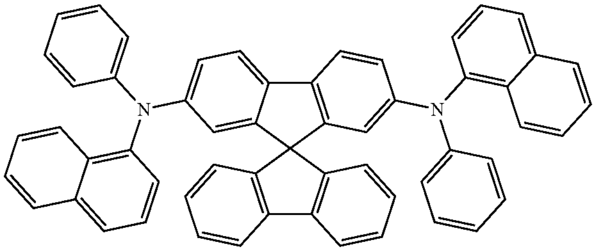

Spiro-NPB

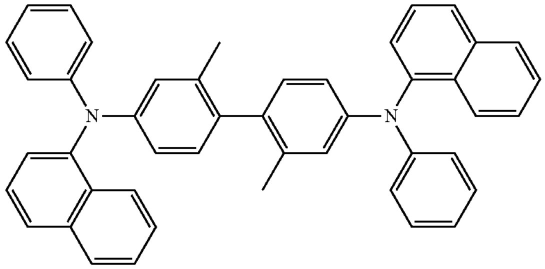

methylated-NPB

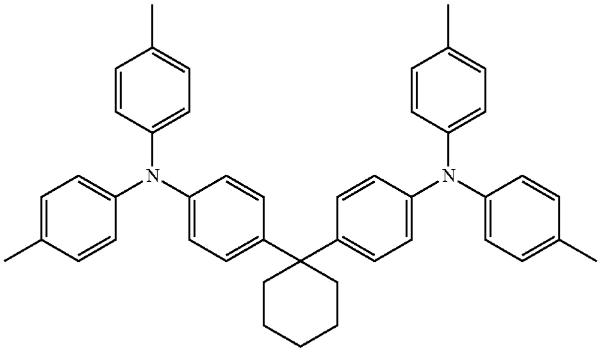

TAPC

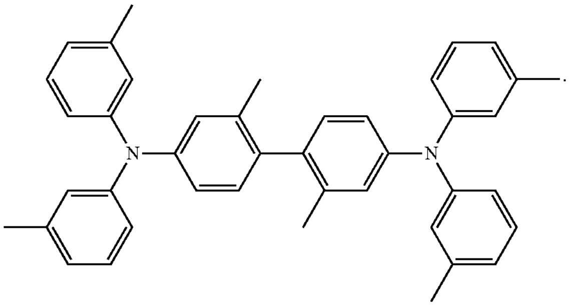

HMTPD

A thickness of the hole transport region may be in a range of about 50 Å to about 10,000 Å. For example, the thickness of the hole transport region may be in a range of about 100 Å to about 4,000 Å. When the hole transport region includes a hole transport layer, an electron blocking layer or any combination thereof, a thickness of the hole transport layer may be in a range of about 50 Å to about 2,000 Å. For example, the thickness of the hole transport layer may be in a range of about 100 Å to about 1,500 Å. When the thicknesses of the hole transport region and the hole transport layer are within the ranges described above, satisfactory hole transport characteristics may be obtained without a substantial increase in driving voltage.

The emission auxiliary layer may increase light-emission efficiency by compensating for an optical resonance distance according to a wavelength of light emitted from the emission layer, and the electron-blocking layer may prevent the leakage of electrons from the emission layer to the hole transport region. Materials that may be included in the hole transport region may be included in the emission auxiliary layer and the electron blocking layer.

[P-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the p-dopant may have a lowest unoccupied molecular orbital (LUMO) energy level of less than or equal to about −3.5 eV.

In an embodiment, the p-dopant may include a quinone derivative, a cyano group-containing compound, a compound containing element EL1 and element EL2, or any combination thereof.

Examples of a quinone derivative may include TCNQ, F4-TCNQ, and the like.

Examples of a cyano group-containing compound may include HAT-CN, a compound represented by Formula 221, and the like:

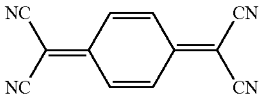

TCNQ

-continued

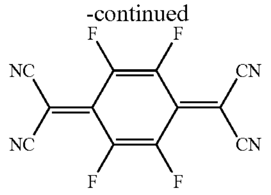

F4-TCNQ

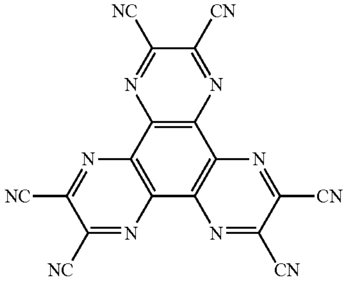

HAT-CN

[Formula 221]

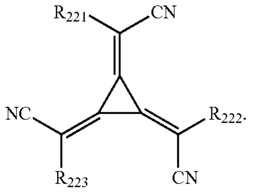

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of a metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of a metalloid may include silicon (Si), antimony (Sb), tellurium (Te), and the like.

Examples of a non-metal may include oxygen (O), halogen (for example, F, Cl, Br, I, etc.), and the like.

Examples of the compound containing element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of a metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), a rhenium oxide (for example, $ReO_3$, etc.), and the like.

Examples of a metal halide may include an alkali metal halide, an alkaline earth metal halide, a transition metal halide, a post-transition metal halide, a lanthanide metal halide, and the like.

Examples of an alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of an alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of a transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.),a gold halide (for example, AuF, AuCl, AuBr, AuI, etc.), and the like.

Examples of a post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of a lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and the like.

Examples of a metalloid halide may include an antimony halide (for example, $SbCl_5$, etc.) and the like.

Examples of a metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers may contact each other or may be separated from each other, to emit white light. In embodiments, the emission layer may include two or more materials of a red light-emitting material, a green light-emitting material, and a blue light-emitting material, in which the two or more materials may be mixed with each other in a single layer, to emit white light.

The emission layer may include a host and a dopant.

The host may include a first-first host and a first-second host, or may include a second-first host and a second-second host, or may include a third-first host and a third-second host.

For example, one of the first-first host and the first-second host may be a hole-transporting host, and the other thereof may be an electron-transporting host, one of the second-first host and the second-second host may be a hole-transporting host, and the other thereof may be an electron-transporting host, or one of the third-first host and the third-second host may be a hole-transporting host, and the other thereof may be an electron-transporting host.

The hole-transporting host may be a compound having strong hole properties. The expression "a compound having strong hole properties" refers to a compound that is ready to accept holes, and such properties may be obtained by including a hole-receiving moiety (also, referred to as an HT moiety).

Such an HT moiety may include, for example, a π-electron-rich heteroaromatic compound (e.g., a carbazole derivative or an indole derivative), or an aromatic amine compound.

The electron-transporting host may be a compound having strong electron properties. The expression "a compound having strong electron properties" refers to a compound that readily accepts electrons, and such properties may be obtained by including an electron-receiving moiety (also, referred to as an ET moiety).

Such an ET moiety may include, for example, a π electron-deficient heteroaromatic compound. For example, the ET moiety may include a nitrogen-containing heteroaromatic compound.

When a compound includes only an HT moiety or only an ET moiety, it is clear whether the nature of the compound has HT properties or ET properties.

A compound may include both a HT moiety and an ET moiety. In this regard, a simple comparison between the total number of the HT moieties and the total number of the ET moieties in the compound can be a criterion for predicting whether the compound may be an HT compound or an ET compound, but cannot be an absolute criterion. One of the reasons why such a simple comparison cannot be an absolute criterion is that one HT moiety and one ET moiety do not respectively have exactly the same ability to attract holes and electrons.

Therefore, in order to determine whether a compound of a certain structure is an HT compound or an ET compound, a simulation may be performed in advance for prediction, and finally, direct implementation may be made in a device including the compound to confirm the properties of the compound relatively reliably.

An amount of the dopant in the emission layer may be in a range of about 0.01 parts by weight to about 15 parts by weight based on 100 parts by weight of the host.

A thickness of the emission layer may be in a range of about 100 Å to about 1,000 Å. For example, the thickness of the emission layer may be in a range of about 200 Å to about 600 Å. When the thickness of the emission layer is within these ranges, excellent luminescence characteristics may be obtained without a substantial increase in driving voltage.

[Host]

The first-first host, the first-second host, the second-first host, the second-second host, the third-first host, and the third-second host may each independently include a compound represented by Formula 301:

[Formula 301]

$$[Ar_{301}]_{xb11}—[(L_{301})_{xb1}—R_{301}]_{xb21}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be the same as described in connection with $Q_1$.

For example, in Formula 301, when xb11 is 2 or more, two or more of $Ar_{301}$ may be linked to each other via a single bond.

In embodiments, the first-first host, the first-second host, the second-first host, the second-second host, the third-first host, and the third-second host may each independently include a compound represented by Formula 301-1, a compound represented by Formula 301-2, a compound represented by Formula 301-3, or any combination thereof:

[Formula 301-1]

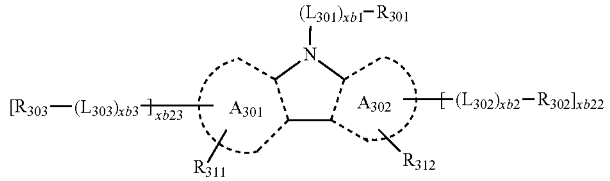

[Formula 301-2]

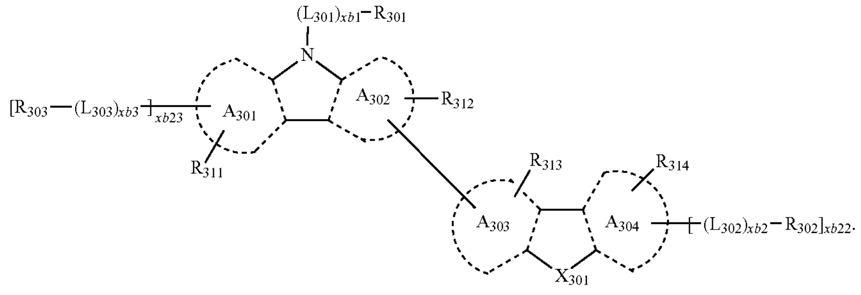

In Formulae 301-1 and 301-2, ring $A_{301}$ to ring $A_{304}$ may each independently be a Cs-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

[Formula 301-3]

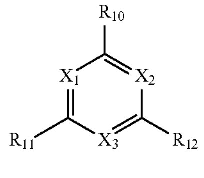

In Formula 301-3, $X_1$ to $X_3$ may each independently be CH or N, and at least one of $X_1$ to $X_3$ is N, $R_{10}$ to $R_{12}$ may each independently be Formula 1-1, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each of which is unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{32}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each of which is unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In embodiments, the host may include an alkali earth metal complex, a post-transition metal complex, or any combination thereof. For example, the host may include a Be complex (for example, Compound H55), an Mg complex, a Zn complex, or any combination thereof.

In embodiments, the first-first host, the first-second host, the second-first host, the second-second host, the third-first host, and the third-second host may each independently include one of Compounds H1 to H132, 9,10-di(2-naphthyl) anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

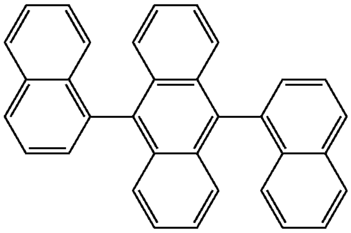

H2

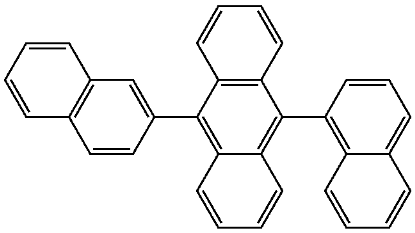

H3

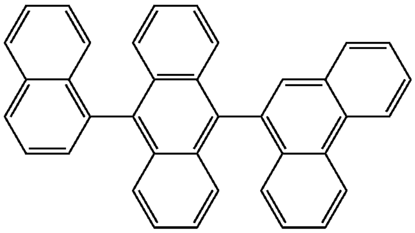

-continued

H4

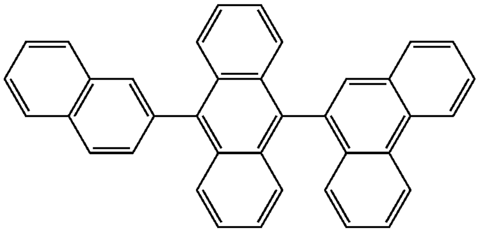

H5

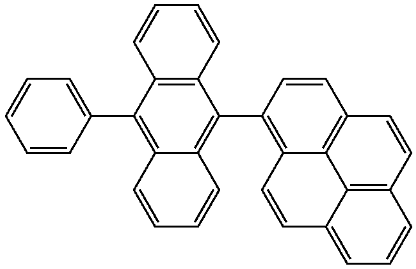

H6

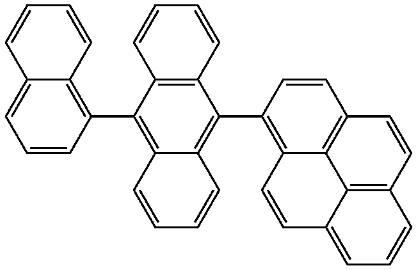

H7

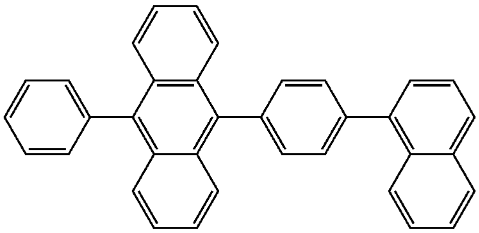

H8

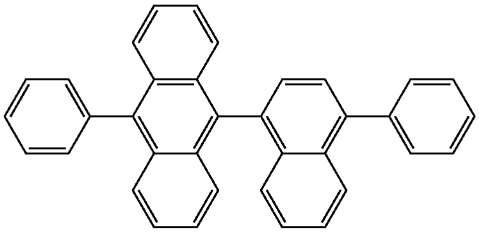

H9

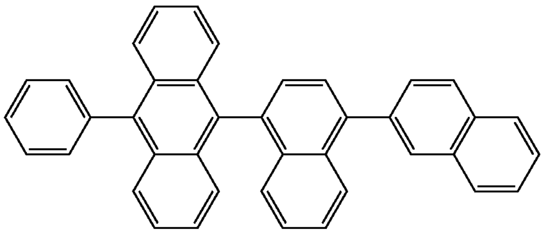

-continued
H10
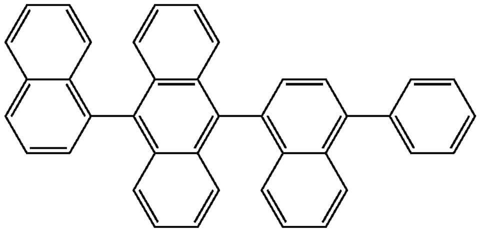
H11
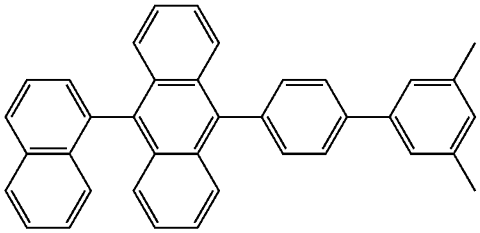
H12
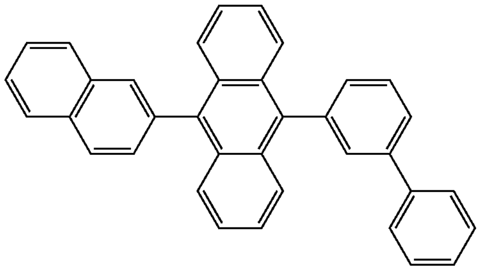
H13
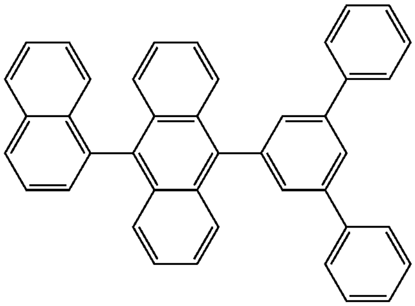
H14
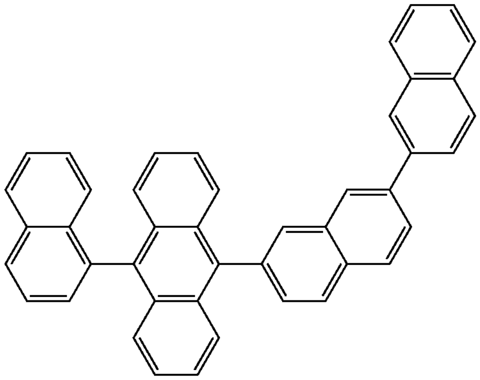
-continued
H15
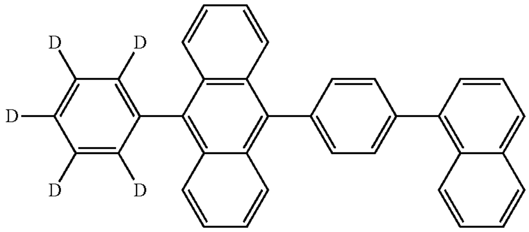
H16
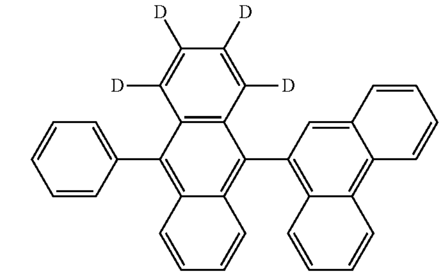
H17
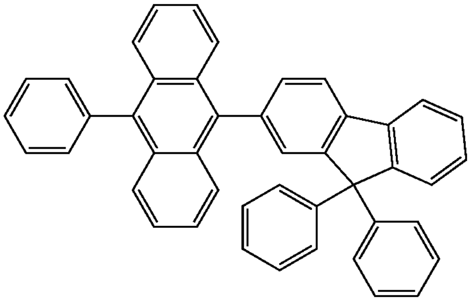
H18
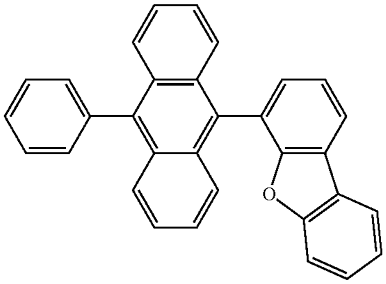
H19
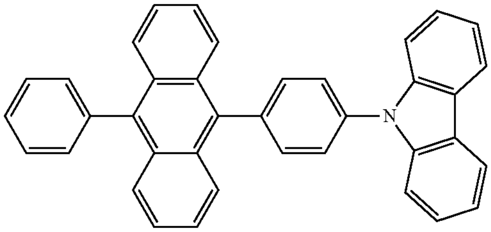

-continued
H20
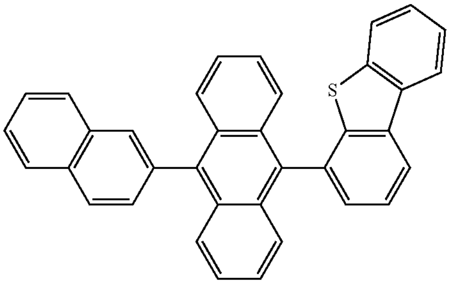
H21
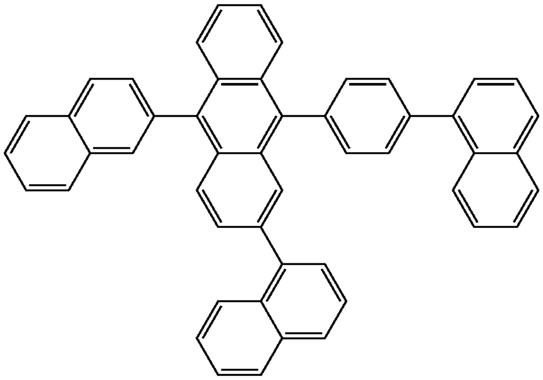
H22
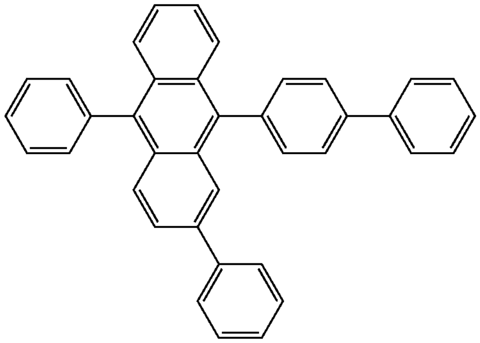
H23
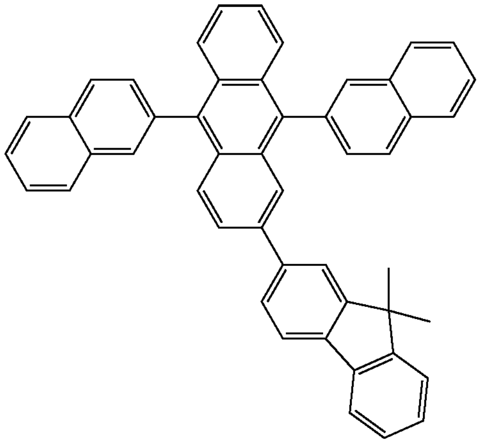
-continued
H24
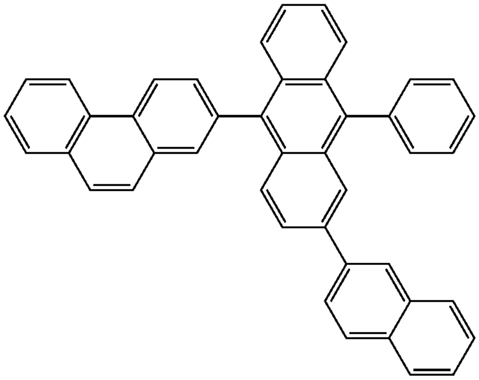
H25
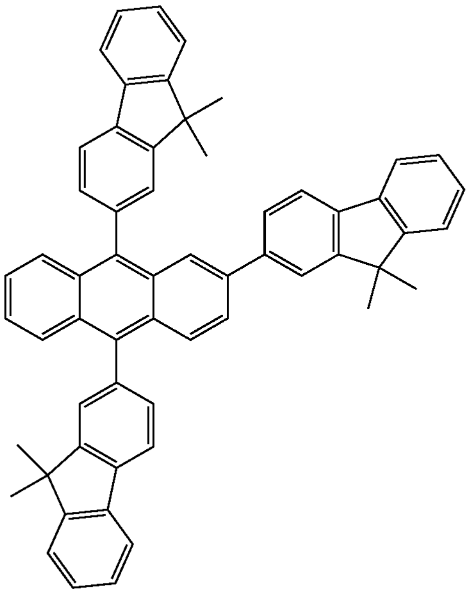
H26
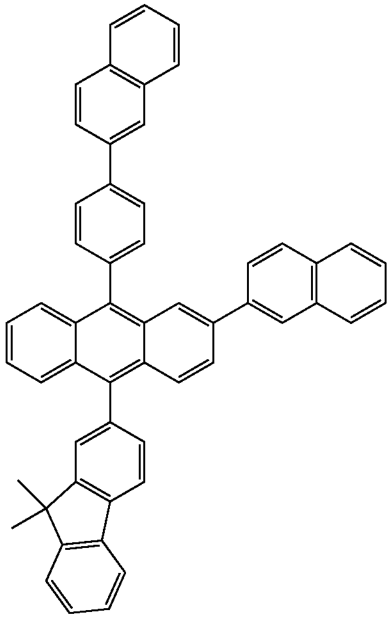

-continued
H27
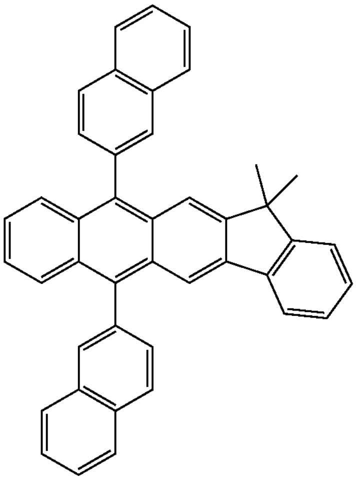
H28
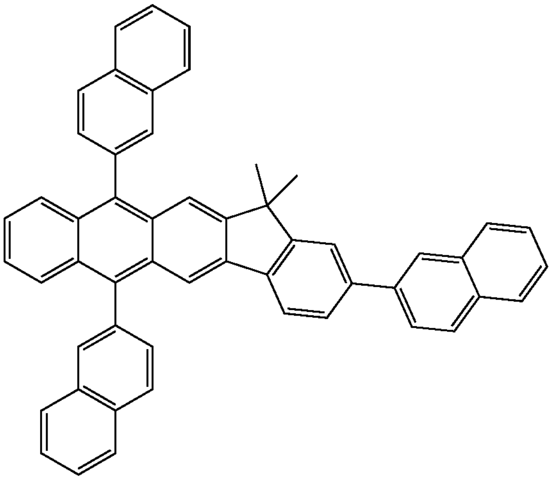
H29
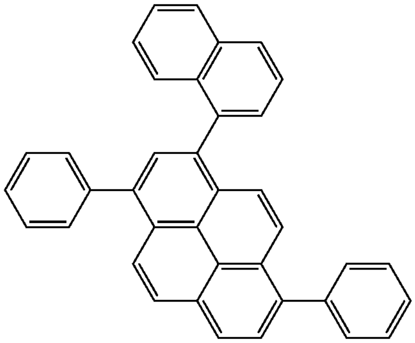
-continued
H30
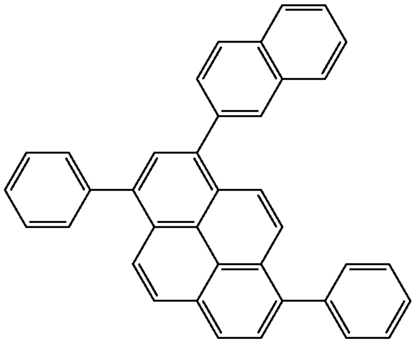
H31
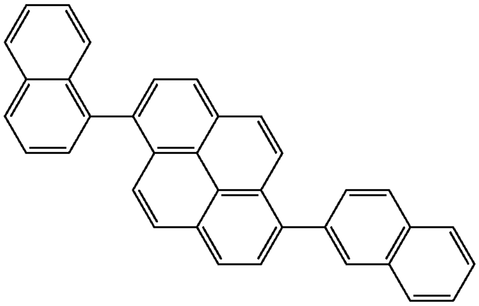
H32
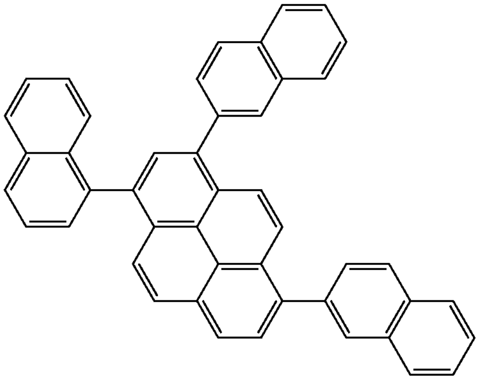
H33
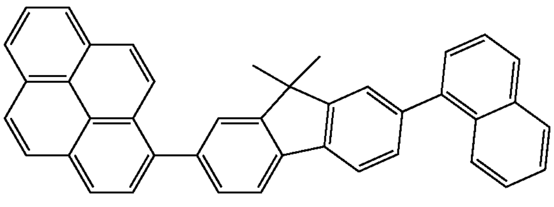
H34
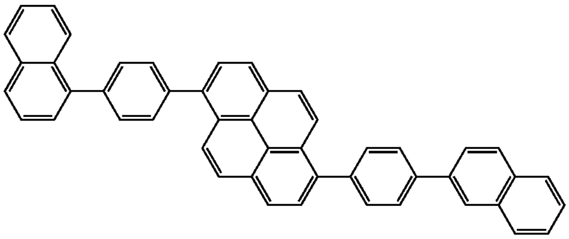

-continued
H35
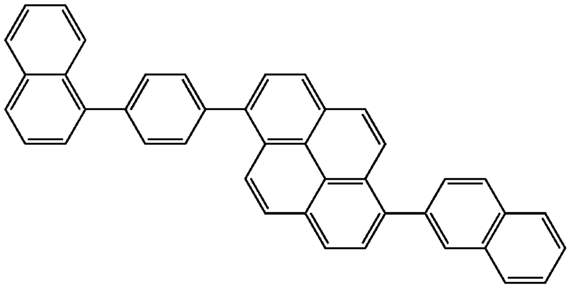
H36
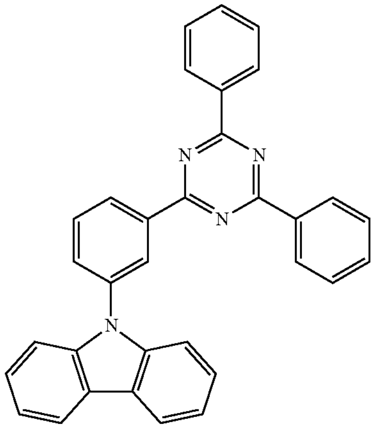
H37
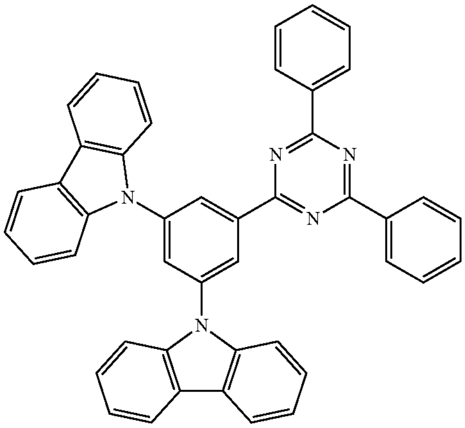
H38
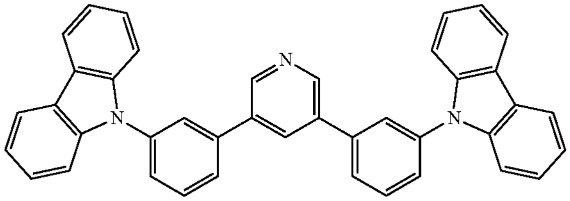
-continued
H39
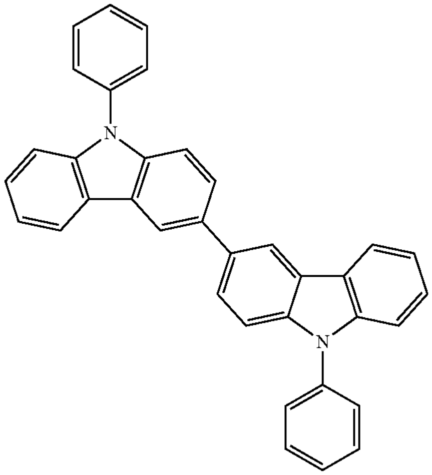
H40
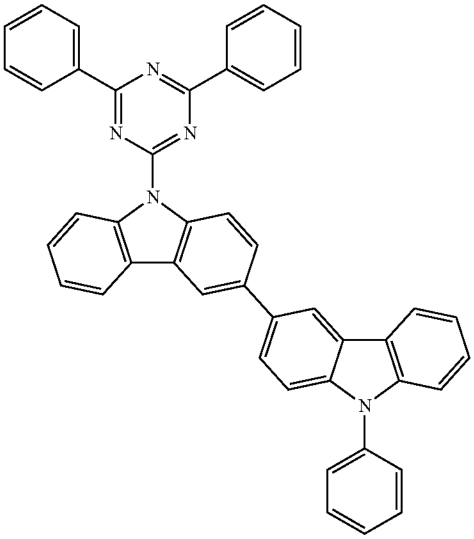
H41
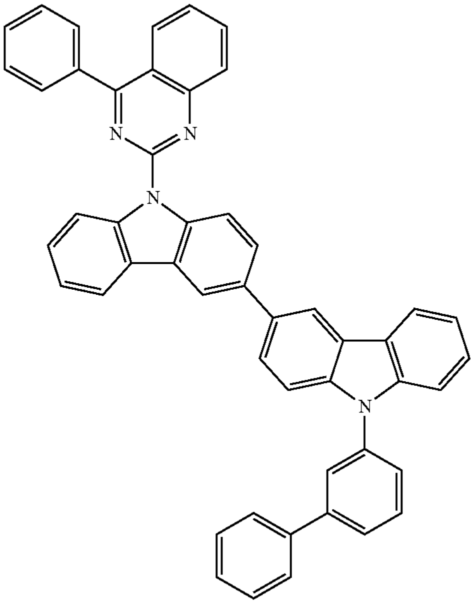

-continued
H42
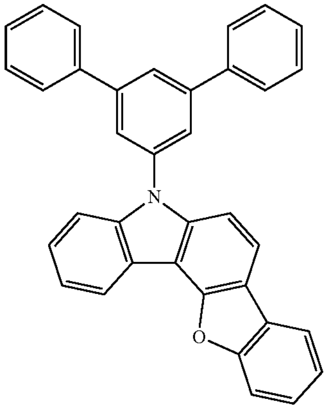
H43
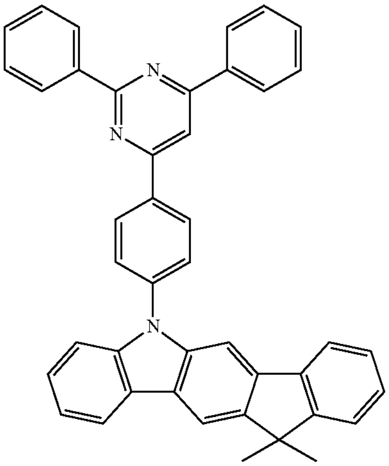
H44
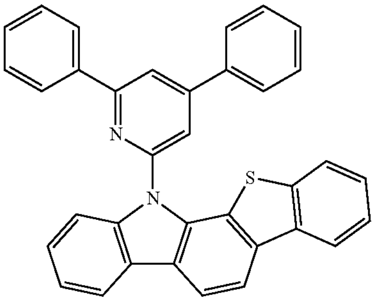
H45
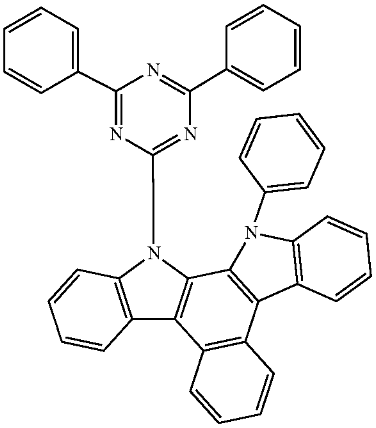
-continued
H46
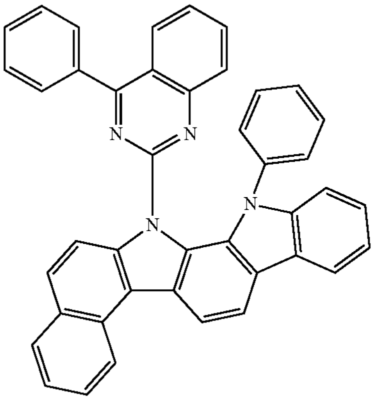
H47
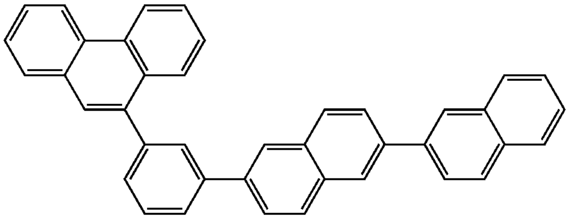
H48
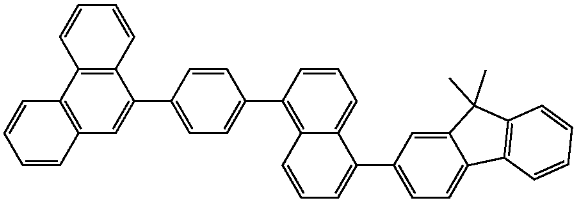
H49
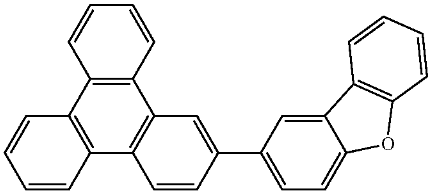
H50
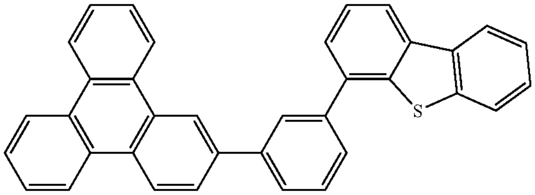
H51
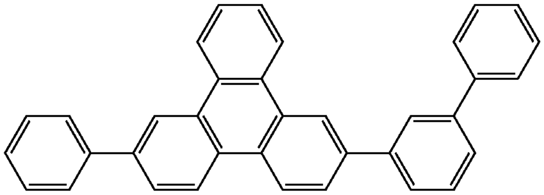

-continued
H52
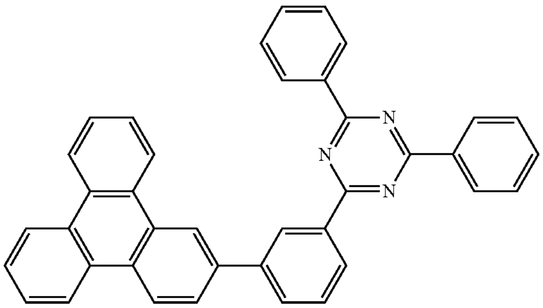
H53
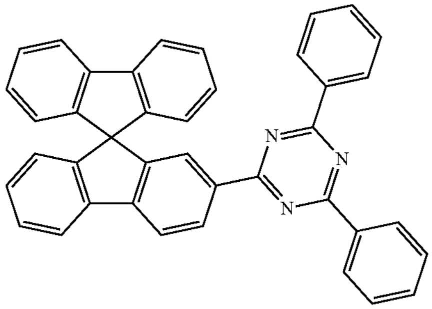
H54
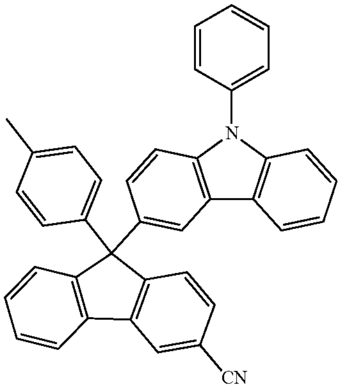
H55
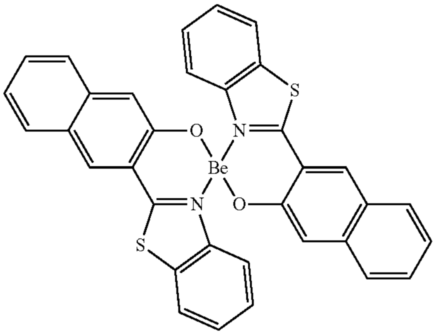
-continued
H56
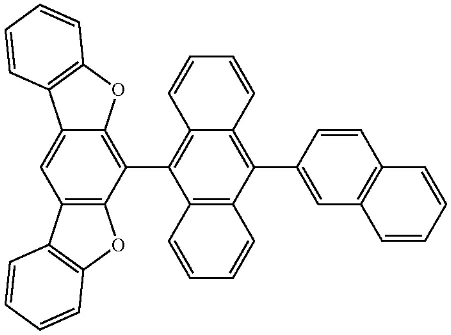
H57
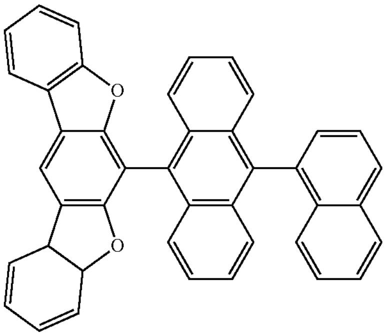
H58
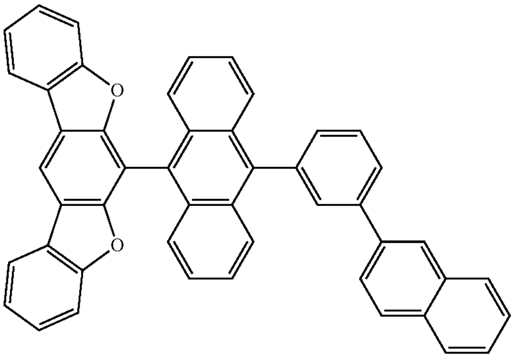
H59
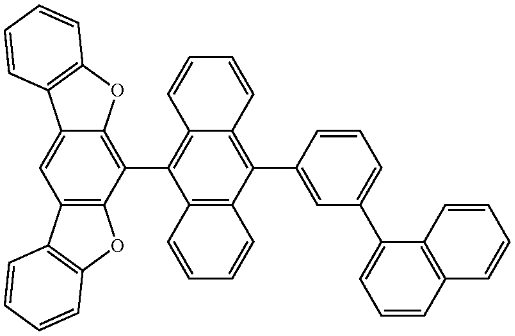

-continued
H60
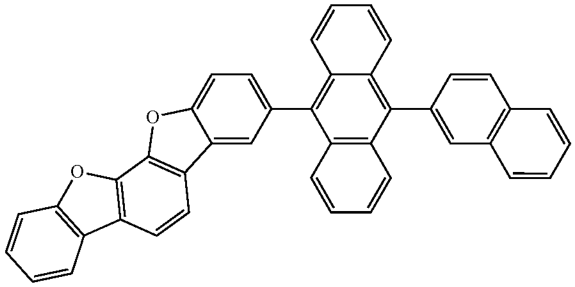
H61
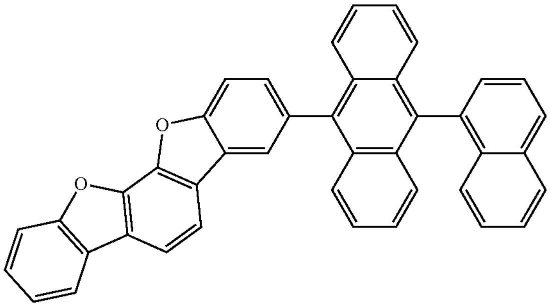
H62
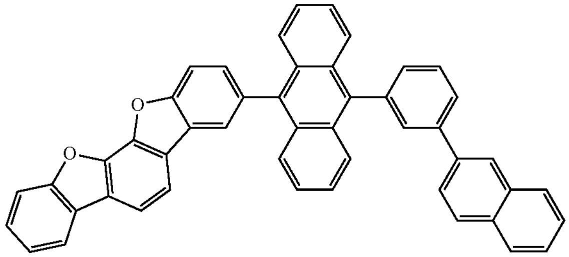
H63
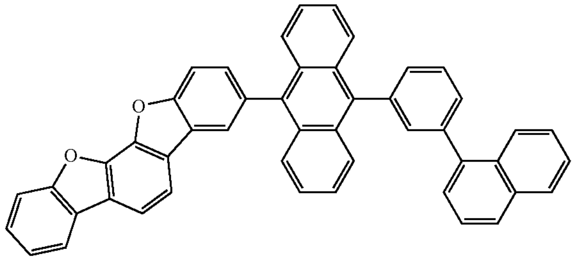
H64
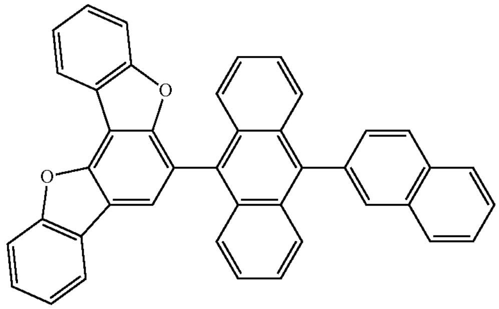
-continued
H65
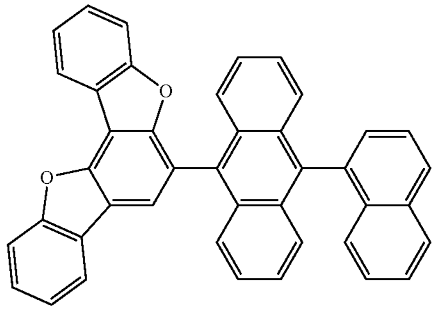
H66
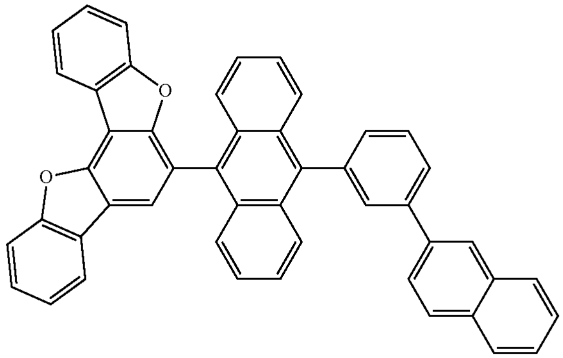
H67
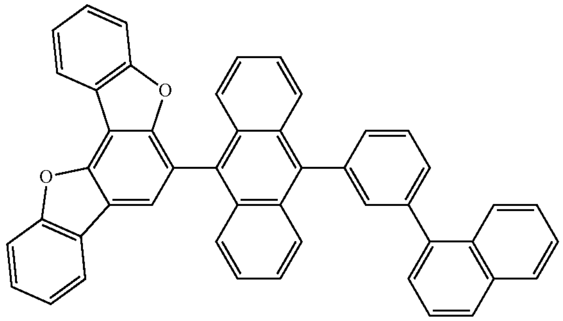
H68
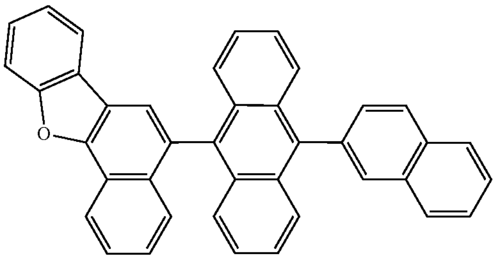
H69
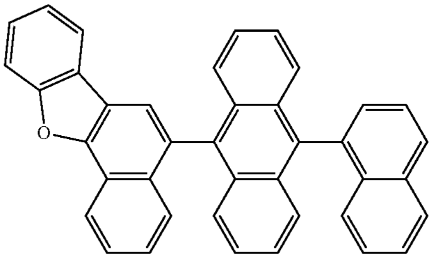

-continued
H70
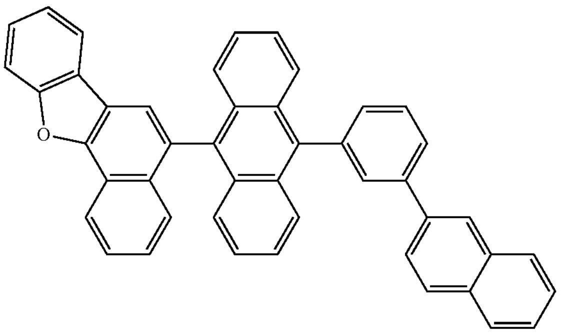
H71
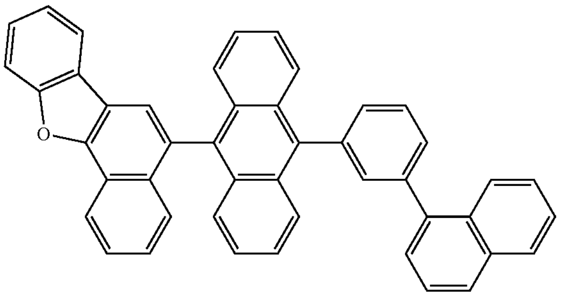
H72
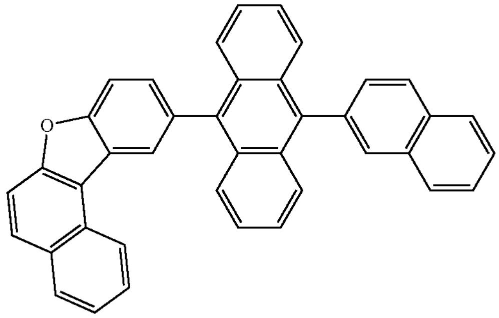
H73
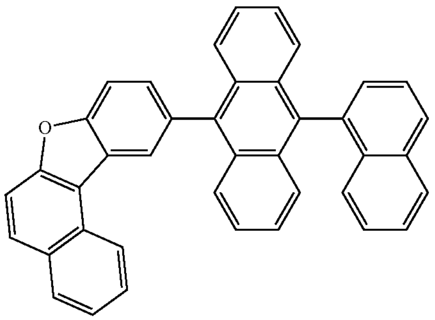
-continued
H74
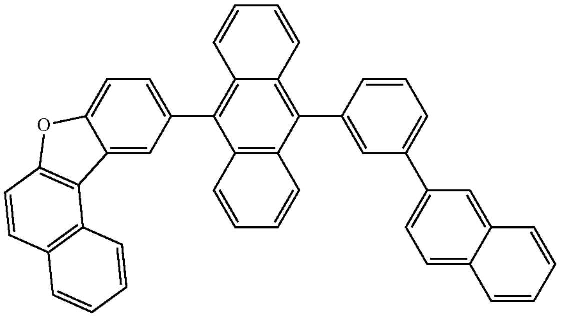
H75
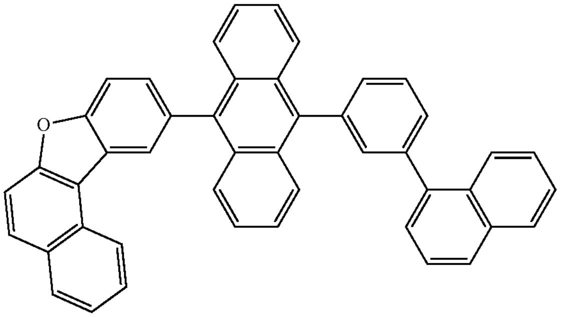
H76
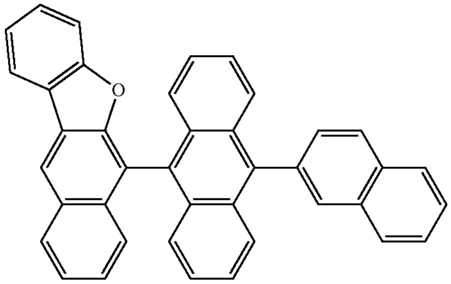
H77
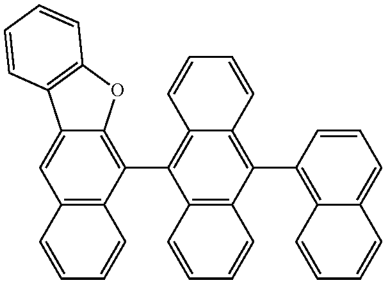
H78
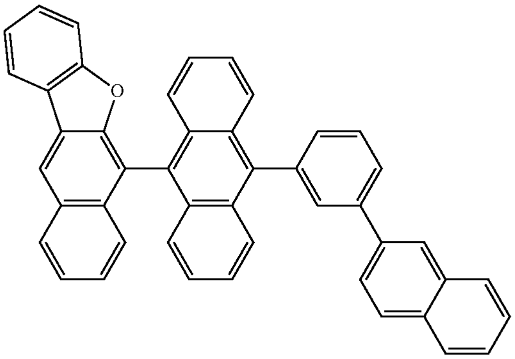

-continued
H79
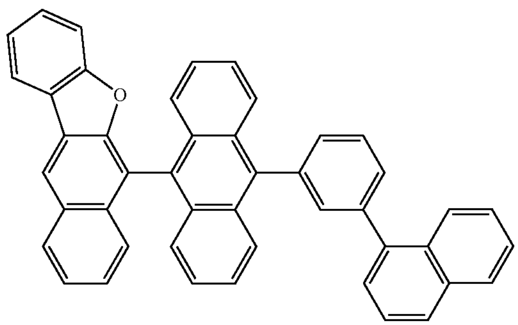
H80
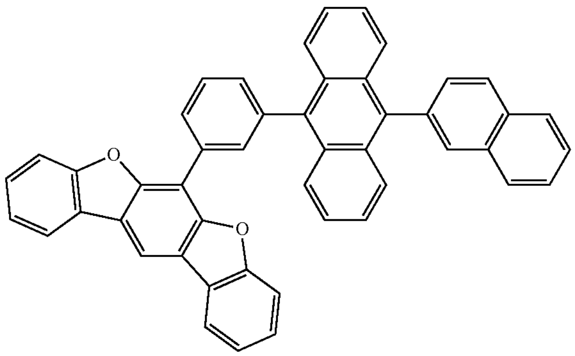
H81
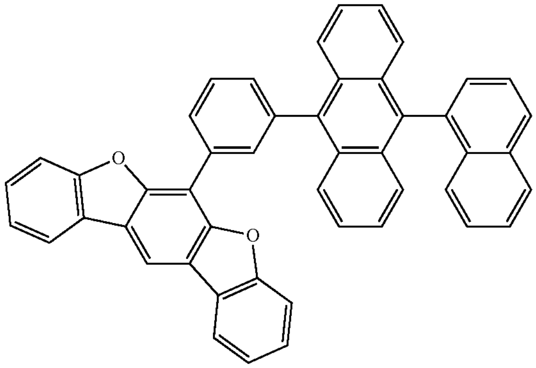
H82
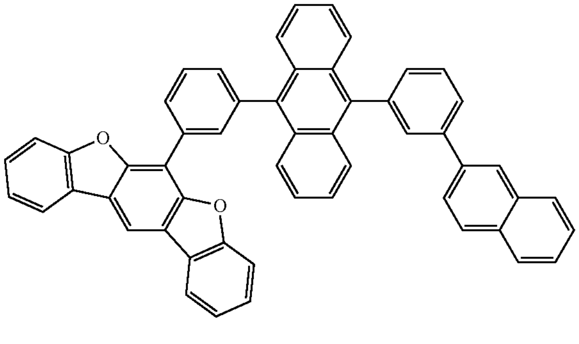
-continued
H83
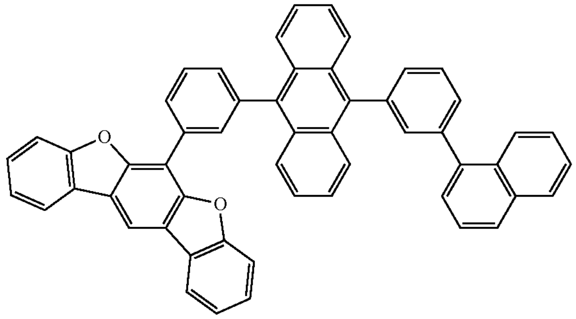
H84
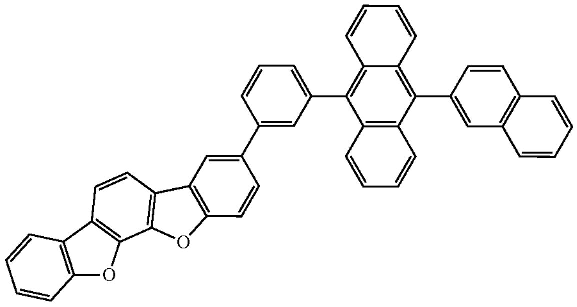
H85
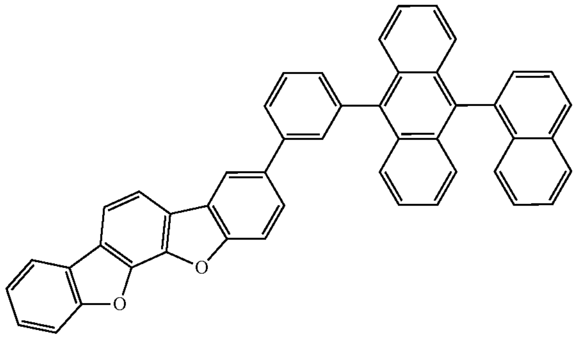
H86
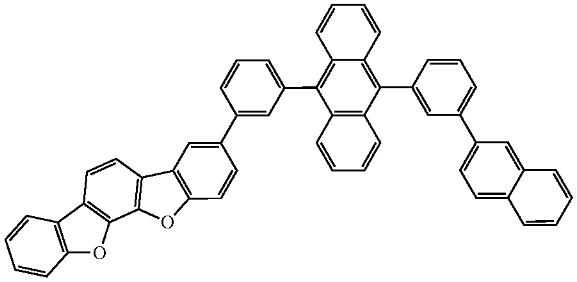
H87
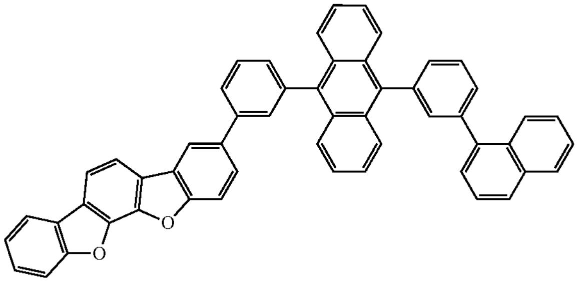

-continued
H88
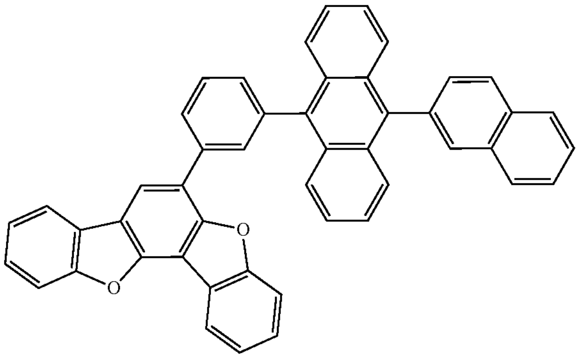
H89
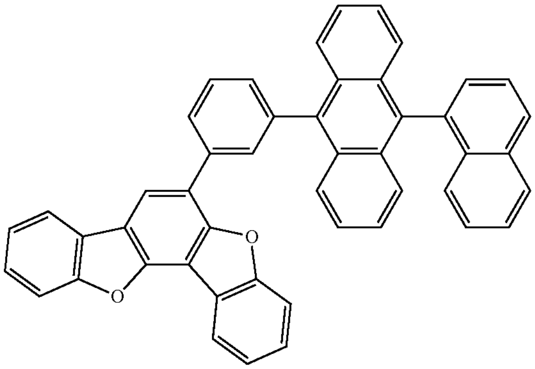
H90
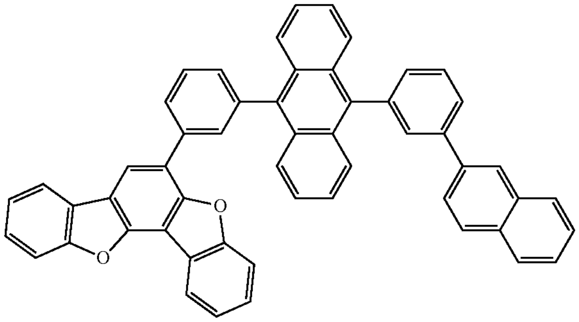
H91
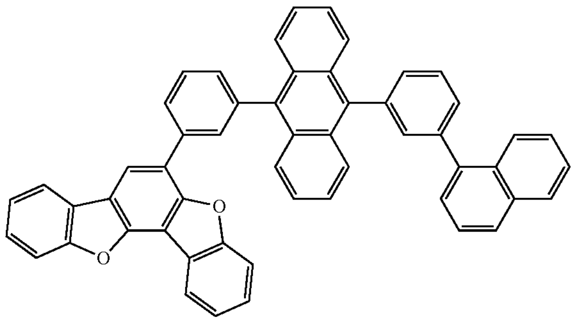
-continued
H92
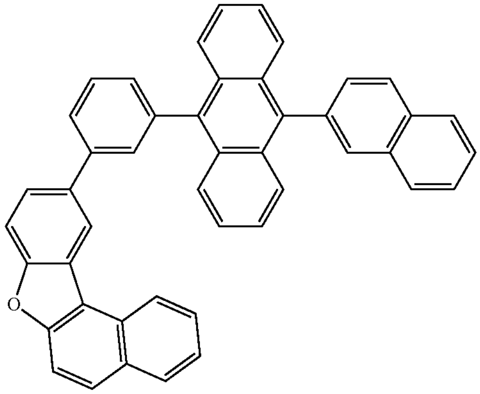
H93
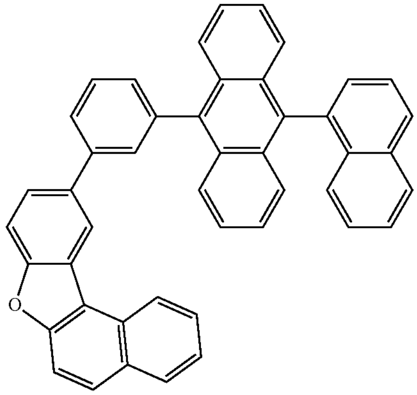
H94
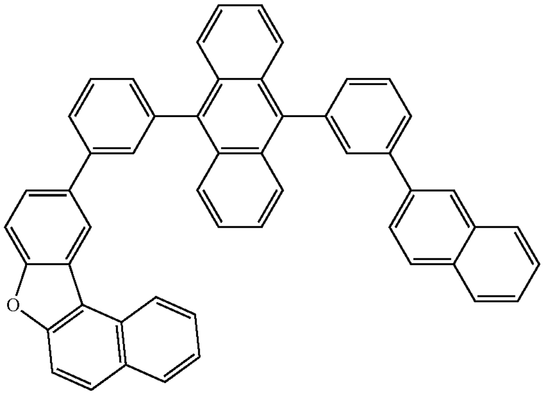
H95
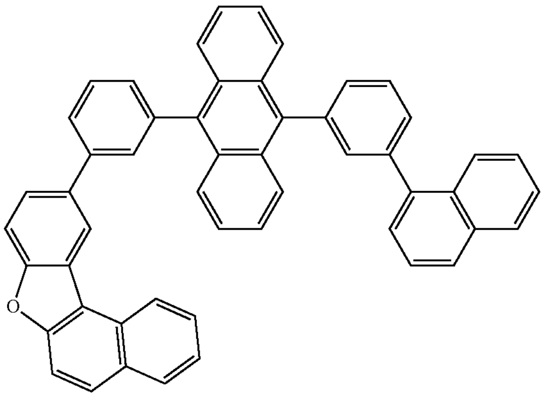

-continued
H96
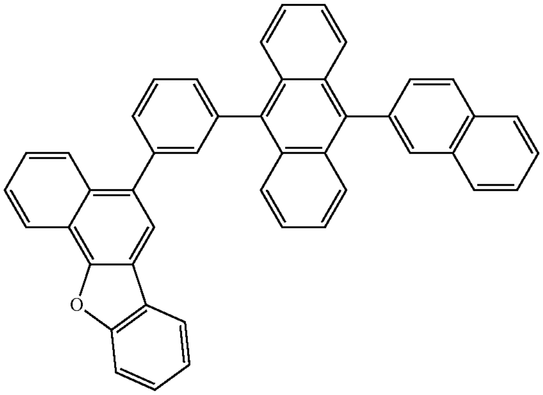
H97
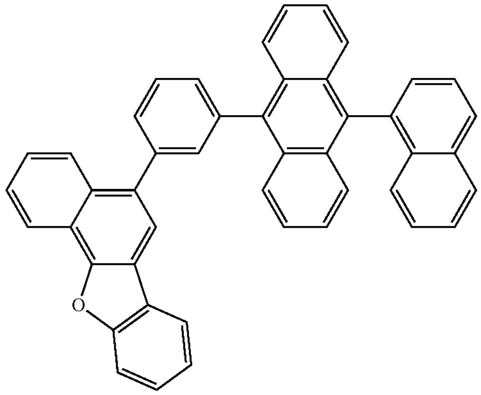
H98
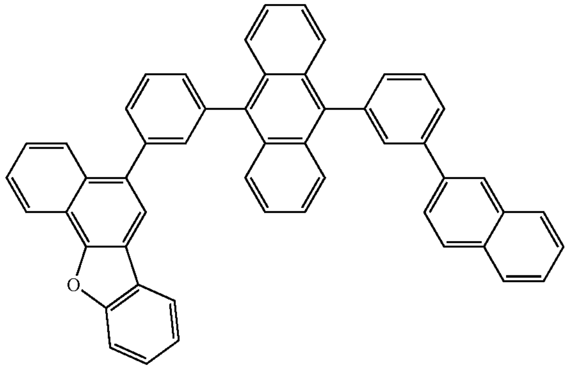
H99
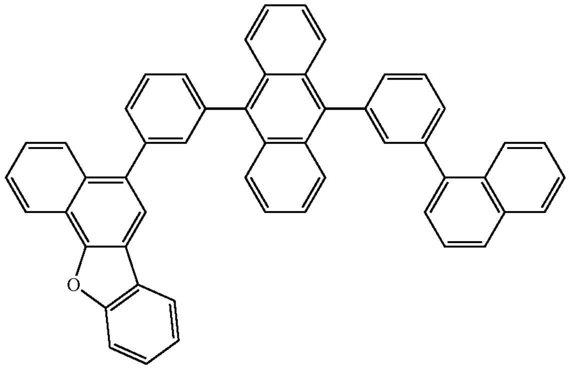
-continued
H100
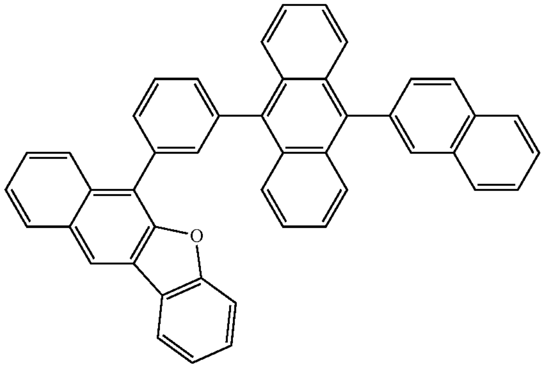
H101
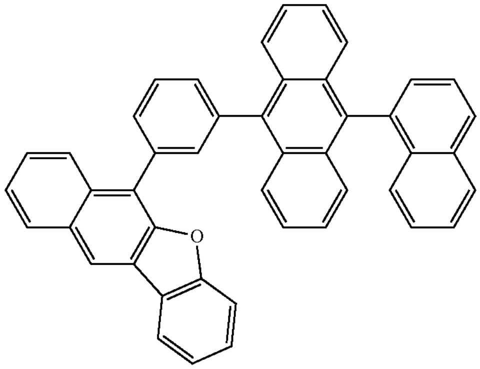
H102
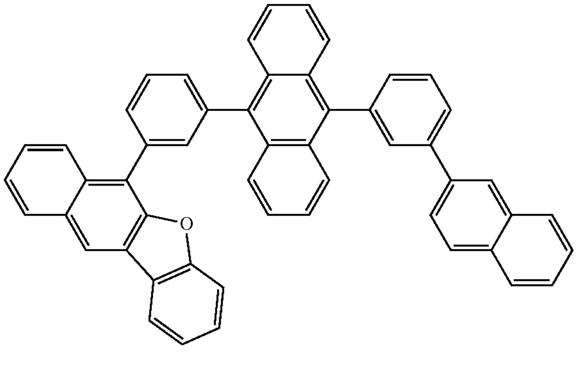
H103
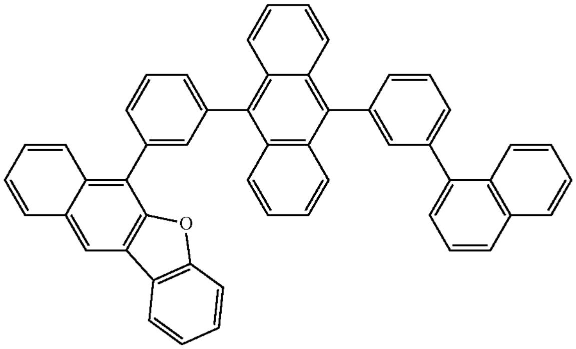

-continued
H104
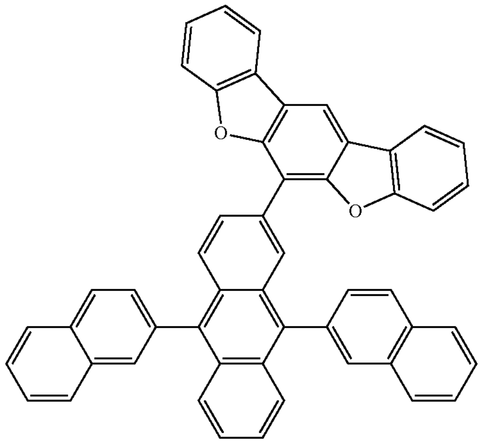
H105
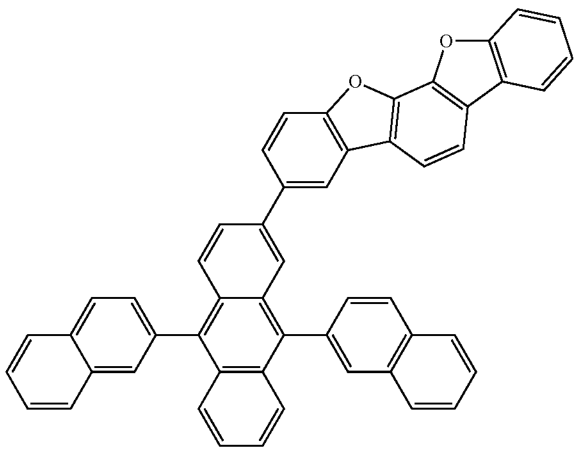
H106
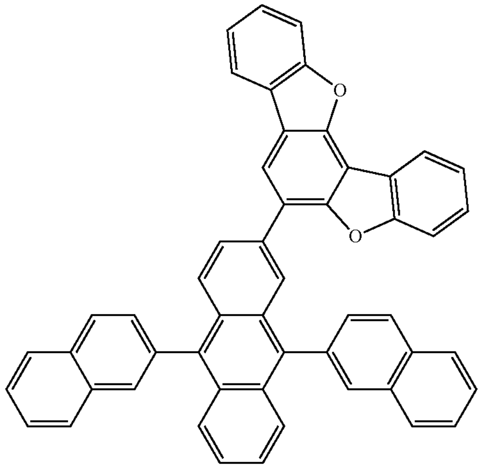
-continued
H107
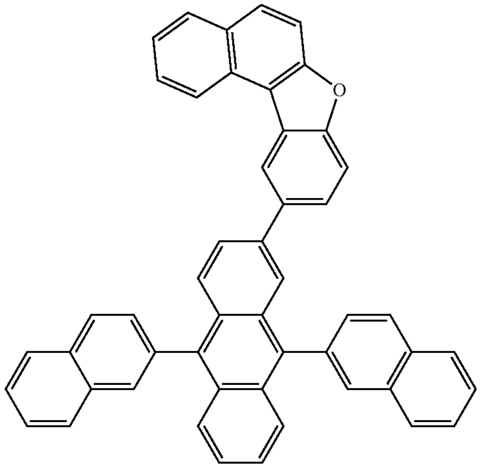
H108
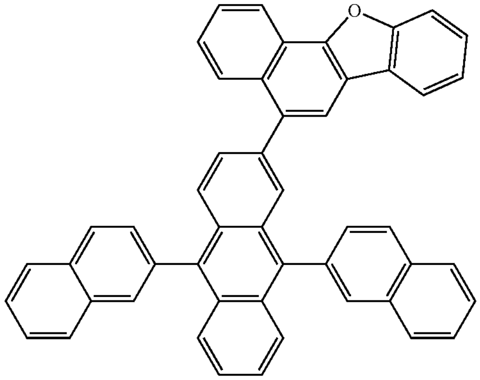
H109
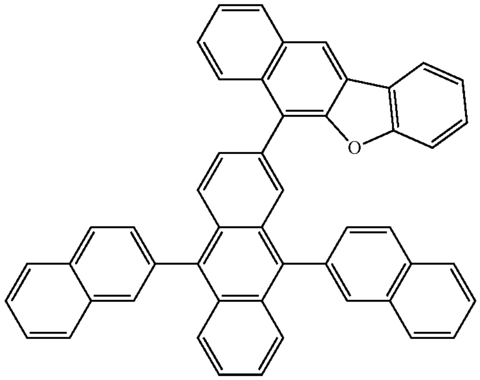
H110
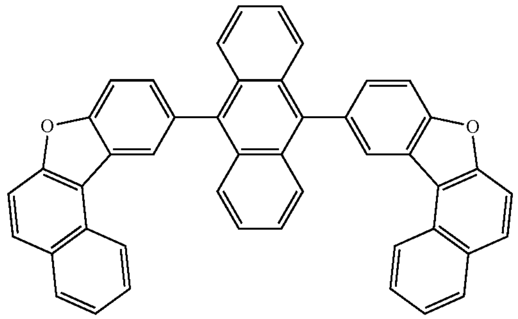

-continued
H111
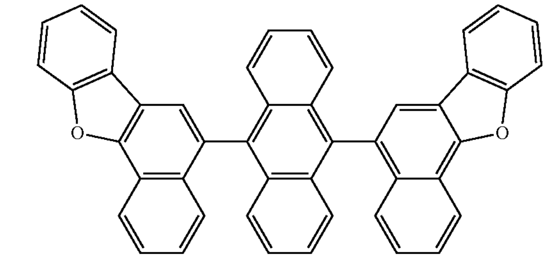
H112
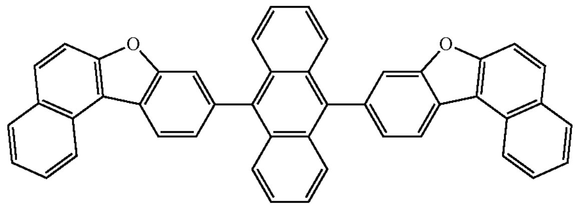
H113
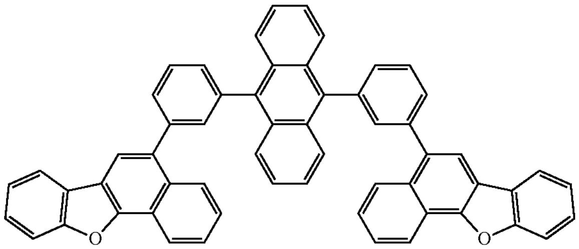
H114
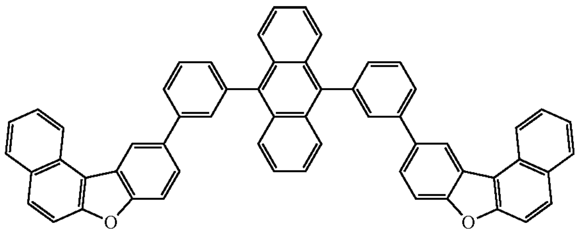
H115
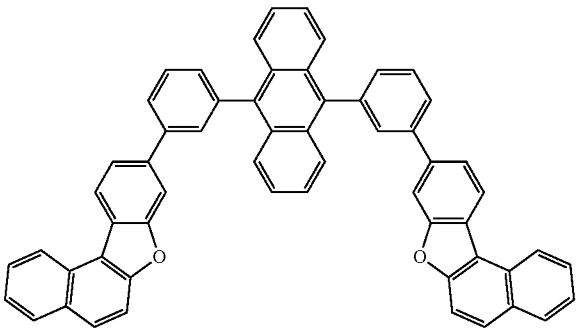
-continued
H116
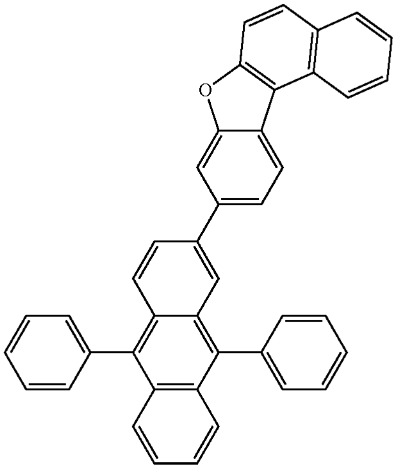
H117
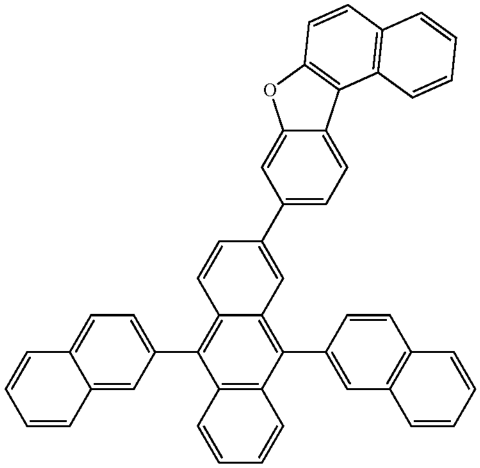
H118
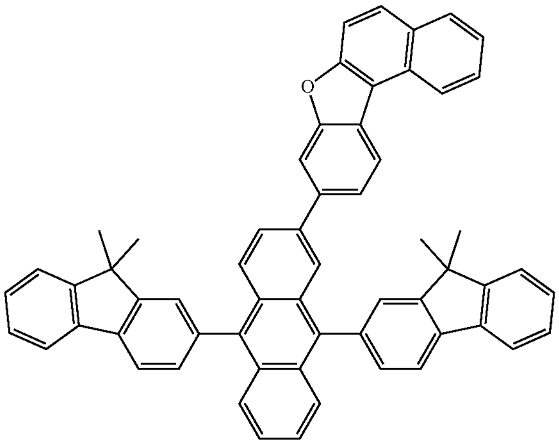

-continued
H119
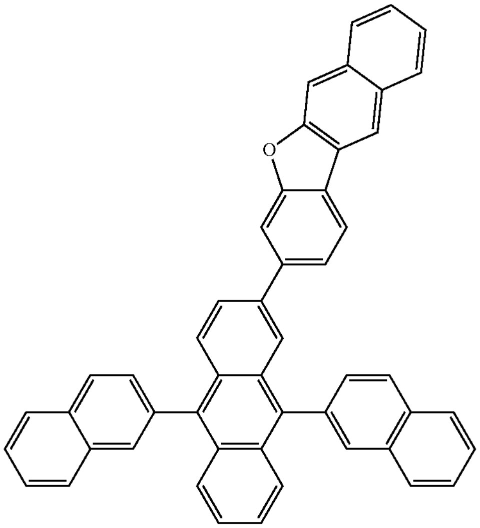
H120
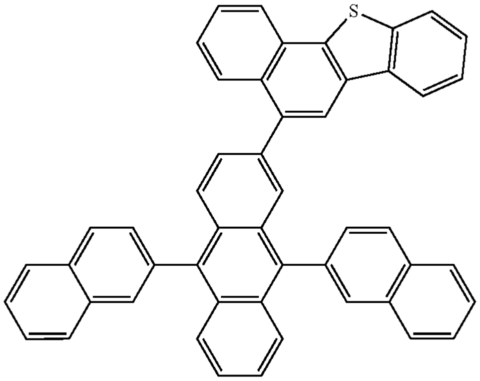
H121
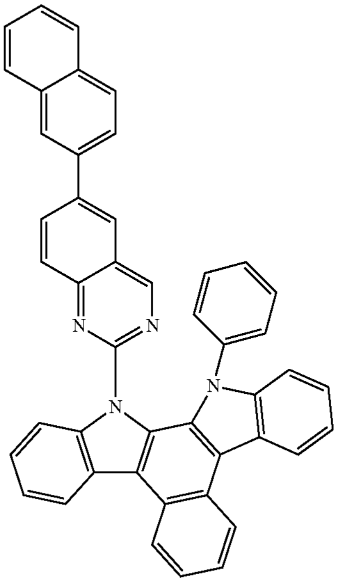
-continued
H122
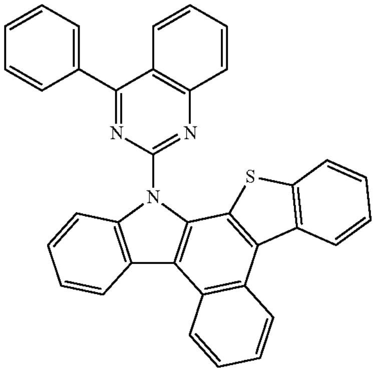
H123
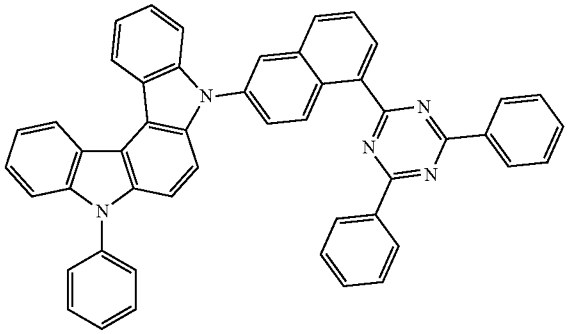
H124
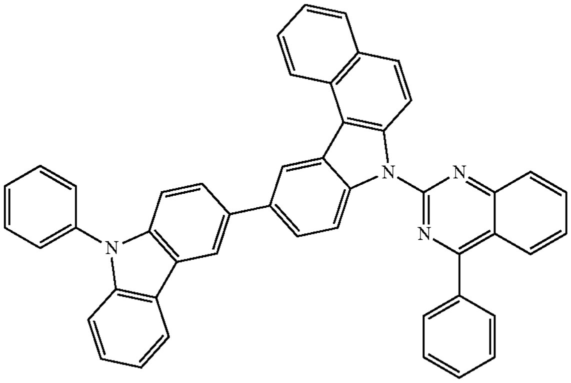
H125
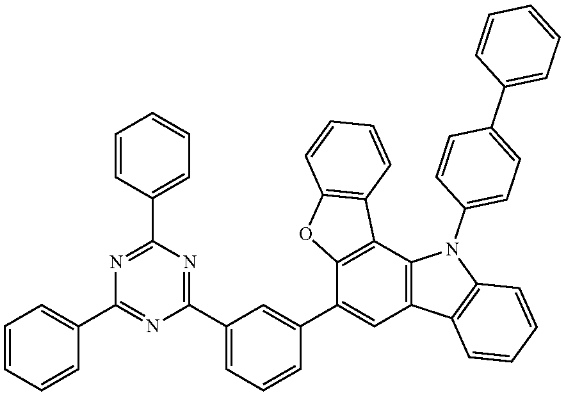

-continued

H126

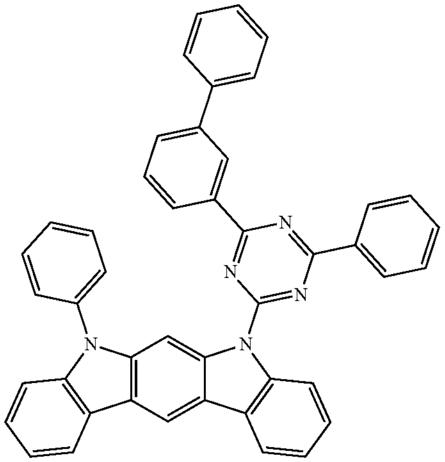

H127

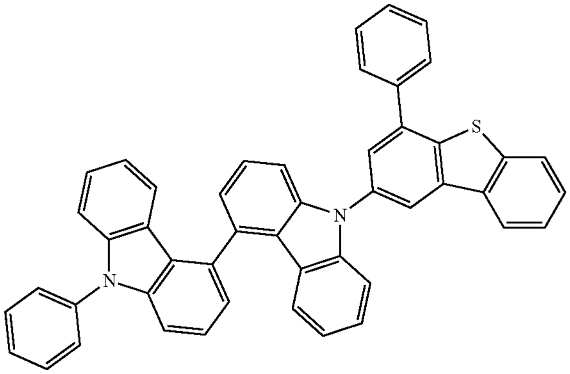

H128

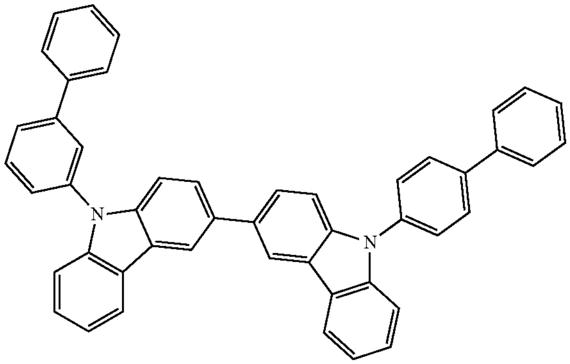

H129

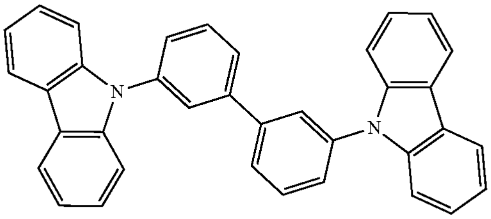

-continued

H130

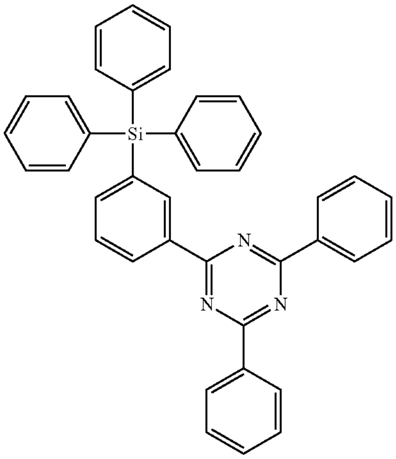

H131

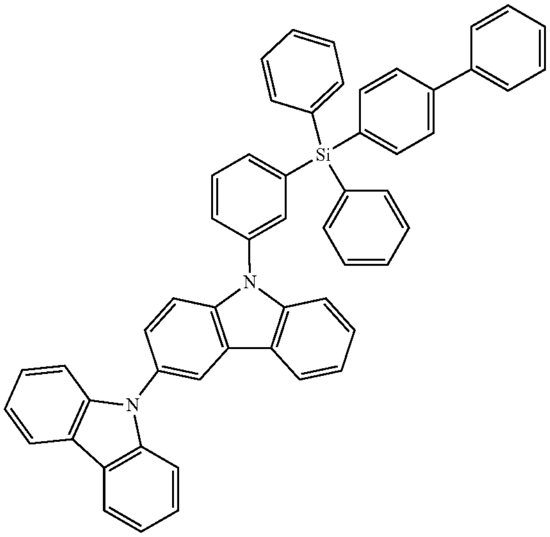

H132

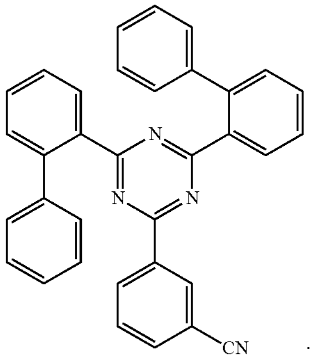

.

When the emission layer includes a first-first host and a first-second host, the first-first host and the first-second host may be included in a weight ratio of about 1:9 to about 9:1. For example, the weight ratio of the first-first host to the first-second host may be in a range of about 4:5 to about 5:5.

When the emission layer includes a second-first host and a second-second host, the second-first host and the second-second host may be included in a weight ratio of about 1:9 to about 9:1. For example, the weight ratio of the second-first host to the second-second host may be in a range of about 4:5 to about 5:5.

When the emission layer includes a third-first host and a third-second host, the third-first host and the third-second host may be included in a weight ratio of about 1:9 to about 9:1. For example, the weight ratio of the third-first host to the third-second host may be in a range of about 4:5 to about 5:5.

[Phosphorescent Dopant]

The phosphorescent dopant may include at least one transition metal as a core metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

[Formula 401]

$$M(L_{401})_{xc1}(L_{402})_{xc2}$$

[Formula 402]

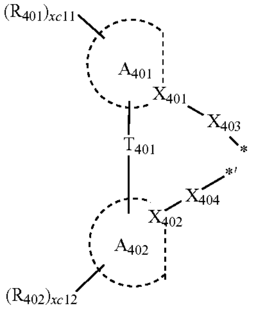

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or more, two or more of $L_{401}$ may be identical to or different from each other, $L_{402}$ may be an organic ligand, and xc2 may be 0, 1, 2, 3, or 4, and when xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described herein in connection with $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon, or both $X_{401}$ and $X_{402}$ may be nitrogen.

In embodiments, when xc1 in Formula 401 is 2 or more, two rings $A_{401}$ in two or more of $L_{401}$ may optionally be linked to each other via $T_{402}$, which may be a linking group, and two rings $A_{402}$ in two or more of $L_{401}$ may optionally be linked to each other via $T_{403}$, which may be a linking group (see Compounds PD1 to PD4 and PD7). $T_{402}$ and $T_{403}$ may each independently be the same as described herein with regard to $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

The phosphorescent dopant may include, for example, one of Compounds PD1 to PD39, or any combination thereof:

PD1

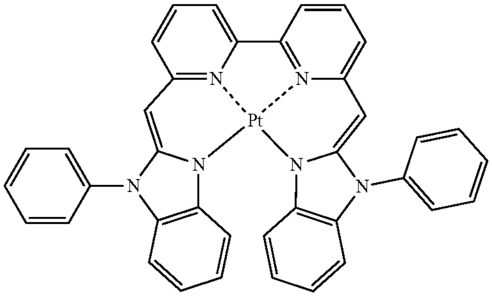

PD2

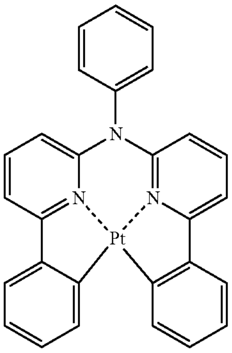

-continued
PD3
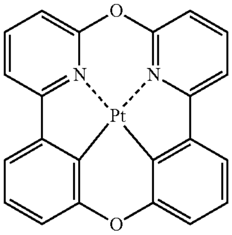
PD4
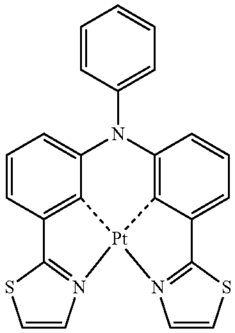
PD5
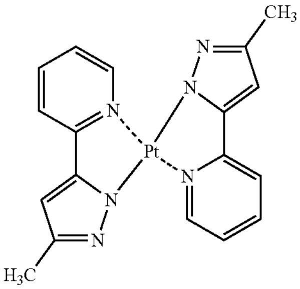
PD6
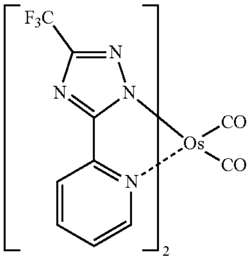
PD7
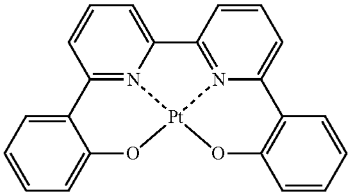
PD8
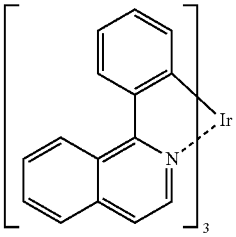
-continued
PD9
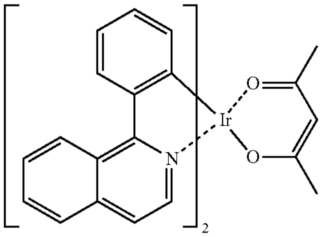
PD10
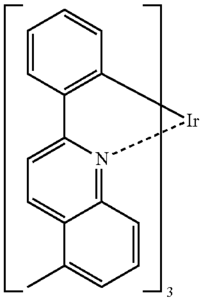
PD11
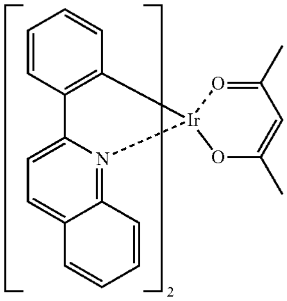
PD12
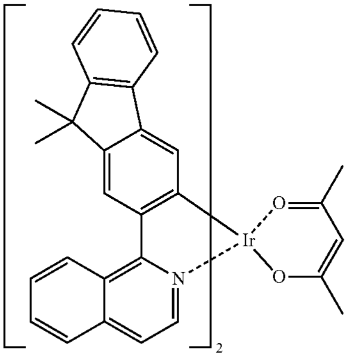
PD13
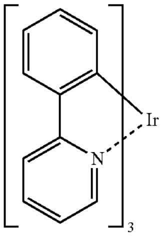

-continued
PD14
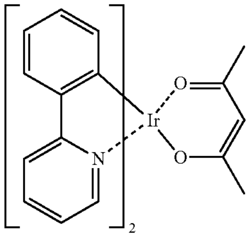
PD15
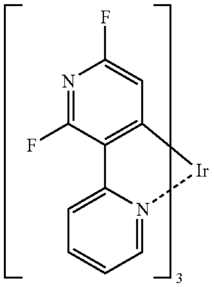
PD16
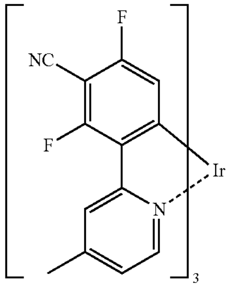
PD17
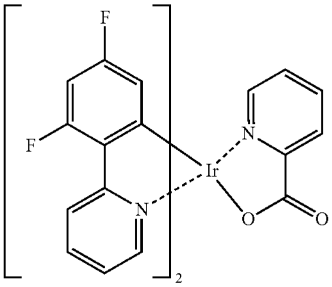
PD18
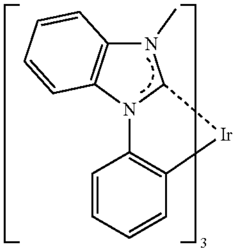
-continued
PD19
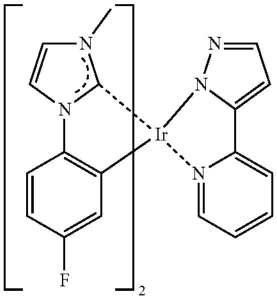
PD20
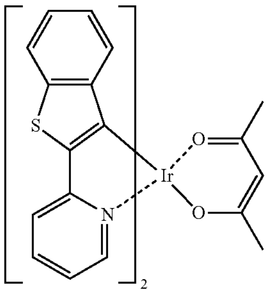
PD21
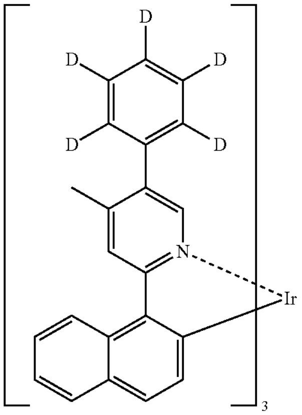
PD22
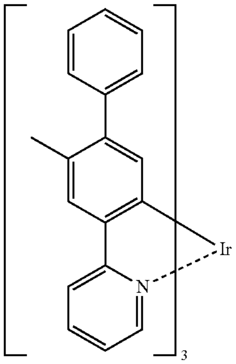

-continued
PD23
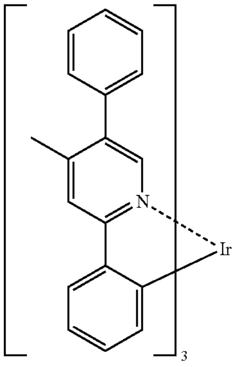
PD24
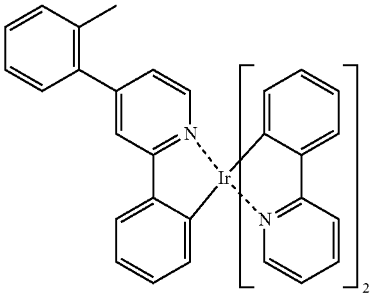
PD25
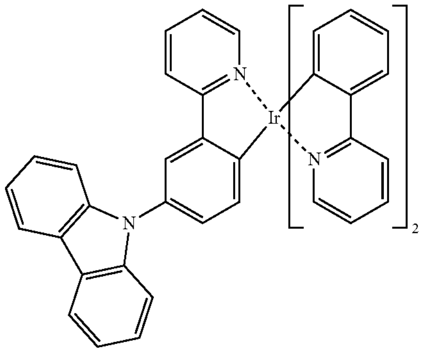
PD26
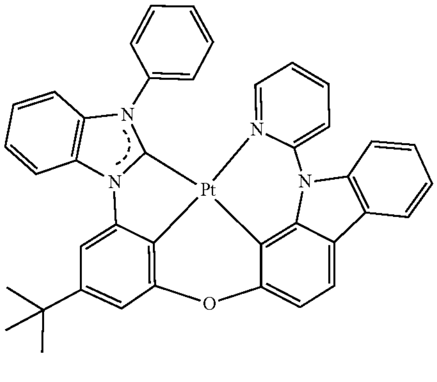
-continued
PD27
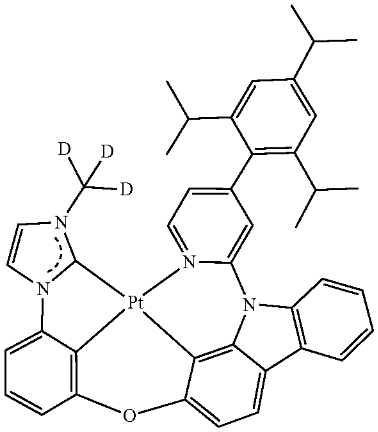
PD28
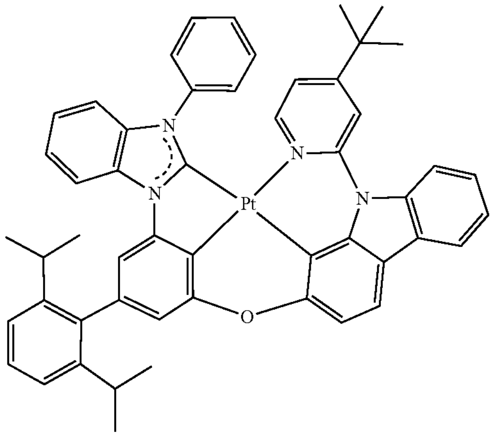
PD29
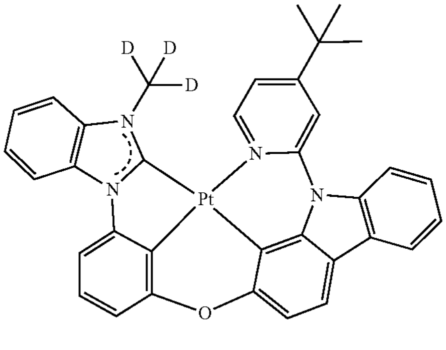
PD30
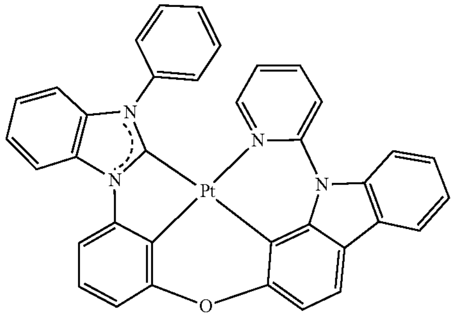

-continued
PD31
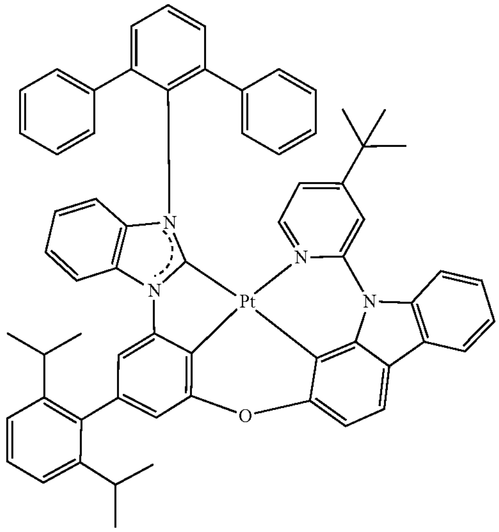
PD32
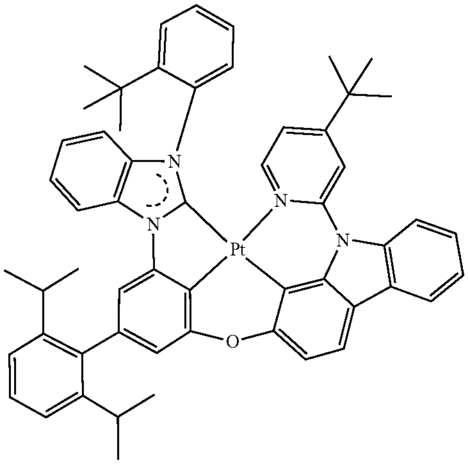
PD33
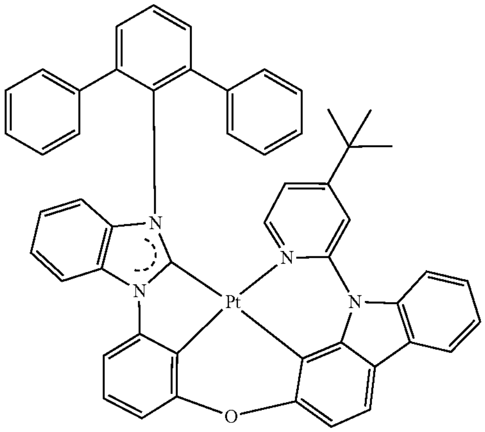
-continued
PD34
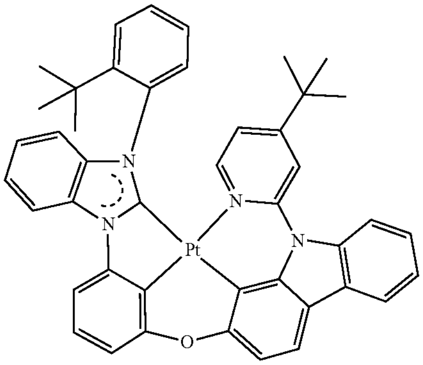
PD35
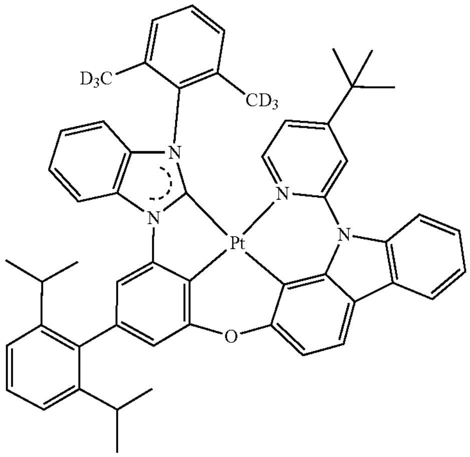
PD36
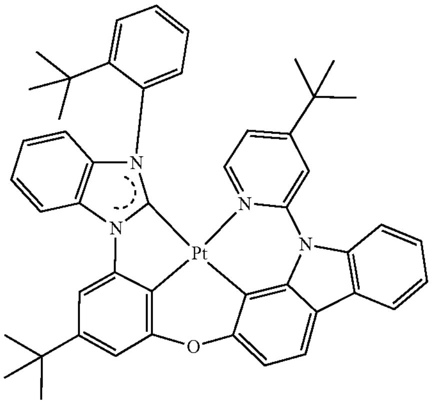

-continued

PD37

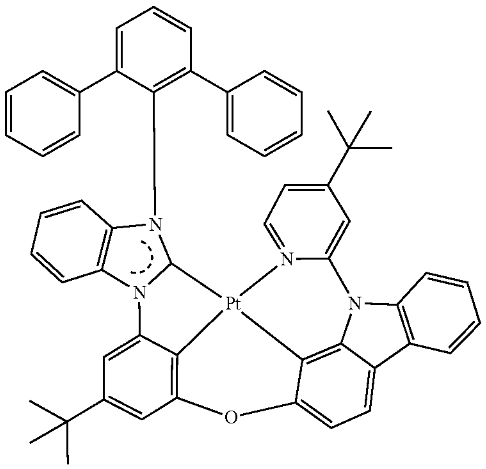

PD38

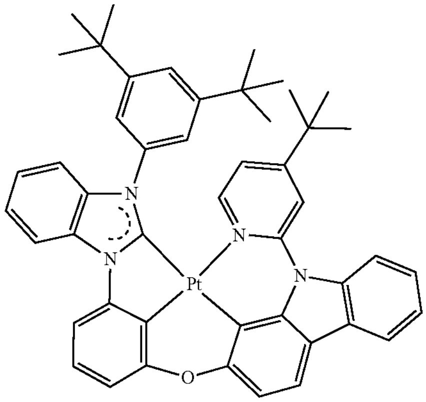

PD39

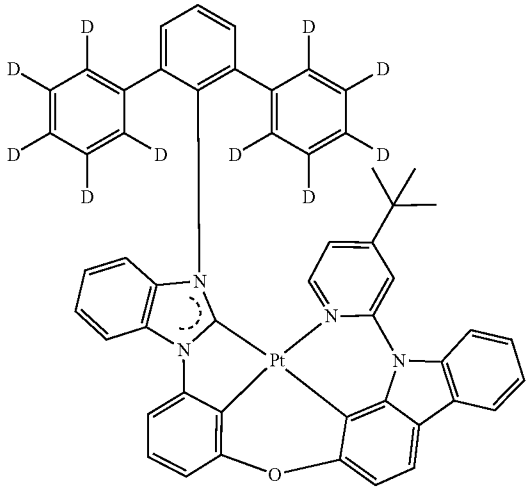

.

[Delayed Fluorescence Dopant]

The emission layer may include a delayed fluorescence dopant.

The delayed fluorescence dopant described herein may be selected from compounds capable of emitting delayed fluorescence according to a delayed fluorescence emission mechanism.

The delayed fluorescence dopant included in the emission layer may serve as a host or as a dopant, depending on the type of other materials included in the emission layer.

In an embodiment, a difference between a triplet energy level (eV) of the delayed fluorescence dopant and a singlet energy level (eV) of the delayed fluorescence dopant may be in a range of about 0 eV to about 0.5 eV. When the difference between the triplet energy level (eV) of the delayed fluorescence dopant and the singlet energy level (eV) of the delayed fluorescence dopant is within the above range, up-conversion from a triplet state to a singlet state in the delayed fluorescence dopants may occur effectively, thereby improving the luminescence efficiency of the light-emitting device 10.

For example, the delayed fluorescence dopant may include: a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group); a material including a $C_8$-$C_{60}$ polycyclic group including at least two cyclic groups condensed to each other and sharing boron (B); and the like.

Examples of the delayed fluorescence dopant may include at least one of Compounds DF1 to DF15:

DF1

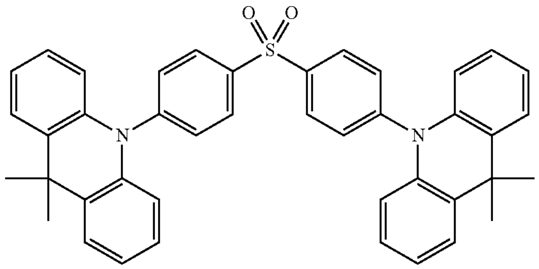

(DMAC-DPS)

DF2

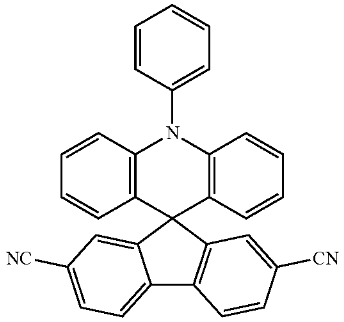

(ACRFLCN)

DF3

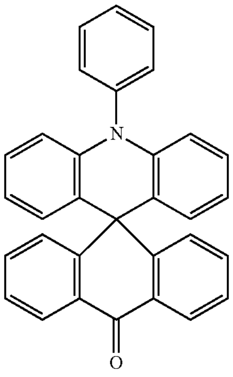

(ACRSA)

-continued
DF4
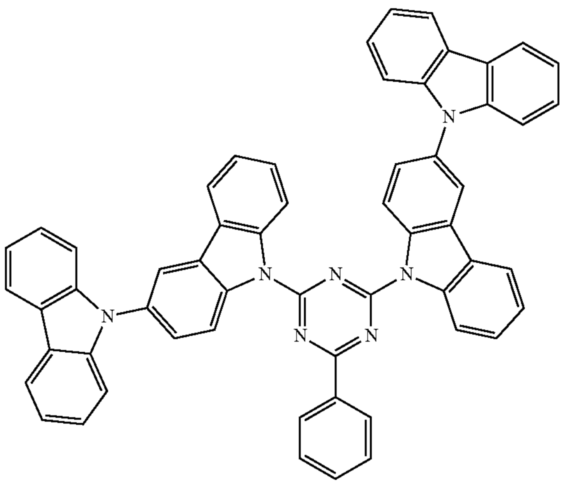
(CC2TA)
DF5
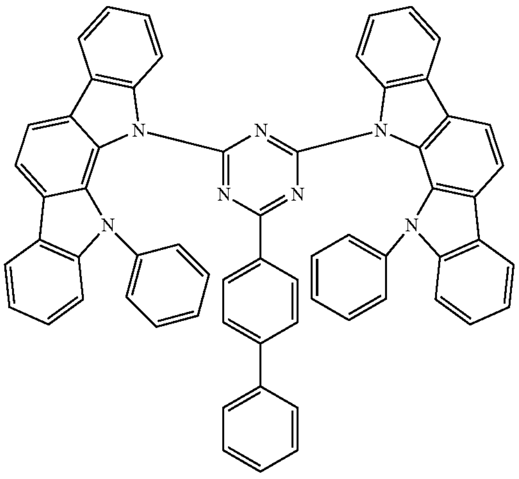
(PIC-TRZ)
DF6
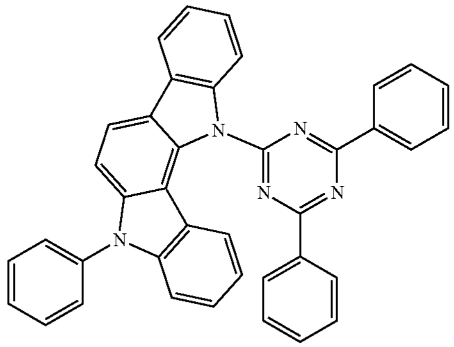
(PIC-TRZ2)
-continued
DF7
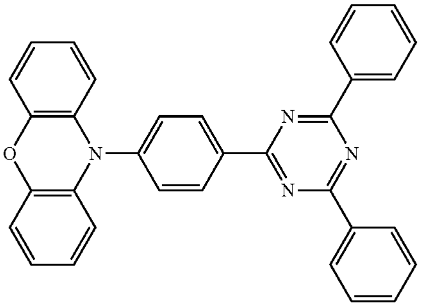
(PXZ-TRZ)
DF8
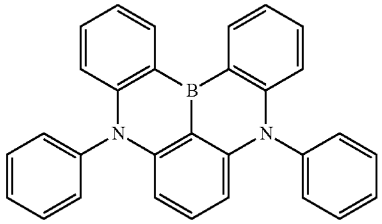
(DABNA-1)
DF9
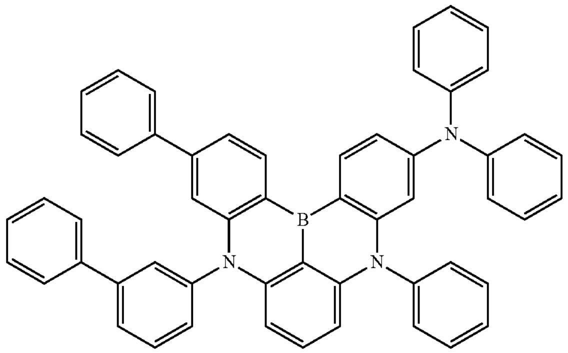
(DABNA-2)
DF10
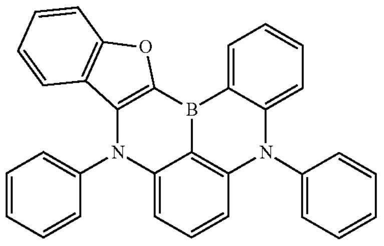
DF11
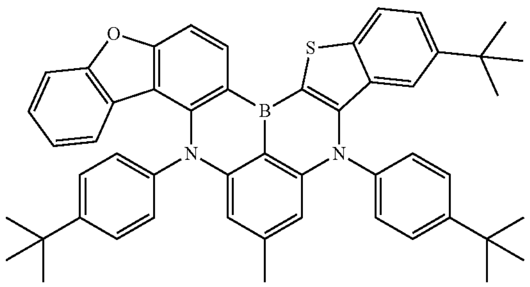

-continued

DF12

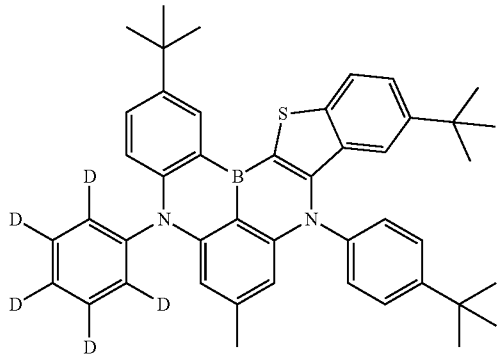

DF13

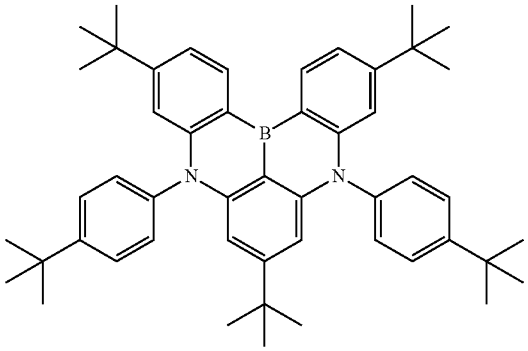

DF14

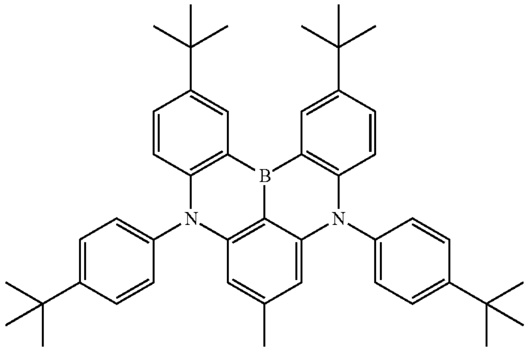

DF15

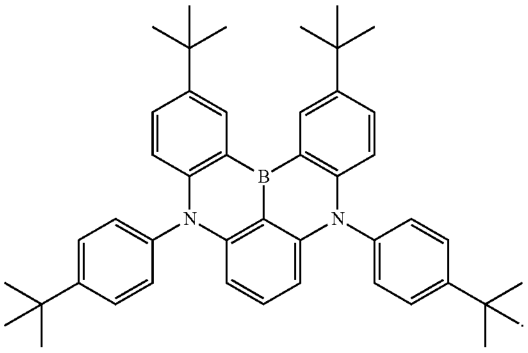

[Electron Transport Region in Interlayer 130]

The electron transport region may have a structure consisting of a layer consisting of a single material, a structure consisting of a layer including different materials; or a structure including multiple layers including different materials.

In embodiments, an electron transport region may be positioned between the second electrode and the emitting unit and/or between the emitting unit and the charge generation layer, and the electron transport region may include a hole blocking layer, an electron transport layer, an electron injection layer, or any combination thereof.

The electron transport region (for example, the hole-blocking layer or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

[Formula 601]

$$[Ar_{601}]_{xe11}-[(L_{601})_{xe1}-R_{601}]_{xe21}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as described herein in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$ may be linked to each other via a single bond.

In embodiments, in Formula 601, $Ar_{601}$ may be a substituted or unsubstituted anthracene group.

In embodiments, the electron transport region may include a compound represented by Formula 601-1:

[Formula 601-1]

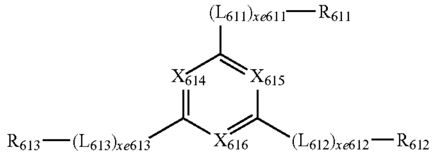

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may each be N, $L_{611}$ to $L_{613}$ may each independently be the same as described herein in connection with $L_{601}$, xe611 to xe613 may each independently be the same as described herein in connection with xe1, $R_{611}$ to $R_{613}$ may each independently be the same as described herein in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

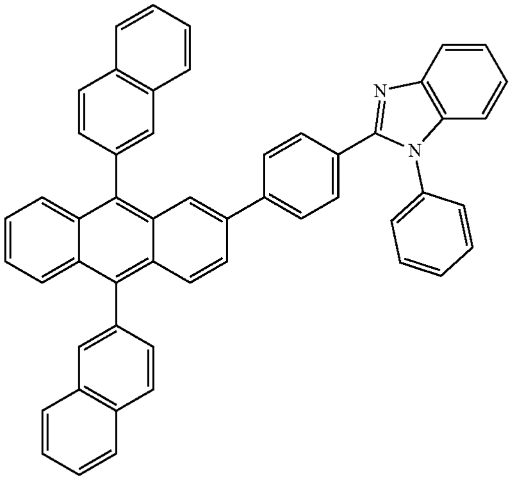

ET2

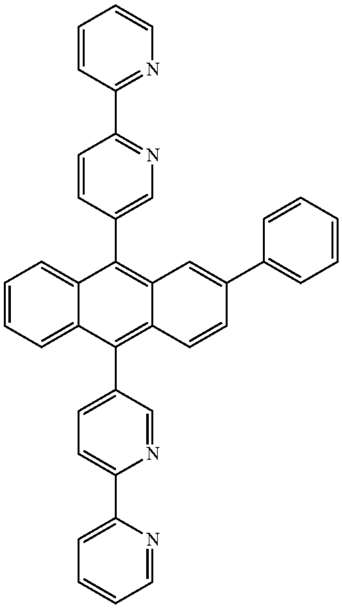

-continued

ET3

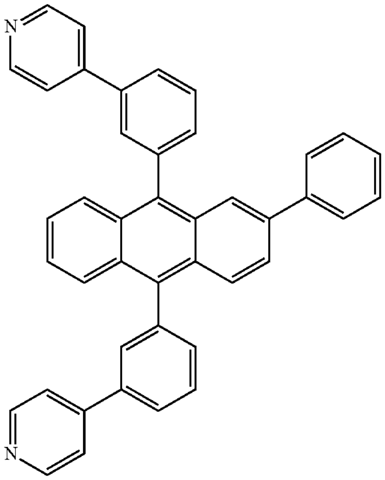

ET4

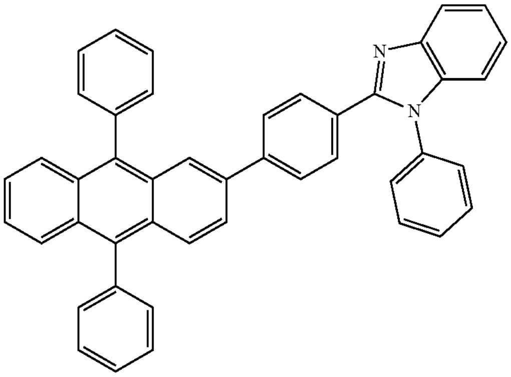

ET5

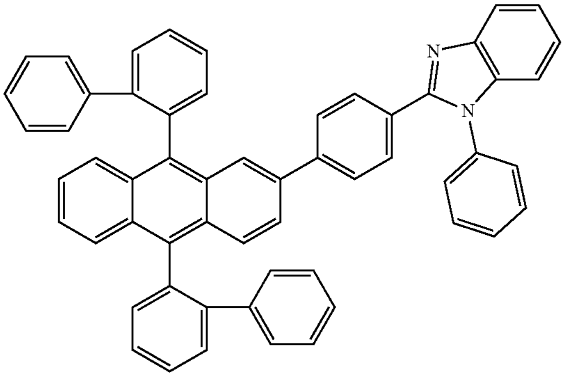

-continued
ET6
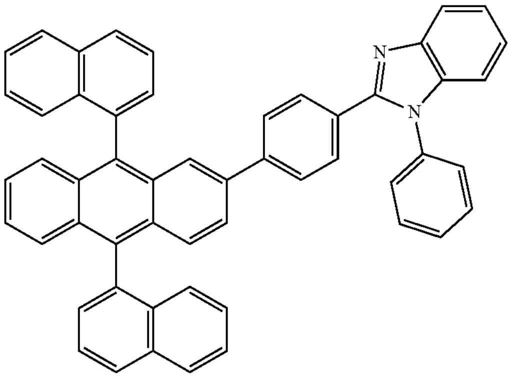
ET7
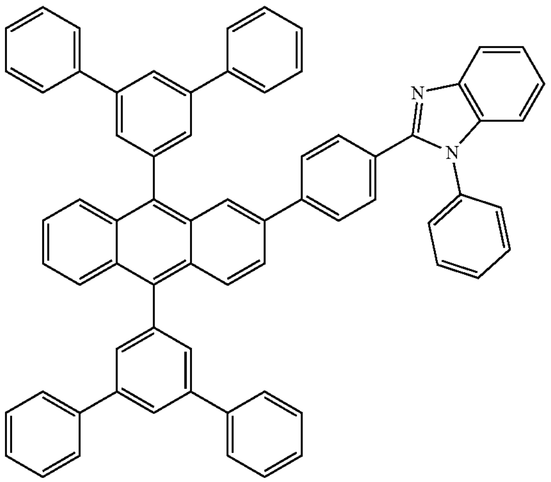
ET8
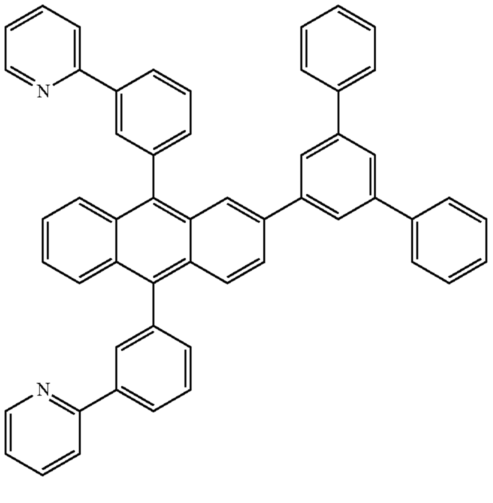
-continued
ET9
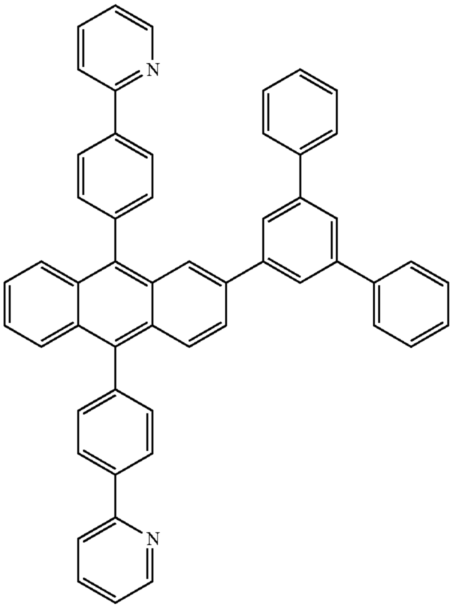
ET10
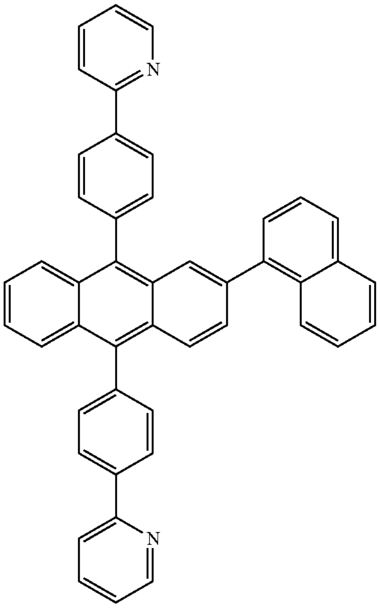

-continued
ET11
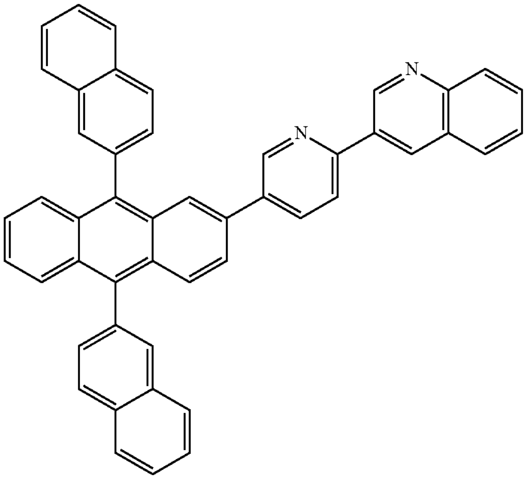
ET12
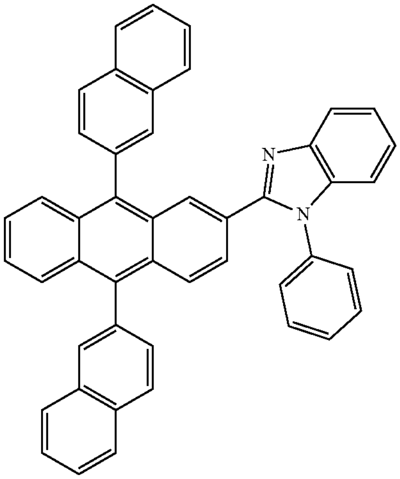
ET13
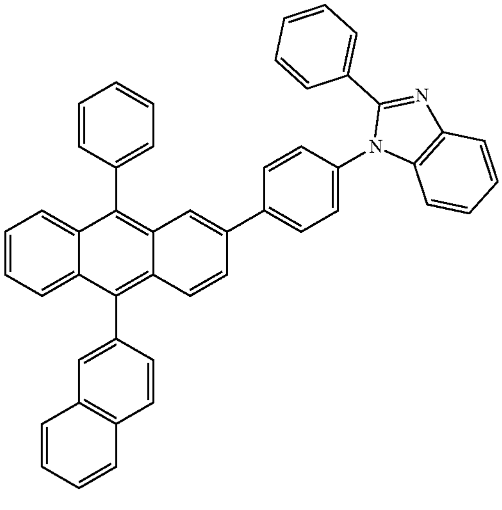
-continued
ET14
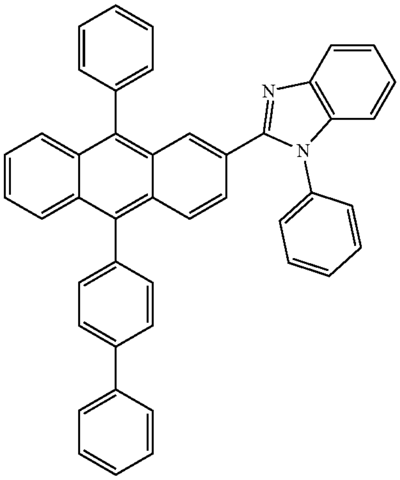
ET15
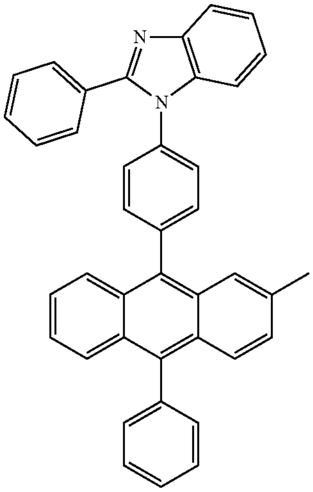
ET16
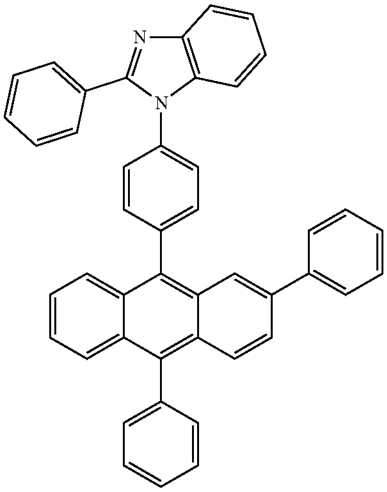

ET17
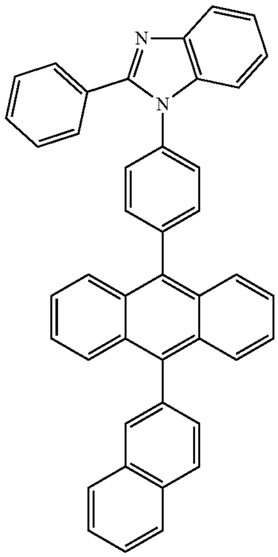
ET18
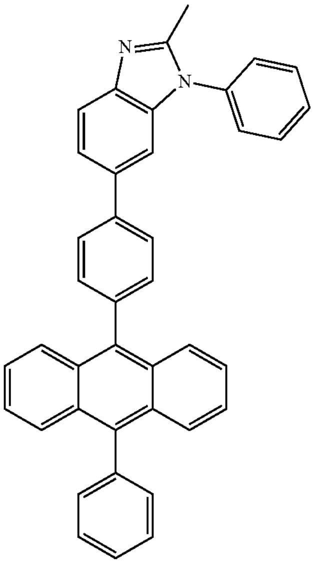
ET19
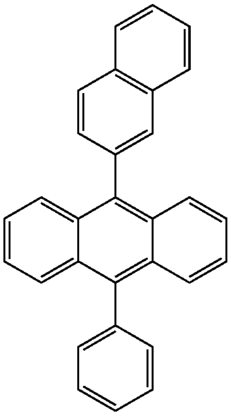
ET20
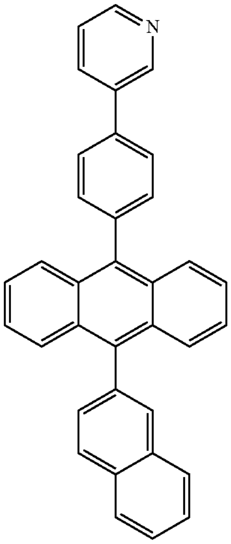
ET21
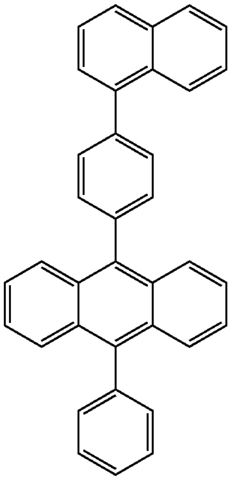
ET22
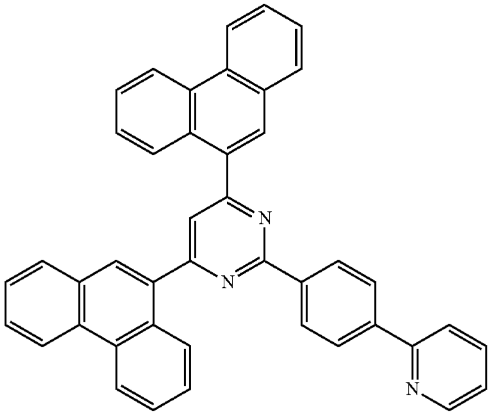

-continued
ET23
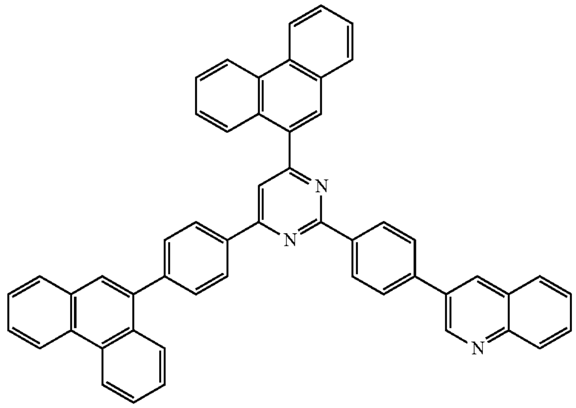
ET24
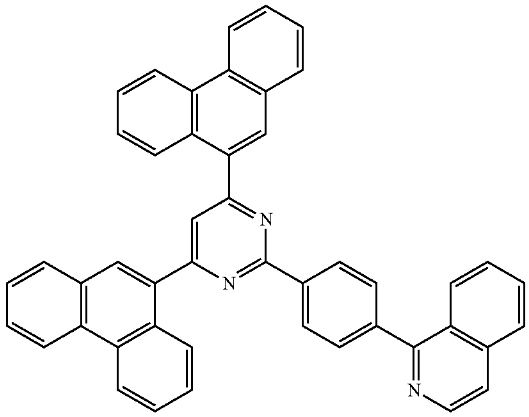
ET25
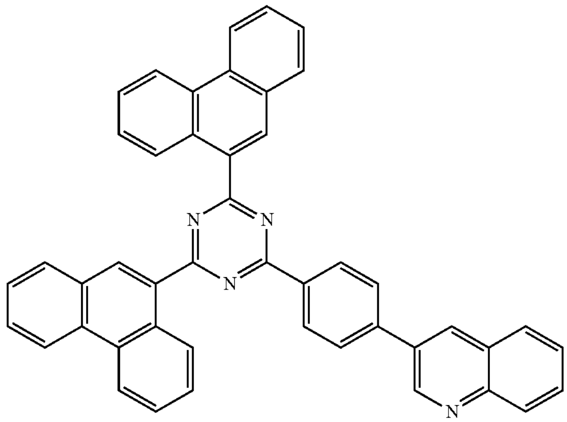
-continued
ET26
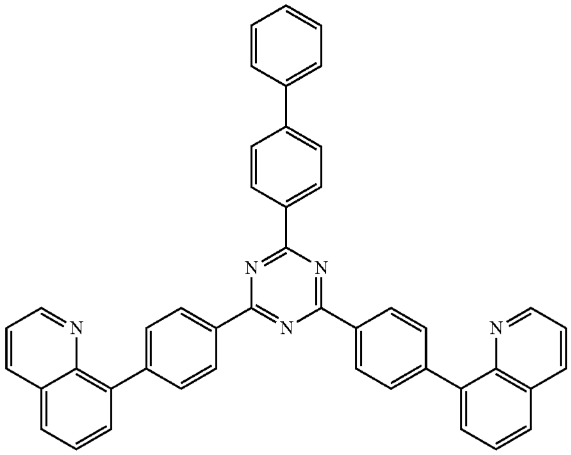
ET27
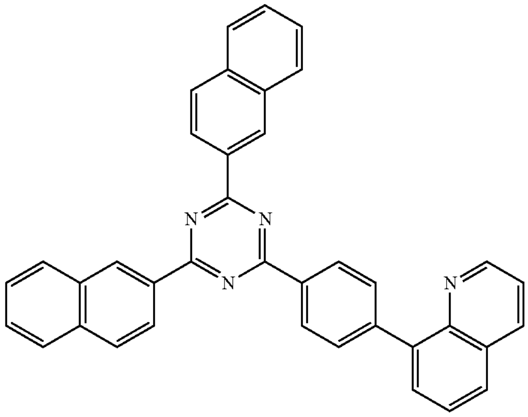
ET28
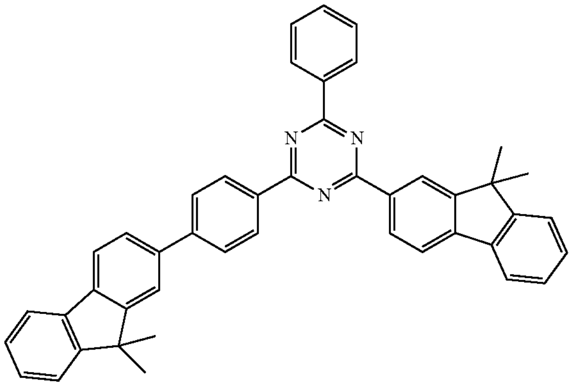

-continued
ET29
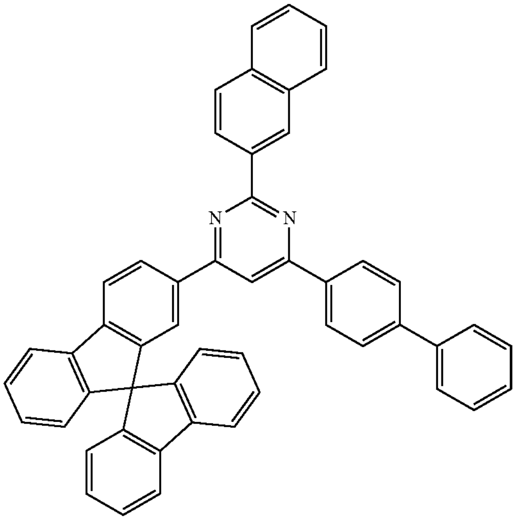
ET30
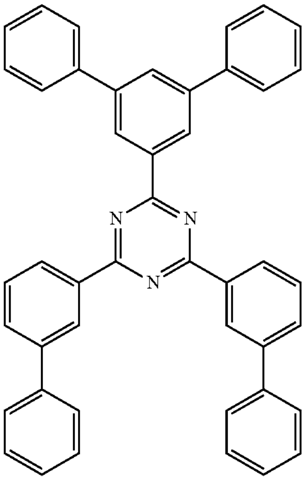
ET31
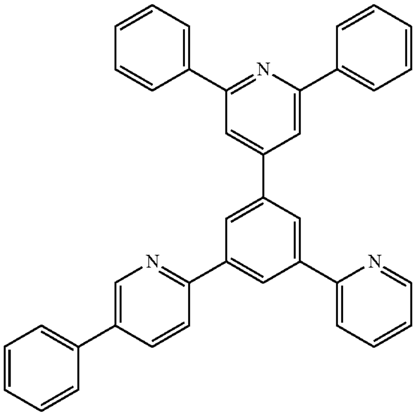
-continued
ET32
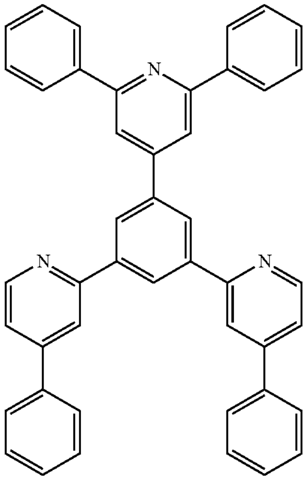
ET33
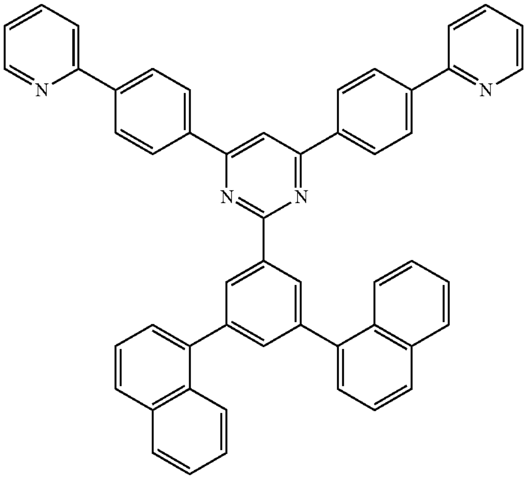
ET34
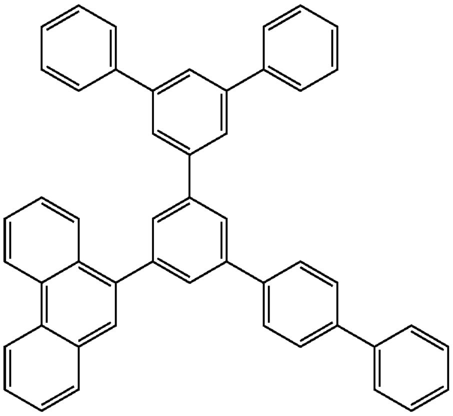

-continued
ET35
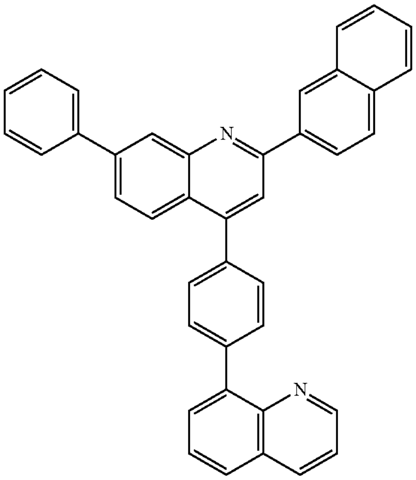
ET36
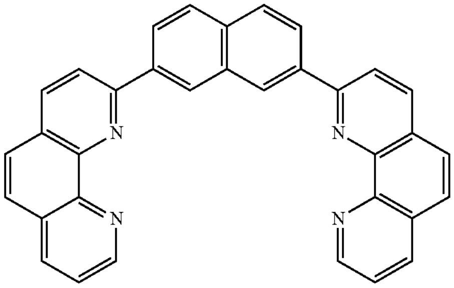
ET37
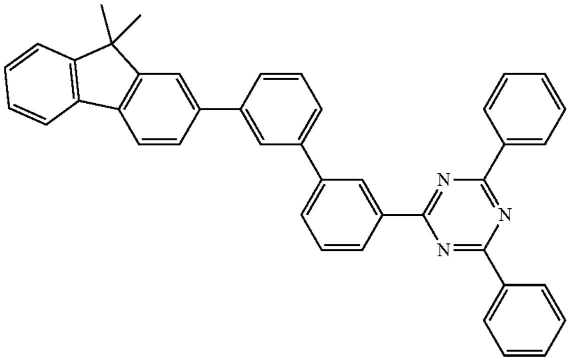
ET38
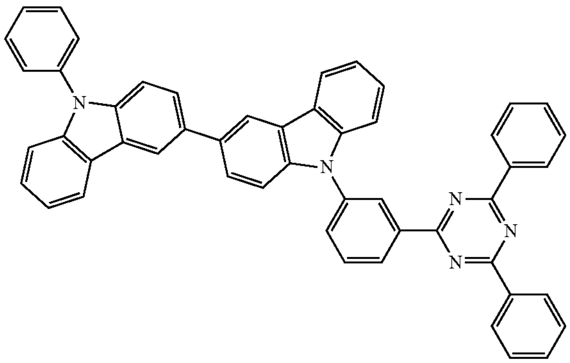
-continued
ET39
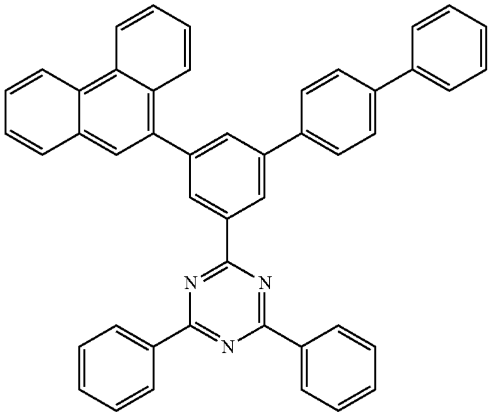
ET40
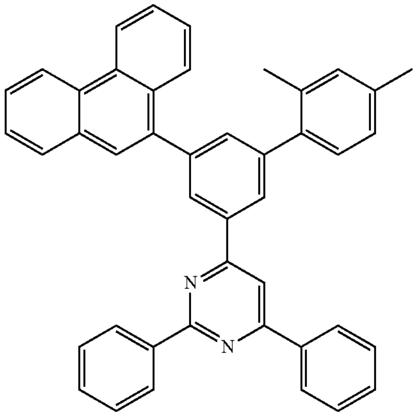
ET41
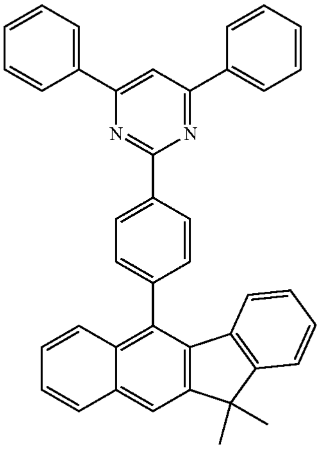

-continued

ET42

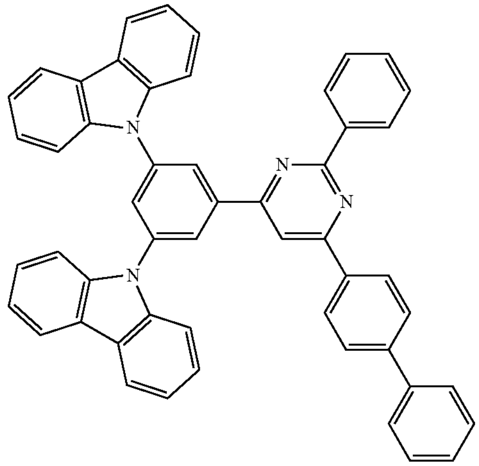

ET43

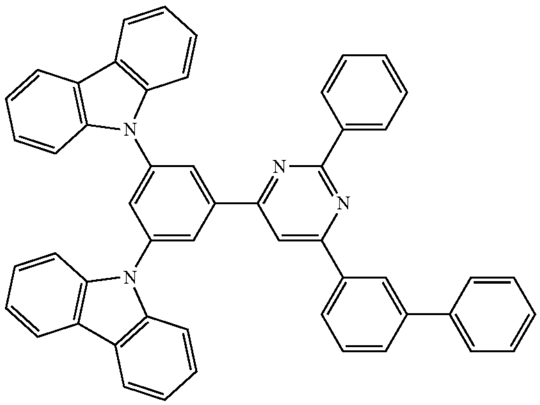

ET44

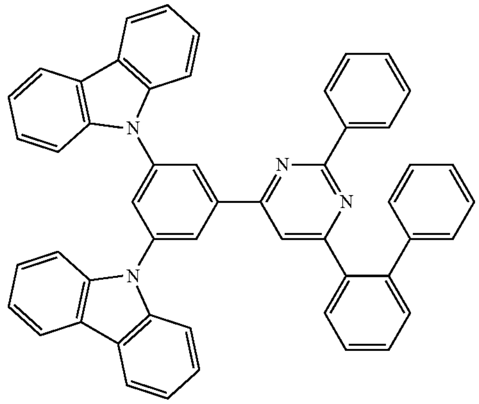

ET45

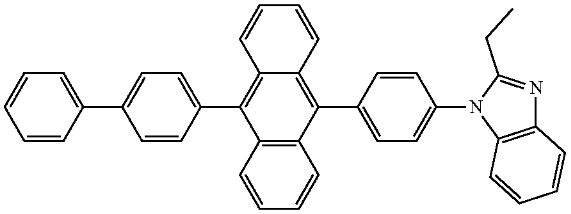

-continued

Alq3

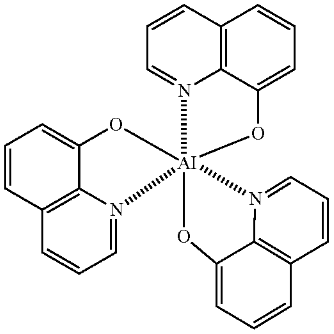

BAlq

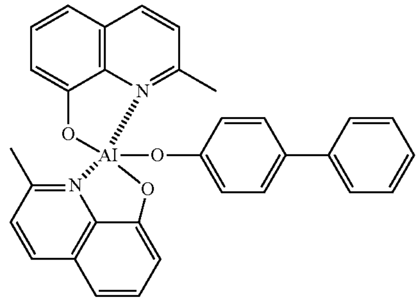

TAZ

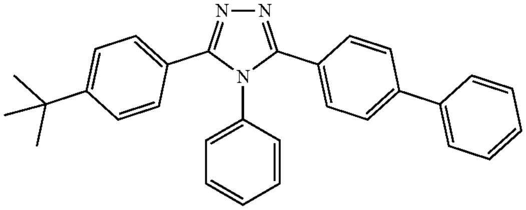

NTAZ

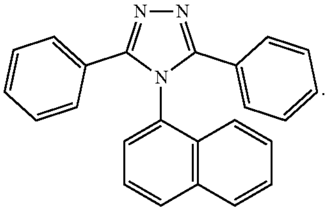

A thickness of the electron transport region may be in a range of about 100 Å to about 5,000 Å. For example, the thickness of the electron transport region may be in a range of about 160 Å to about 4,000 Å. When the electron transport region includes the hole blocking layer, the electron transport layer, or any combination thereof, a thickness of the hole blocking layer or the electron transport layer may each independently be in a range of about 20 Å to about 1,000 Å, and a thickness of the electron transport layer may be in a range of about 100 Å to about 1,000 Å. For example, the thickness of the hole blocking layer, or the electron transport layer may each independently be in a range of about 30 Å to about 300 Å. For example, the thickness of the electron transport layer may be in a range of about 150 Å to about 500 Å. When the thicknesses of the hole blocking layer and/or the electron transport layer are within these ranges, satisfactory electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion, and a metal ion of the alkaline earth metal complex may be a beryllium (Be) ion, a magnesium (Mg) ion, a calcium (Ca) ion, a strontium (Sr) ion, or a barium (Ba) ion. A ligand coordinated with the metal ion of an alkali metal complex or an alkaline earth-metal complex may each independently include a hydroxyquinoline, a hydroxyisoquinoline, a hydroxybenzoquinoline, hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or Compound ET-D2:

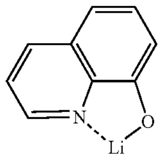

ET-D1

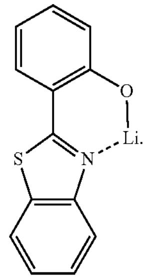

ET-D2

The electron transport region may include an electron injection layer that facilitates the injection of electrons from the second electrode 150. The electron injection layer may contact (e.g., directly contact) the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying 0<x1), and the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $HO_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include: an alkali metal ion, an alkaline earth metal ion, or a rare earth metal ion; and a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, an alkali metal halide), or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within these ranges, satisfactory electron injection characteristics may be obtained without a substantial increase in driving voltage.

[Second Electrode 150]

The second electrode 150 may be on the interlayer 130 as described above. The second electrode 150 may be a cathode, which is an electron injection electrode. When the second electrode 150 is a cathode, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure.

[Capping Layer]

In an embodiment, the light-emitting device 10 may include a first capping layer outside the first electrode 110, and/or a second capping layer outside the second electrode 150. In an embodiment, the light-emitting device 10 may have a structure in which the first capping layer, the first electrode 110, the interlayer 130, and the second electrode 150 are stacked in the stated order, a structure in which the first electrode 110, the interlayer 130, the second electrode 150, and the second capping layer are stacked in the stated order, or a structure in which the first capping layer, the first electrode 110, the interlayer 130, the second electrode 150, and the second capping layer are stacked in the stated order.

Light generated in the emission layer of the interlayer 130 of the light-emitting device 10 may pass through the first electrode 110, which may be a semi-transmissive electrode or a transmissive electrode), and through the first capping layer to the outside, and light generated in the emission layer of the interlayer 130 may pass through the second electrode 150, which may be a semi-transmissive electrode or a transmissive electrode), and through the second capping layer to the outside.

The first capping layer and the second capping layer may each increase external luminescence efficiency according to the principle of constructive interference. Accordingly, the light extraction efficiency of the light-emitting device 10 may be increased, thus improving the luminescence efficiency of the light-emitting device 10.

Each of the first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In an embodiment, at least one of the first capping layer and the second capping layer may each independently include an amine group-containing compound.

For example, at least one of the first capping layer and the second capping layer may each independently include a compound represented by Formula 201, a compound represented by Formula 202, or any combination thereof.

In embodiments, at least one of the first capping layer and the second capping layer may each independently include: one of Compounds HT28 to HT33; one of Compounds CP1 to CP6; β-NPB; or any combination thereof:

CP1

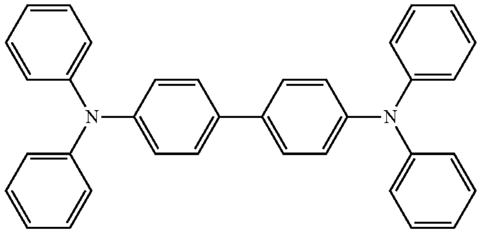

CP2

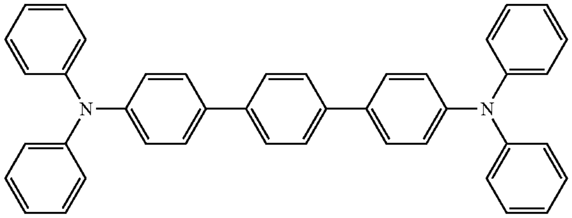

CP3

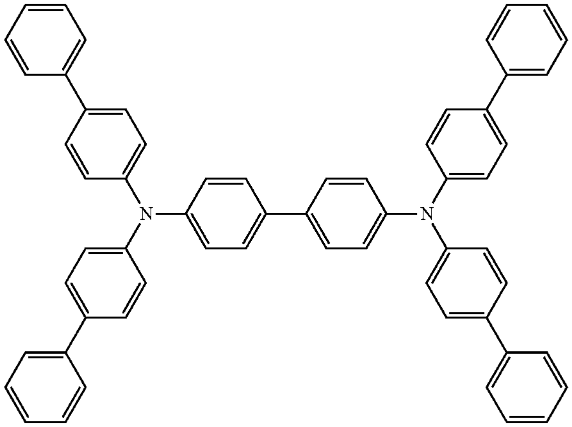

CP4

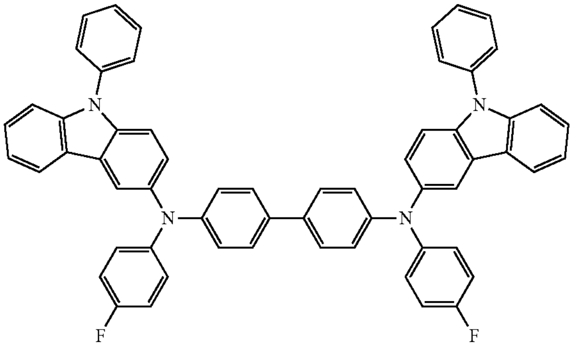

-continued

CP5

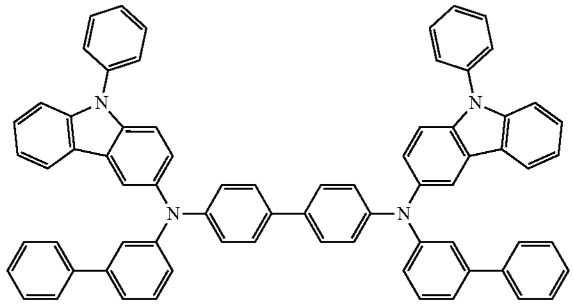

CP6

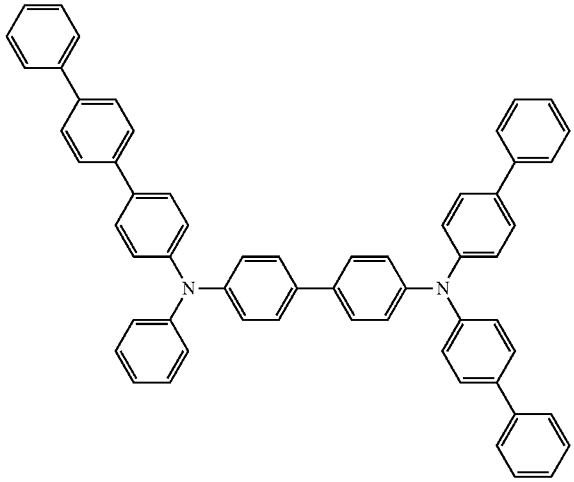

β-NPB

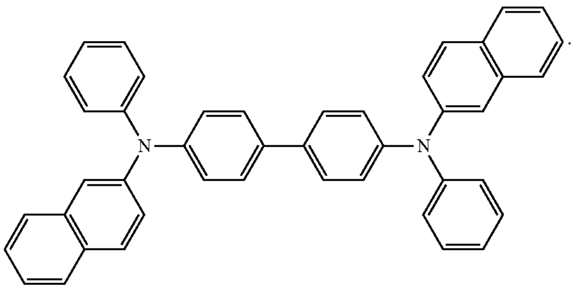

[Electronic Apparatus]

The light-emitting device may be included in various electronic apparatuses. For example, the electronic apparatus including the light-emitting device may be a light-emitting apparatus, an authentication apparatus, and the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, the light emitted from the light-emitting device may be blue light. Details on the light-emitting device may be the same as described herein. In an embodiment, the color conversion layer may include a quantum dot. The quantum dot may be, for example, the quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each of the subpixels.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting a first color light, a second area emitting a second color light, and/or a third area emitting a third color light, wherein the first color light, the second color light, and/or the third color light may each have different maximum emission wavelengths from one another. For example, the first color light may be red light, the second color light may be green light, and the third color light may be blue light. In an embodiment, the color filter areas (or the color conversion areas) may include quantum dots. In an embodiment, the first area may include a red quantum dot, the second area may include a green quantum dot, and the third area may not include a quantum dot. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. In an embodiment, the first-first color light, the second-first color light, and the third-first color light may each have different maximum emission wavelengths. In an embodiment, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an active layer, wherein any one of the source electrode and the drain electrode may be electrically connected to one of the first electrode and the second electrode of the light-emitting device.

The thin-film transistor may further include a gate electrode, a gate insulating film, and the like.

The active layer may include crystalline silicon, amorphous silicon, an organic semiconductor, an oxide semiconductor, and the like.

The electronic apparatus may further include an encapsulation unit for sealing the light-emitting device. The encapsulation unit may be arranged between the color filter and/or the color conversion layer and the light-emitting device. The encapsulation unit allows light from the light-emitting device to pass to the outside, and prevents ambient air and moisture from penetrating into the light-emitting device. The encapsulation unit may be a sealing substrate including a transparent glass substrate or a plastic substrate. The encapsulation unit may be a thin-film encapsulation layer including at least one layer of an organic layer and/or an inorganic layer. When the encapsulation unit is a thin film encapsulation layer, the electronic apparatus may be flexible.

Various functional layers may be further included on the encapsulation unit, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 3:
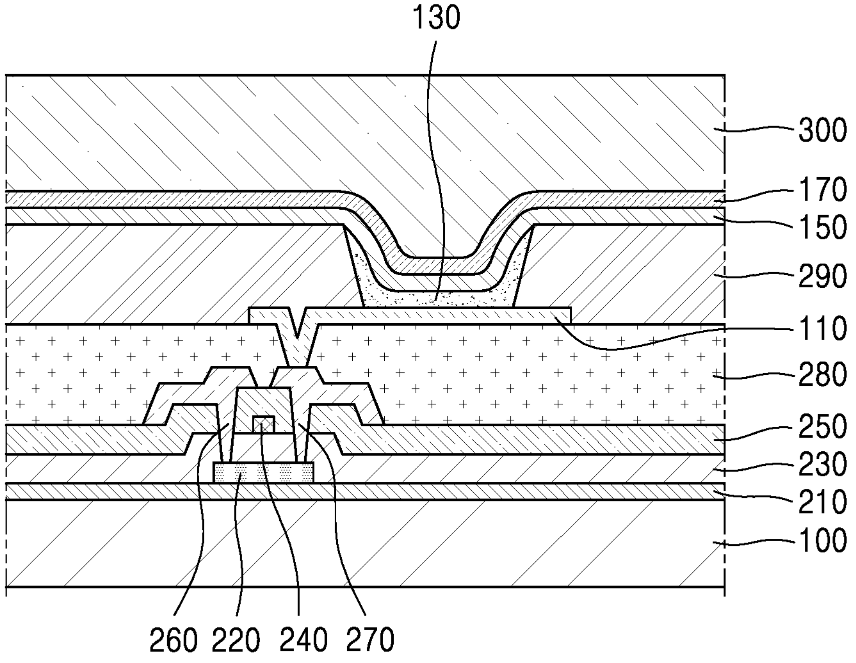
FIG. 3 is a schematic cross-sectional view of an electronic apparatus according to an embodiment.
Figure 4:
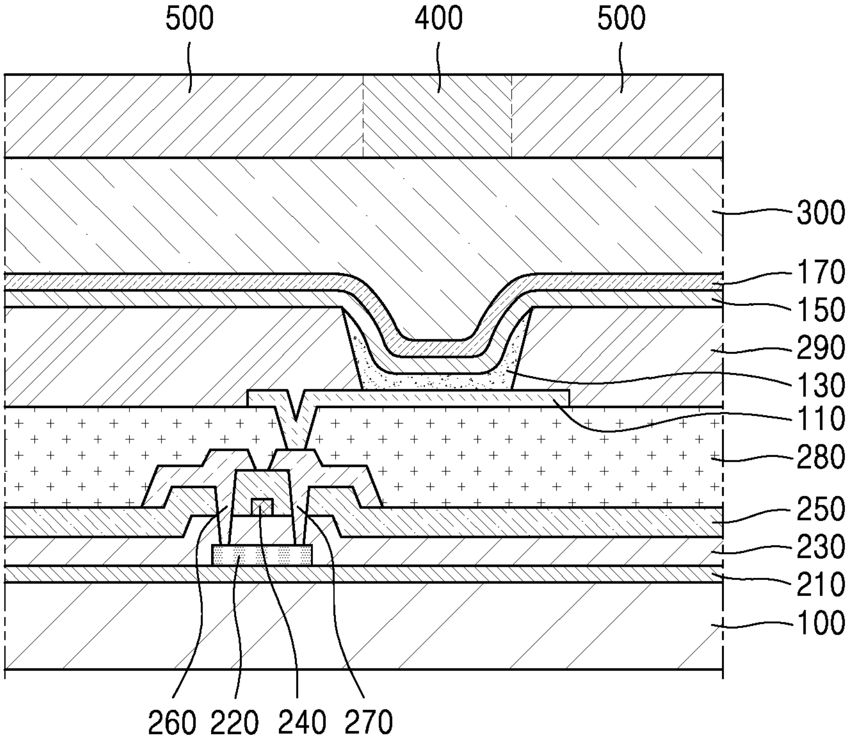
FIG. 4 is a schematic cross-sectional view of an electronic apparatus according to another embodiment.

[Description of FIGS. 3 and 4]

FIG. 3 is a schematic cross-sectional view of an electronic apparatus according to an embodiment.

The electronic apparatus of FIG. 3 includes a substrate 100, a thin-film transistor (TFT), a light-emitting device, and an encapsulation unit 300 that encapsulates the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be arranged on the interlayer insulating film 250. The interlayer insulating film 250 and the gate insulating film 230 may be formed to expose a source region and a drain region of the active layer 220, and the source electrode 260 and the drain electrode 270 may respectively contact the exposed portions of the source region and the drain region of the active layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include the first electrode 110, the interlayer 130, and the second electrode 150.

The first electrode 110 may be arranged on the passivation layer 280. The passivation layer 280 may be arranged to expose a portion of the drain electrode 270, not fully covering the drain electrode 270. The first electrode 110 may be electrically connected to the exposed portion of the drain electrode 270.

A pixel defining layer 290 including an insulating material may be arranged on the first electrode 110. The pixel defining layer 290 may expose a region of the first electrode 110, and an interlayer 130 may be formed in the exposed region of the first electrode 110. The pixel defining layer 290 may be a polyimide-based organic film or a polyacrylic-based organic film. Although not shown in FIG. 3, at least some layers of the interlayer 130 may extend beyond the upper portion of the pixel defining layer 290 and may thus be provided in the form of a common layer.

The second electrode 150 may be arranged on the interlayer 130, and a capping layer 170 may be further included on the second electrode 150. The capping layer 170 may be formed to cover the second electrode 150.

The encapsulation portion 300 may be arranged on the capping layer 170. The encapsulation portion 300 may be arranged on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 4 is a schematic cross-sectional view of an electronic apparatus according to another embodiment.

The electronic apparatus of FIG. 4 may differ from the light-emitting device of FIG. 3, at least in that a light-shielding pattern 500 and a functional region 400 are further located on the encapsulation unit 300. The functional region 400 may be a color filter area, a color conversion area, or a combination of the color filter area and the color conversion area. In an embodiment, the light-emitting device included in the electronic apparatus of FIG. 4 may be a tandem light-emitting device.

[Manufacturing Method]

Respective layers included in the hole transport region, the emission layer, and respective layers included in the electron transport region may be formed in a certain region by using one or more suitable methods selected from vacuum deposition, spin coating, casting, a Langmuir-Blodgett (LB) method, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of each layer to be formed.

When respective layers included in the hole transport region, an emission layer, and respective layers included in the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

[Definitions of Terms]

The term "$C_3$-$C_{60}$ carbocyclic group" as used herein may be a cyclic group consisting of carbon only as a ring-forming atom and having three to sixty carbon atoms, and the term "$C_1$-$C_{60}$ heterocyclic group" as used herein may be a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of a $C_1$-$C_{60}$ heterocyclic group may be from 3 to 61.

The "cyclic group" as used herein may be a $C_3$-$C_{60}$ carbocyclic group or a $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In an embodiment, a $C_3$-$C_{60}$ carbocyclic group may be a T1 group or a group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), a $C_1$-$C_{60}$ heterocyclic group may be a T2 group, a group in which at least two T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), a π electron-rich $C_3$-$C_{60}$ cyclic group may be a T1 group, a group in which at least two T1 groups are condensed with each other, a T3 group, a group in which at least two T3 groups are condensed with each other, or a group in which at least one T3 group and at least one $T_1$ group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), a π electron-deficient nitrogen-containing $C_1$-$C_{60}$ cyclic group may be a T4 group, a group in which at least two T4 groups are condensed with each other, a group in which at least one T4 group and at least one $T_1$ group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed with any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group or a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group or a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by $-O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of a $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each independently include two or more rings, the rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of a monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of a monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and A107 may be a $C_1$-$C_{59}$ heteroaryl group).

In the specification, the group "$R_{10a}$" may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a Cs-$C_{60}$ carbocyclic group or a $C_1$-$C_{60}$ heterocyclic group, each of which is unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of a heteroatom may include O, S, N, P, Si, B, Ge, Se, or any combination thereof.

In the specification, examples of a "third-row transition metal" may include hafnium (Hf), tantalum (Ta), tungsten (W), rhenium (Re), osmium (Os), iridium (Ir), platinum (Pt), gold (Au), etc.

In the specification, "Ph" refers to a phenyl group, "Me" refers to a methyl group, "Et" refers to an ethyl group, "ter-Bu" or "But" each refer to a tert-butyl group, and "OMe" refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula.

Hereinafter, a compound and light-emitting device according to embodiments will be described in detail with reference to the Examples and Comparative Examples.

EXAMPLES AND COMPARATIVE EXAMPLES

$T_1$ Values of Hosts $T_1$ values of the following host compounds are shown in Table 1.

H129

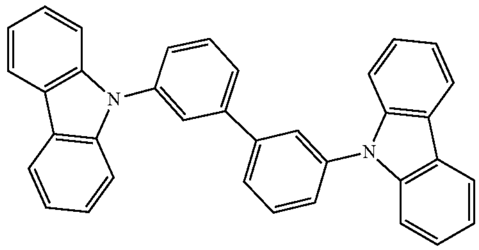

-continued

H130

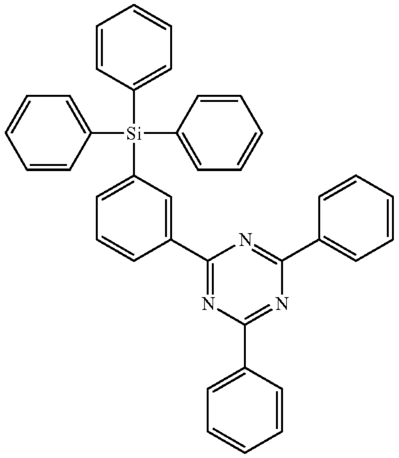

H131

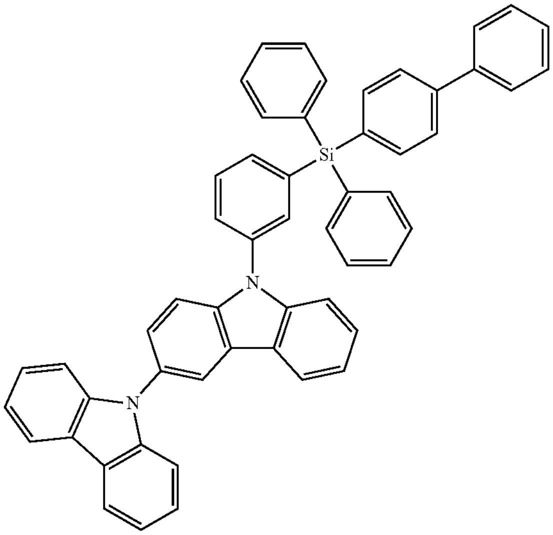

H132

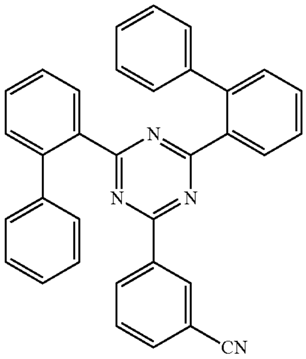

-continued
HT-01
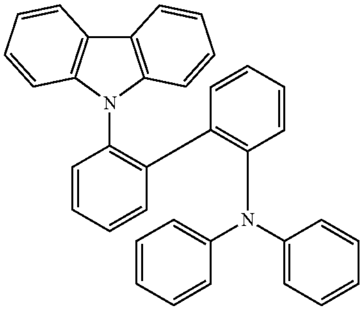
HT-02
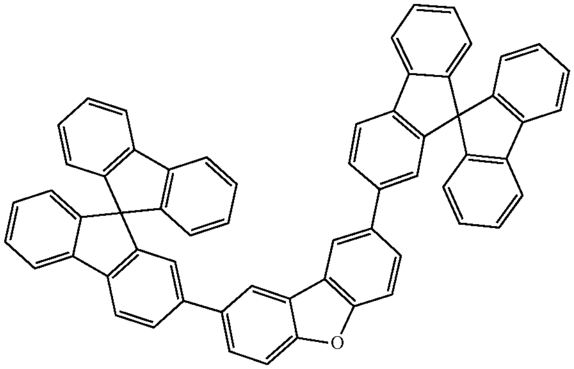
HT-03
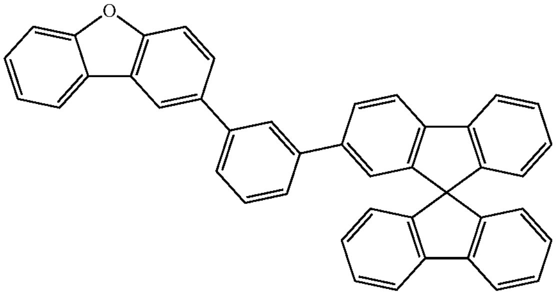
HT-04
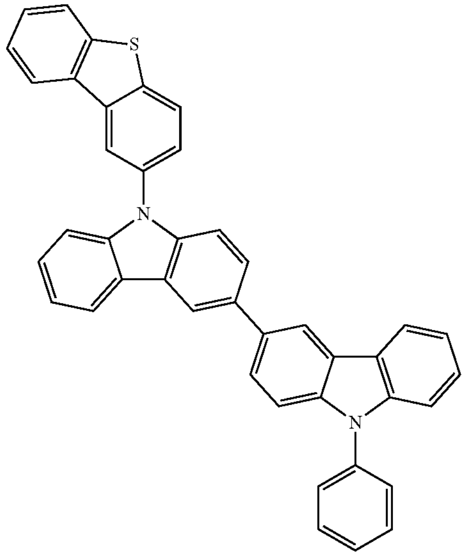
-continued
HT-05
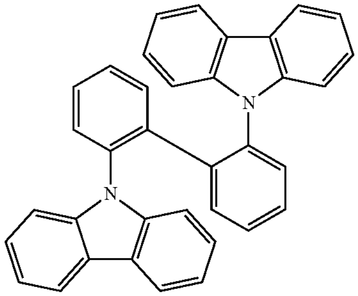
ET-01
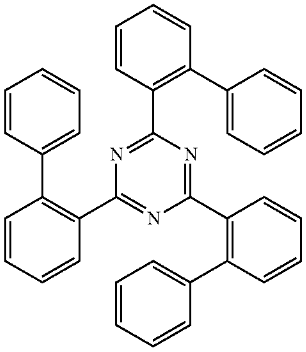
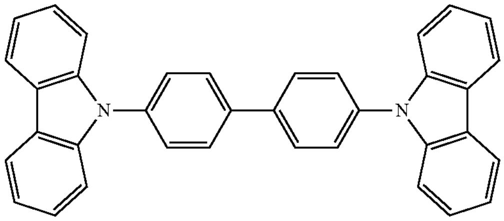
CBP
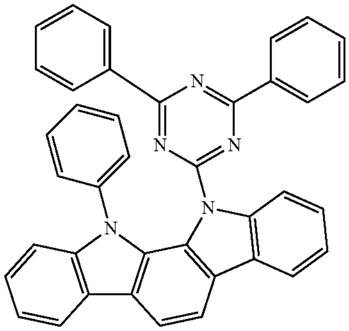
DIC-TRZ
The $T_1$ value is a value measured after a 1 ms delay using a dilute THF solution ($2\times10^{-6}$ M, 77 K) with HORIBA fluoromax+.
TABLE 1
| Name | T1(eV) |
|---|---|
| H129 | 3.07 |
| HT-01 | 2.84 |
| HT-02 | 2.72 |
| HT-03 | 2.82 |
| HT-04 | 2.85 |
| HT-05 | 3.10 |
| H131 | 2.90 |
| H130 | 3.03 |
| ET-01 | 2.81 |

TABLE 1-continued

| Name | T1(eV) |
|---|---|
| H132 | 2.95 |
| CBP | 2.55 |
| DIC-TRZ | 2.82 |

Compound H129 and H130 are host compounds having relatively high $T_1$ values, compounds H131 and H132 are host compounds having relatively mild $T_1$ values, and compounds HT-01 to HT-05, ET-01, CBP, and DIC-TRZ are host compounds having relatively low $T_1$ values.

Manufacture of Light-Emitting Device

Example 1

A 15 Ω/cm² ITO/Ag/ITO (120 Å/500 Å/120 Å) glass substrate (a product of Corning Inc.) was cut to a size of 50 mm×50 mm×0.7 mm, sonicated in isopropyl alcohol and pure water for 5 minutes each, and cleaned by exposure to ultraviolet rays and ozone for 15 minutes, and mounted on a vacuum deposition apparatus.

HATCN was deposited on the ITO/Ag/ITO anode of the glass substrate to a thickness of 50 Å to form a hole injection layer, and NPB was deposited on the hole injection layer to a thickness of 300 Å to form a hole transport layer.

H131, H132, PD38 and DF15 were co-deposited in a volume ratio of 45:45:9:1 to form a third emitting unit (blue) having a thickness of 170 Å, and ET-5 and Liq were co-deposited on the three emitting units in a weight ratio of 1:1 to form an electron transport layer.

CG1 and Li were co-deposited in a weight ratio of 99:1 to form an n-type charge generation layer having a thickness of 50 Å, and HATCN was deposited on the n-type charge generation layer to a thickness of 50 Å to form a p-type charge generation layer.

NPB was deposited on the p-type charge generation layer to form a hole transport layer, and TCTA was deposited on the hole transport layer to a thickness of 50 Å to form an auxiliary layer.

H131, H132, PD38 and DF15 were co-deposited in a volume ratio of 45:45:9:1 to form a second emitting unit (blue) having a thickness of 170 Å. ET-5 and Liq were co-deposited in a weight ratio of 1:1 to form an electron transport layer having a thickness of 100 Å.

CG1 and Li were co-deposited in a weight ratio of 99:1 to form an n-type charge generation layer having a thickness of 50 Å, and HATCN was deposited on the n-type charge generation layer to a thickness of 50 Å to form a p-type charge generation layer.

NPB was deposited on the p-type charge generation layer to a thickness of 150 Å to form a hole transport layer.

H129, H130, PD38, and DF15 were co-deposited on the hole transport layer in a volume ratio of 45:45:9:1 to form a first emitting unit (blue) having a thickness of 170 Å, and TPM-TAZ and Liq were co-deposited on the first emitting unit in a weight ratio of 1:1 to form an electron transport layer having a thickness of 300 Å.

Yb was deposited to a thickness of 10 Å, and then, Ag and Mg were co-deposited to a thickness of 100 Å in a weight ratio of 9:1, thereby forming a cathode, and CPL was used form a capping layer having a thickness of 700 Å, thereby completing the manufacture of a light-emitting device.

Examples 2 to 6

Light-emitting devices of Examples 2 to 6 were manufactured in the same manner as in Example 1, except that compounds shown in Table 2 were used to form the hosts of the first emitting unit, the second emitting unit, and the third emitting unit.

Comparative Examples 1 to 9

Light-emitting devices of Comparative Examples 1 to 8 were manufactured in the same manner as in Example 1, except that compounds shown in Table 2 were used to form the hosts of the first emitting unit, the second emitting unit, and the third emitting unit.

A light-emitting device of Comparative Example 9 was manufactured in the same manner as in Example 1, except that PD-26 and FD-23 were used instead of PD38 and DF15, respectively, in the first emitting unit, the second emitting unit, and the third emitting unit.

The results of the light-emitting devices are shown in Table 2.

TABLE 2

| | Emitting units-hosts | EQE (%) @ 1000 nit | Lifespan (hr) @ LT95 |
|---|---|---|---|
| Example 1 | First emitting unit- H129:H130<br>Second emitting unit- H131:H132<br>Third emitting unit- H131:H132 | 48.2 | 154 |
| Example 2 | First emitting unit- H131:H132<br>Second emitting unit- H131:H132<br>Third emitting unit- H129:H130 | 47.7 | 148 |
| Example 3 | First emitting unit- H131:H132<br>Second emitting unit- H129:H130<br>Third emitting unit- H131:H132 | 47.9 | 150 |
| Example 4 | First emitting unit- H129:H130<br>Second emitting unit- H129:H130<br>Third emitting unit- H131:H132 | 48.6 | 147 |
| Example 5 | First emitting unit- H131:H132<br>Second emitting unit- H129:H130<br>Third emitting unit- H129:H130 | 48.3 | 145 |
| Example 6 | First emitting unit- H129:H130<br>Second emitting unit- H131:H132<br>Third emitting unit- H129:H130 | 48.5 | 147 |
| Comparative Example 1 | First emitting unit- H129:H130<br>Second emitting unit- H129:H130<br>Third emitting unit- H129:H130 | 49.1 | 135 |
| Comparative Example 2 | First emitting unit- H131:H132<br>Second emitting unit- H131:H132<br>Third emitting unit- H131:H132 | 44.8 | 123 |
| Comparative Example 3 | First emitting unit- H129:H130<br>Second emitting unit- HT-01:ET-01<br>Third emitting unit- HT-01:ET-01 | 45.0 | 126 |
| Comparative Example 4 | First emitting unit- H129:H130<br>Second emitting unit- HT-02:ET-01<br>Third emitting unit- HT-02:ET-01 | 44.7 | 115 |
| Comparative Example 5 | First emitting unit- H129:H130<br>Second emitting unit- HT-03:ET-0<br>Third emitting unit- HT-03:ET-01 | 44.9 | 121 |
| Comparative Example 6 | First emitting unit- H129:H130<br>Second emitting unit- HT-04:ET-01<br>Third emitting unit- HT-04:ET-01 | 45.0 | 127 |
| Comparative Example 7 | First emitting unit- H129:H130<br>Second emitting unit- HT-05:ET-01<br>Third emitting unit- HT-05:ET-01 | 45.3 | 130 |
| Comparative Example 8 | First emitting unit- HT-02:ET-01<br>Second emitting unit- HT-02:ET-01<br>Third emitting unit- HT-02:ET-01 | 41.4 | 101 |
| Comparative Example 9 | First emitting unit- CBP:DIC-TRZ<br>Second emitting unit- CBP:DIC-TRZ<br>Third emitting unit- CBP:DIC-TRZ | 27.0 | 45 |

The efficiency and lifespan of the light-emitting devices were measured using a measurement device C9920-2-12 manufactured by Hamamatsu Photonics Inc.

-continued
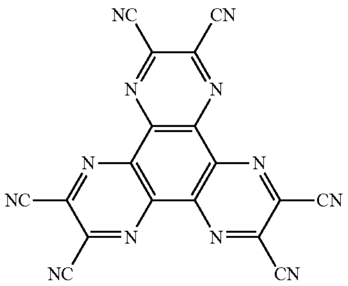
HATCN
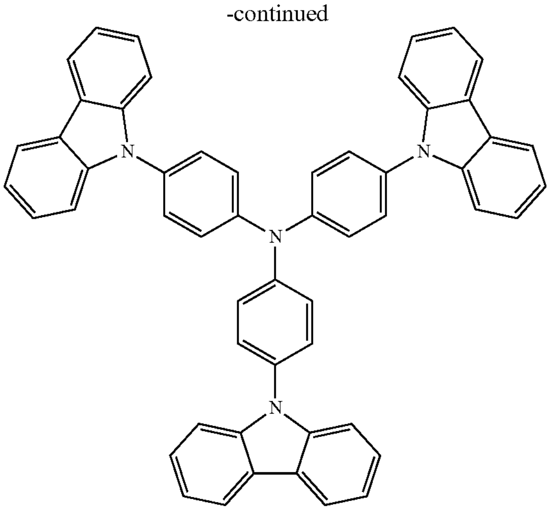
TCTA
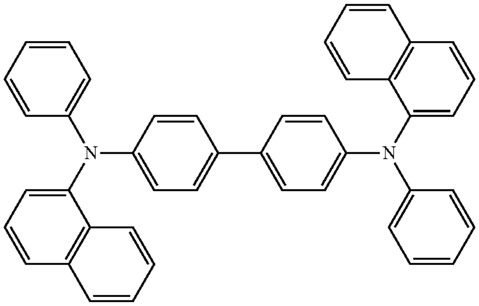
NPB
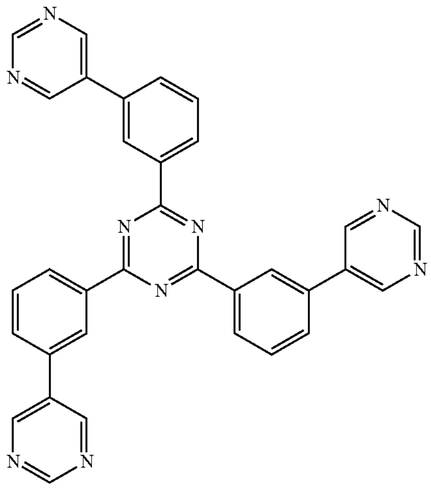
TPM-TAZ
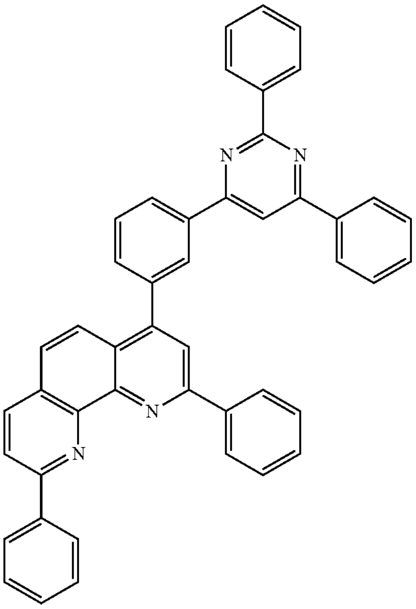
CG1
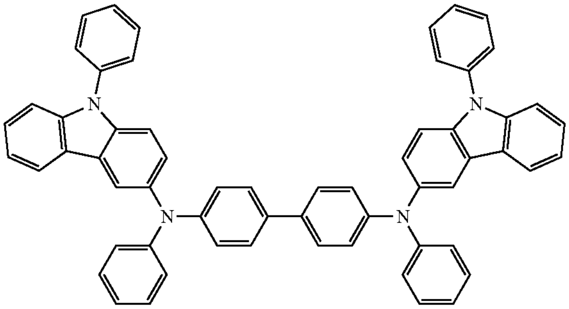
CPL -continued

ET-5

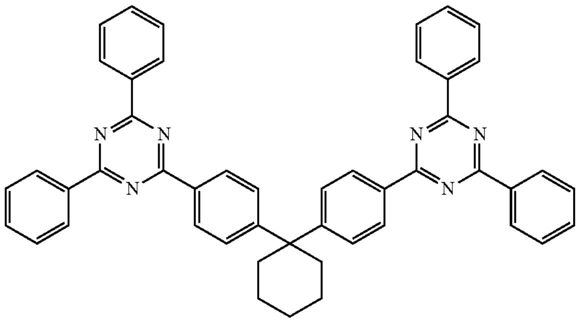

PD38

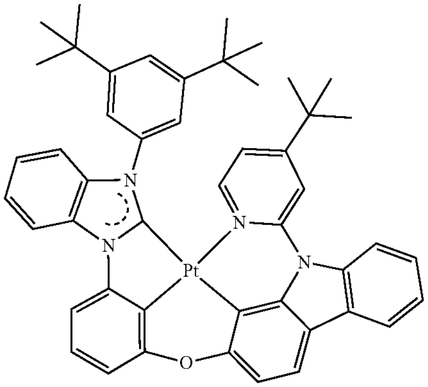

DF15

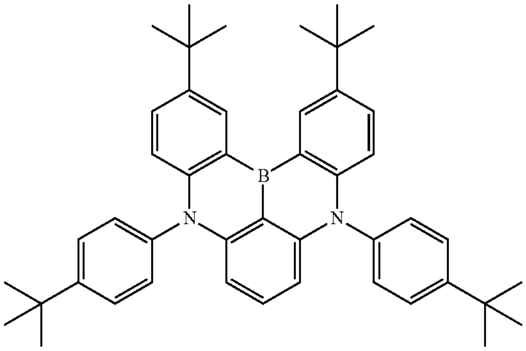

PD-26

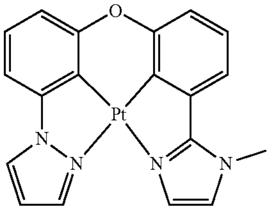

-continued

FD-23

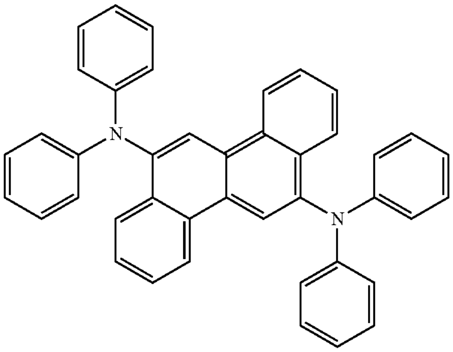

Referring to Table 1, in the case of Comparative Example 1, the $T_1$ values of all the hosts of the first emitting unit to the third emitting unit are in a range of 3.00 eV to 3.10 eV, indicating that the emitting units include only host compounds having relatively high $T_1$ values, and in the case of Comparative Example 2, the $T_1$ values of all the hosts of the first emitting unit to the third emitting unit are in a range of 2.89 eV or more but less than 3.00 eV, indicating that the emitting units include only host compounds having relatively mild $T_1$ values.

The cases of Comparative Examples 3 to 9 all include hosts having a value of less than 2.89 eV.

It can be seen that the light-emitting devices of examples generally may have excellent efficiency than the light-emitting devices of comparative examples, and that all of the light-emitting devices of examples may have excellent lifespan than the light-emitting devices of comparative examples.

As is apparent from the foregoing description, a light-emitting device according to embodiments exhibits improved efficiency and lifespan, compared with devices in the art.

Embodiments have been disclosed herein, and although terms are employed, they are used and are to be interpreted in a generic and descriptive sense only and not for the purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A light-emitting device comprising:

a first electrode;

a second electrode facing the first electrode;

m emitting units between the first electrode and the second electrode; and m-1 charge generation layers between adjacent ones of the m emitting units, wherein m is an integer of 3 or more, and the emitting units include a first emitting unit, a second emitting unit, and a third emitting unit, the first emitting unit includes a first-first host and a first-second host, the second emitting unit includes a second-first host and a second-second host, the third emitting unit includes a third-first host and a third-second host, $T_1$ values of the hosts of at least one of the first emitting unit, the second emitting unit, and the third emitting unit are each smaller than $T_1$ values of the hosts of the other emitting units, $T_1$ values of the hosts of at least one of the emitting units are each independently greater than or equal to about 2.89 eV, and each of the first emitting unit, the second emitting unit, and the third emitting unit includes a phosphorescent dopant and a fluorescent dopant.

2. The light-emitting device of claim 1, wherein the $T_1$ value of the second-first host and the $T_1$ value of the second-second host are each smaller than the $T_1$ value of the first-first host and the $T_1$ value of the first-second host, and the $T_1$ value of the third-first host and the $T_1$ value of the third-second host are each smaller than the $T_1$ value of the first-first host and the $T_1$ value of the first-second host;

the $T_1$ value of the first-first host and the $T_1$ value of the first-second host are each smaller than the $T_1$ value of the third-first host and the $T_1$ value of the third-second host, and the $T_1$ value of the second-first host and the $T_1$ value of the second-second host are each smaller than the $T_1$ value of the third-first host and the $T_1$ value of the third-second host; or the $T_1$ value of the first-first host and the $T_1$ value of the first-second host are each smaller than the $T_1$ value of the second-first host and the $T_1$ value of the second-second host, and the $T_1$ value of the third-first host and the $T_1$ value of the third-second host are each smaller than the $T_1$ value of the second-first host and the $T_1$ value of the second-second host.

3. The light-emitting device of claim 1, wherein the $T_1$ value of the third-first host and the $T_1$ value of the third-second host are each smaller than the $T_1$ value of the first-first host and the $T_1$ value of the first-second host, and the $T_1$ value of the third-first host and the $T_1$ value of the third-second host are each smaller than the $T_1$ value of the second-first host and the $T_1$ value of the second-second host;

the $T_1$ value of the first-first host and the $T_1$ value of the first-second host are each smaller than the $T_1$ value of the second-first host and the $T_1$ value of the second-second host, and the $T_1$ value of the first-first host and the $T_1$ value of the first-second host are each smaller than the $T_1$ value of the third-first host and the $T_1$ value of the third-second host; or the $T_1$ value of the second-first host and the $T_1$ value of the second-second host are each smaller than the $T_1$ value of the first-first host and the $T_1$ value of the first-second host, and the $T_1$ value of the second-first host and the $T_1$ value of the second-second host are each smaller than the $T_1$ value of the third-first host and the $T_1$ value of the third-second host.

4. The light-emitting device of claim 1, wherein the first electrode is an anode and the second electrode is a cathode; or the second electrode is an anode and the first electrode is a cathode.

5. The light-emitting device of claim 1, wherein the $T_1$ values of the hosts of at least one of the emitting units are each independently in a range of about 2.89 eV to about 3.00 eV.

6. The light-emitting device of claim 1, wherein the $T_1$ values of the hosts of emitting units other than at least one of the first emitting unit, the second emitting unit, and the third emitting unit are each independently greater than or equal to about 3.00 eV.

7. The light-emitting device of claim 1, wherein the first emitting unit, the second emitting unit, and the third emitting unit each emit blue light.

8. The light-emitting device of claim 1, wherein the second emitting unit is between the first emitting unit and the third emitting unit, and either the $T_1$ values of the first-first host and the first-second host are each independently in a range of about 3.00 eV to about 3.10 eV, and the $T_1$ values of the third-first host and the third-second host are each independently in a range of about 2.89 eV to about 3.00 eV, or the $T_1$ values of the third-first host and the third-second host are each independently in a range of about 3.00 eV to about 3.10 eV, and the $T_1$ values of the first-first host and the first-second host are each independently in a range of about 2.89 eV to about 3.00 eV.

9. The light-emitting device of claim 8, wherein the first emitting unit is closest to the second electrode, and the third emitting unit is closest to the first electrode.

10. The light-emitting device of claim 8, wherein the first emitting unit is closest to the first electrode, and the third emitting unit is closest to the second electrode.

11. The light-emitting device of claim 8, wherein the $T_1$ values of the second-first host and the second-second host are each independently in a range of about 2.89 eV to about 3.00 eV.

12. The light-emitting device of claim 8, wherein the $T_1$ values of the second-first host and the second-second host are each independently in a range of about 3.00 eV to about 3.10 eV.

13. The light-emitting device of claim 1, wherein one of the first-first host and the first-second host is a hole-transporting host, and the other thereof is an electron-transporting host;

one of the second-first host and the second-second host is a hole-transporting host, and the other thereof is an electron-transporting host; or one of the third-first host and the third-second host is a hole-transporting host, and the other thereof is an electron-transporting host.

14. The light-emitting device of claim 1, wherein the first-first host and the first-second host are respectively identical to the second-first host and the second-second host; or the second-first host and the second-second host are respectively identical to the third-first host and the third-second host.

15. The light-emitting device of claim 1, wherein the phosphorescent dopant comprises an organometallic compound represented by Formula 401:

[Formula 401]

$$M(L_{401})_{xc1}(L_{402})_{xc2}$$

-continued

[Formula 402]

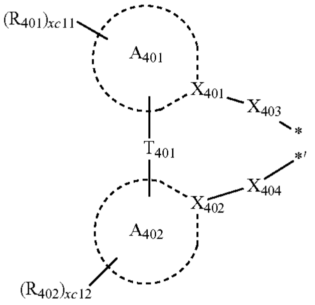

wherein in Formulae 401 and 402,

M is a transition metal, $L_{401}$ is a ligand represented by Formula 402, and xc1 is 1, 2, or 3, when xc1 is 2 or more, two or more of $L_{401}$ may be identical to or different from each other, $L_{402}$ is an organic ligand, xc2 may be 0, 1, 2, 3, or 4, when xc2 is 2 or more, two or more of $L_{402}$ may be identical to or different from each other, $X_{401}$ and $X_{402}$ are each independently N or C, ring $A_{401}$ and ring $A_{402}$ are each independently a $C_3$-$C_{60}$ carbocyclic group or a $C_1$-$C_{60}$ heterocyclic group, $T_{401}$ is a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ are each independently a chemical bond, O, S, N($Q_{413}$), B($Q_{413}$), P($Q_{413}$), C($Q_{413}$)($Q_{414}$), or Si($Q_{413}$)($Q_{414}$), $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_{11}$ to $Q_{13}$, $Q_{21}$ to $Q_{23}$ and $Q_{31}$ to $Q_{33}$, $Q_{411}$ to $Q_{414}$ and $Q_{401}$ to $Q_{403}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, xc11 and xc12 are each independently an integer from 0 to 10, and

* and *' in Formula 402 each indicate a binding site to M in Formula 401.

16. The light-emitting device of claim 1, wherein the fluorescent dopant is a delayed fluorescence dopant.

17. The light-emitting device of claim 1, wherein the fluorescent dopant comprises one of Compounds DF1 to DF15:

DF1

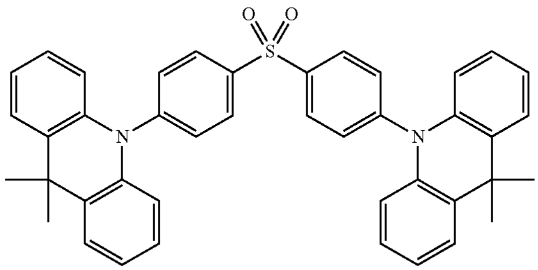

(DMAC-DPS)

DF2

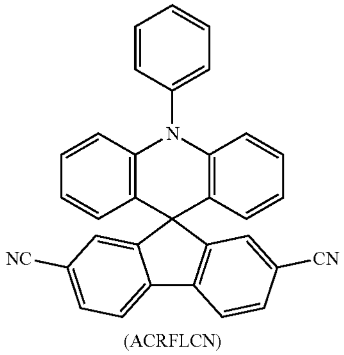

(ACRFLCN)

-continued
DF3
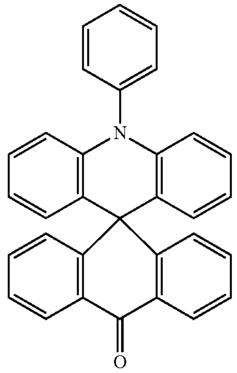
(ACRSA)
DF4
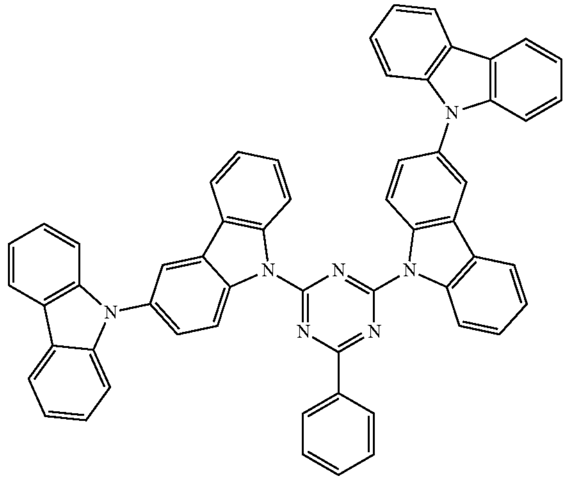
(CC2TA)
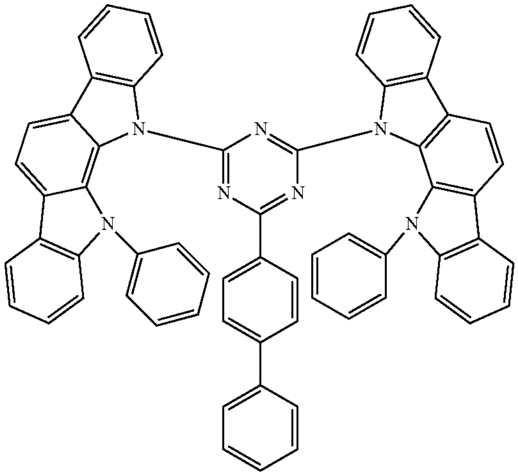
(PIC-TRZ)
-continued
DF6
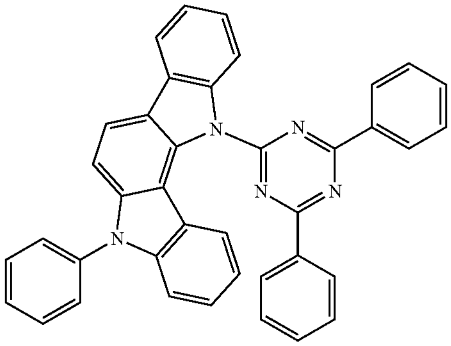
(PIC-TRZ2)
DF7
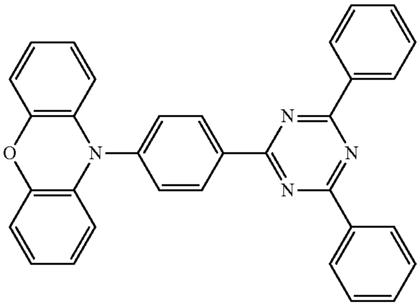
(PXZ-TRZ)
DF8
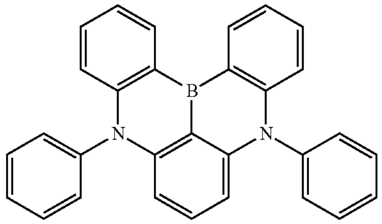
(DABNA-1)
DF9
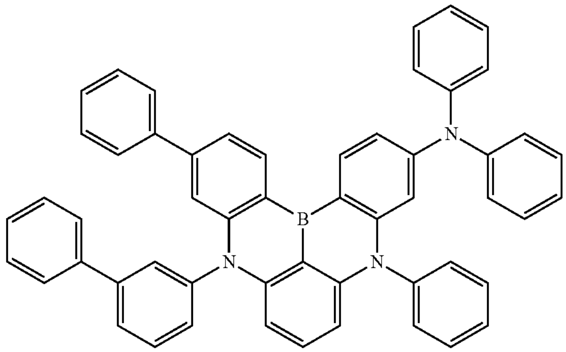
(DABNA-2)
DF10
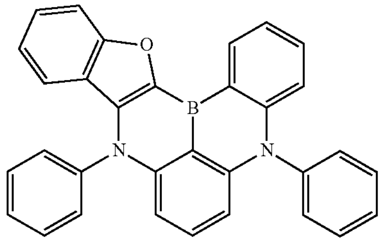

-continued

DF11

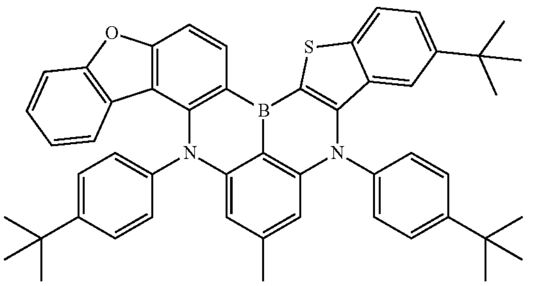

DF12

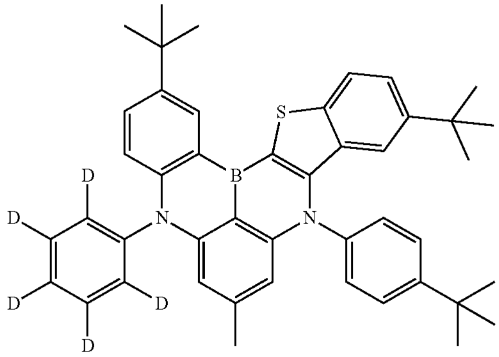

DF13

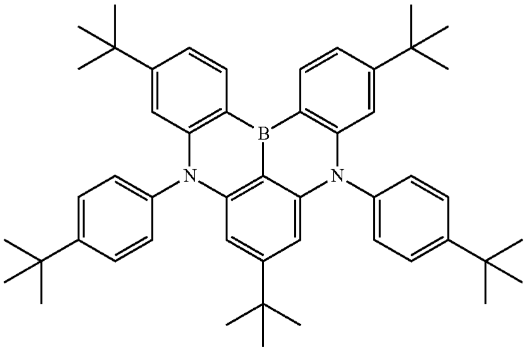

-continued

DF14

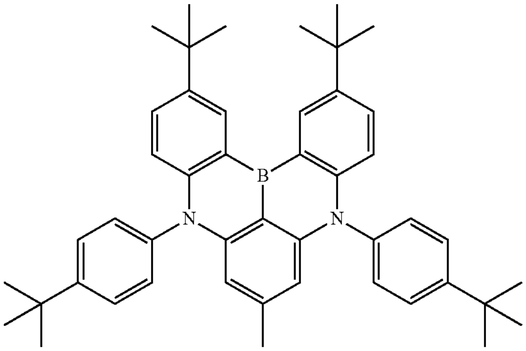

DF15

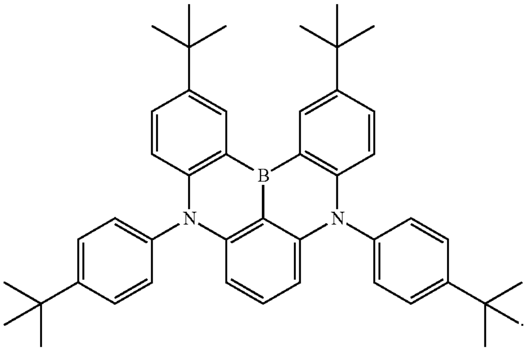

18. The light-emitting device of claim 1, wherein each charge generation layer comprises an n-type charge generation layer and a p-type charge generation layer.

19. An electronic apparatus comprising the light-emitting device of claim 1.

20. The electronic apparatus of claim 19, further comprising:
- a thin-film transistor, wherein
- the thin-film transistor comprises a source electrode and a drain electrode, and
- the first electrode of the light-emitting device is electrically connected to at least one of the source electrode and the drain electrode.

* * * * *